United States Patent

Konishi et al.

[11] Patent Number: 5,594,704
[45] Date of Patent: Jan. 14, 1997

[54] SYNCHRONOUS SEMICONDUCTOR MEMORY DEVICE

[75] Inventors: Yasuhiro Konishi; Takayuki Miyamoto; Takeshi Kajimoto; Hisashi Iwamoto, all of Hyogo-ken, Japan

[73] Assignee: Mitsubishi Denki Kabushiki Kaisha, Tokyo, Japan

[21] Appl. No.: 419,566

[22] Filed: Apr. 10, 1995

Related U.S. Application Data

[62] Division of Ser. No. 332,626, Oct. 31, 1994, which is a division of Ser. No. 46,333, Apr. 4, 1993, Pat. No. 5,384,745.

[30] Foreign Application Priority Data

Apr. 27, 1992 [JP] Japan ..................... 4-107424
Jun. 15, 1992 [JP] Japan ..................... 4-155026

[51] Int. Cl.⁶ ....................................... G11C 8/00
[52] U.S. Cl. ................... 365/233; 365/230.03; 365/195; 365/203
[58] Field of Search .............................. 365/190, 203, 365/233, 230.03, 195

[56] References Cited

U.S. PATENT DOCUMENTS 4,612,631  9/1986  Ochii ........................ 365/203
4,796,224  1/1989  Kawai et al. .................. 365/230.03 X
4,953,131  8/1990  Purdham et al. ............... 365/230.03 X
5,083,296  1/1992  Hara ........................... 365/230.02

OTHER PUBLICATIONS

Nikkei Electronics, Feb. 3, 1992, p. 85.

Primary Examiner—Joseph A. Popek
Attorney, Agent, or Firm—Lowe, Price, LeBlanc & Becker

[57] ABSTRACT

Memory arrays are divided into banks which can be operated independent from each other. Read data storing registers and write data storing registers operating independent from each other are provided for the banks. The memory array is divided into a plurality of small array blocks, local IO lines are arranged corresponding to each array block, and the local IO lines are connected to global IO lines. The global IO lines are connected to preamplifier groups and to write buffer groups. By control signal generating circuits and by a register control circuit, inhibition of writing of a desired bit only during successive writing operation can be done, data can be collectively written to the selected memory cells when the final data is input if the data writing should be stopped before reaching the wrap length in successive writing, and the timing for activating the memory array when the write cycle should be repeatedly carried out can be delayed. A synchronous semiconductor memory device having small chip area, high speed of operation, low power consumption and multiple functions is provided.

5 Claims, 53 Drawing Sheets

FIG. 1
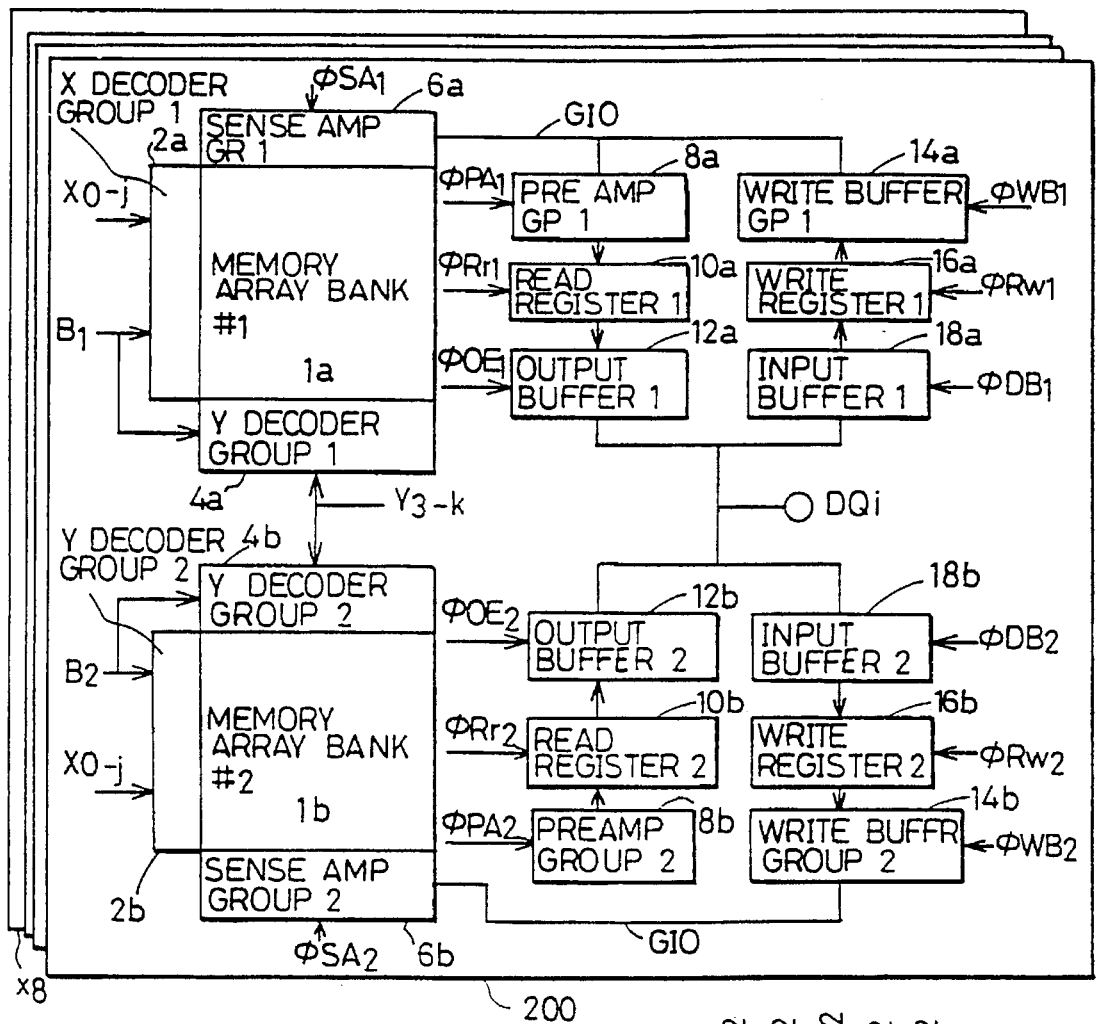
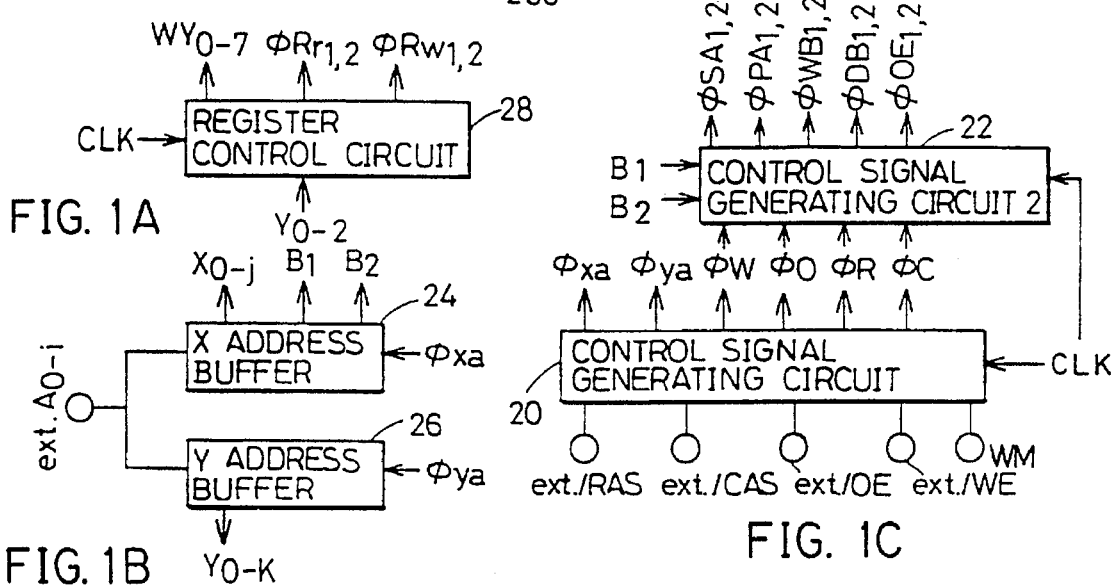
FIG. 1A
FIG. 1B
FIG. 1C

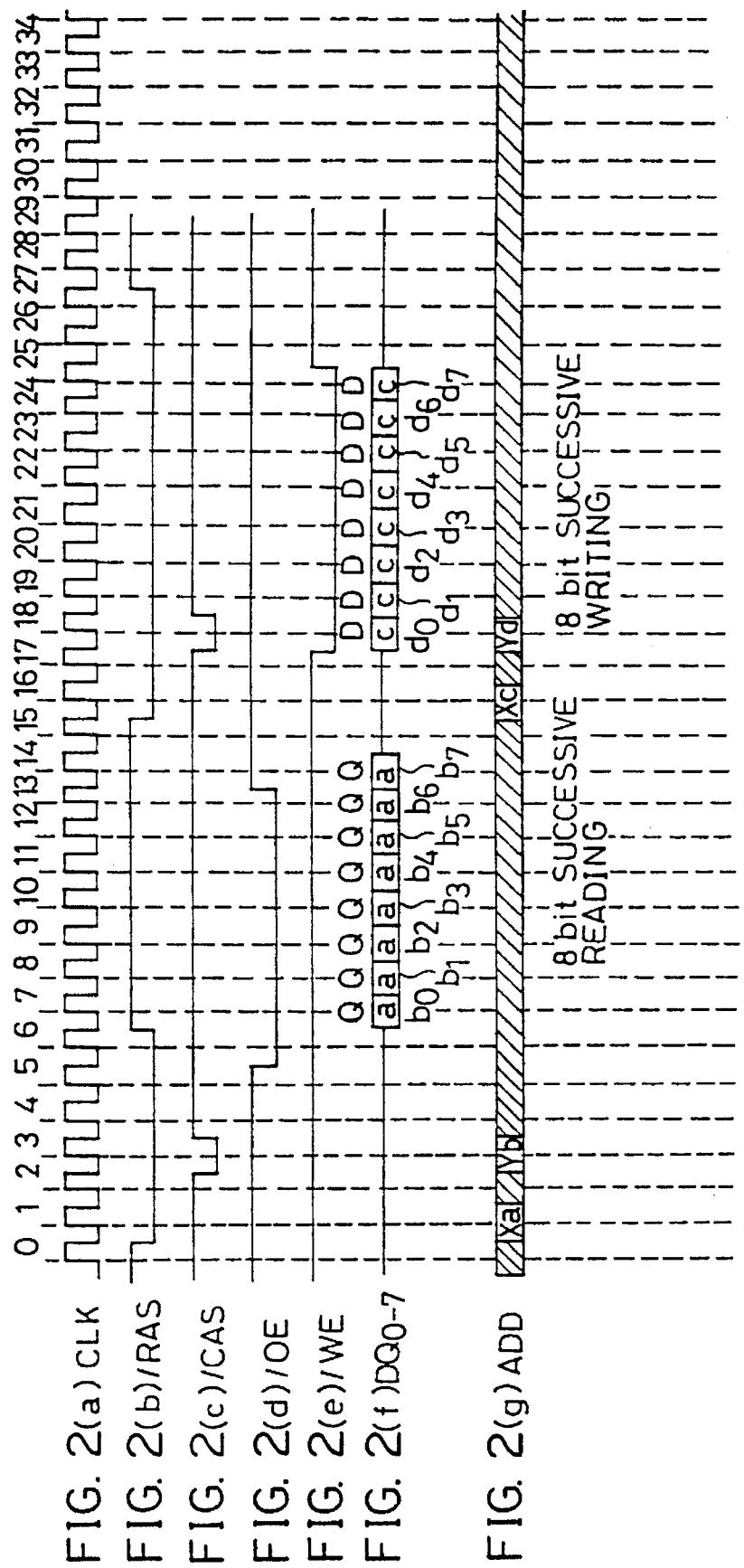

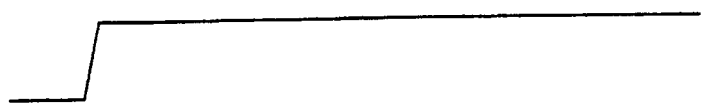
FIG. 13(a) WL
FIG. 13(b) ØSN
FIG. 13(c) ØSP
FIG. 13(d) BLP
FIG. 13(e) CSL
FIG. 13(f) LIO
FIG. 13(g) ØB
FIG. 13(h) GIO
FIG. 13(i) ØIOEQ
FIG. 13(j) ØDL
FIG. 13(k) ØPAE
FIG. 13(l) /ØPAE
FIG. 13(m) NODE A
FIG. 13(n) NODE B

FIG. 14
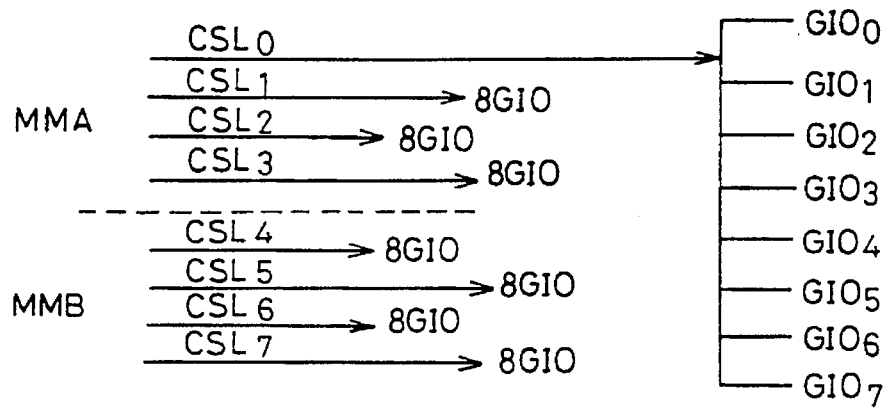
FIG. 15A
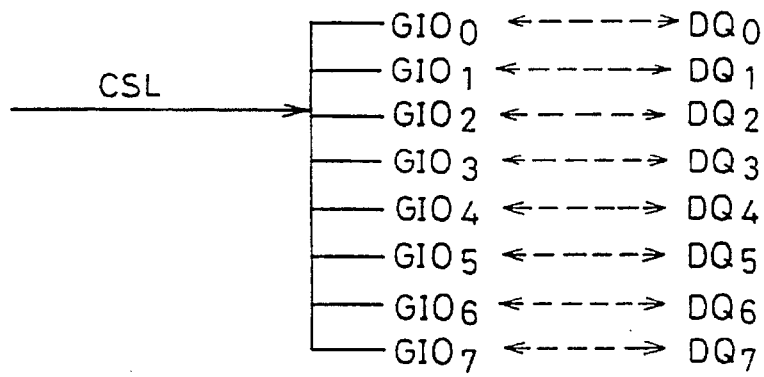
FIG. 15B(a) DATA
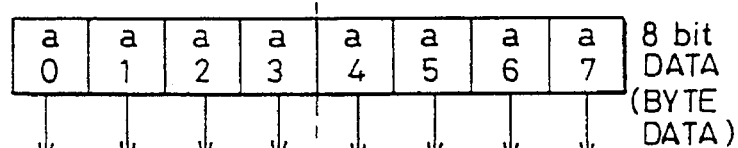
FIG. 15B(b) COLUMN SELECTING LINE
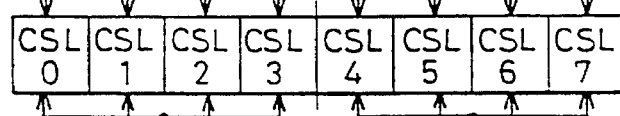
FIG. 15B(c) CA2 φLA
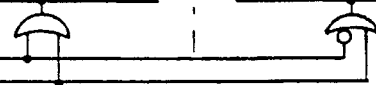

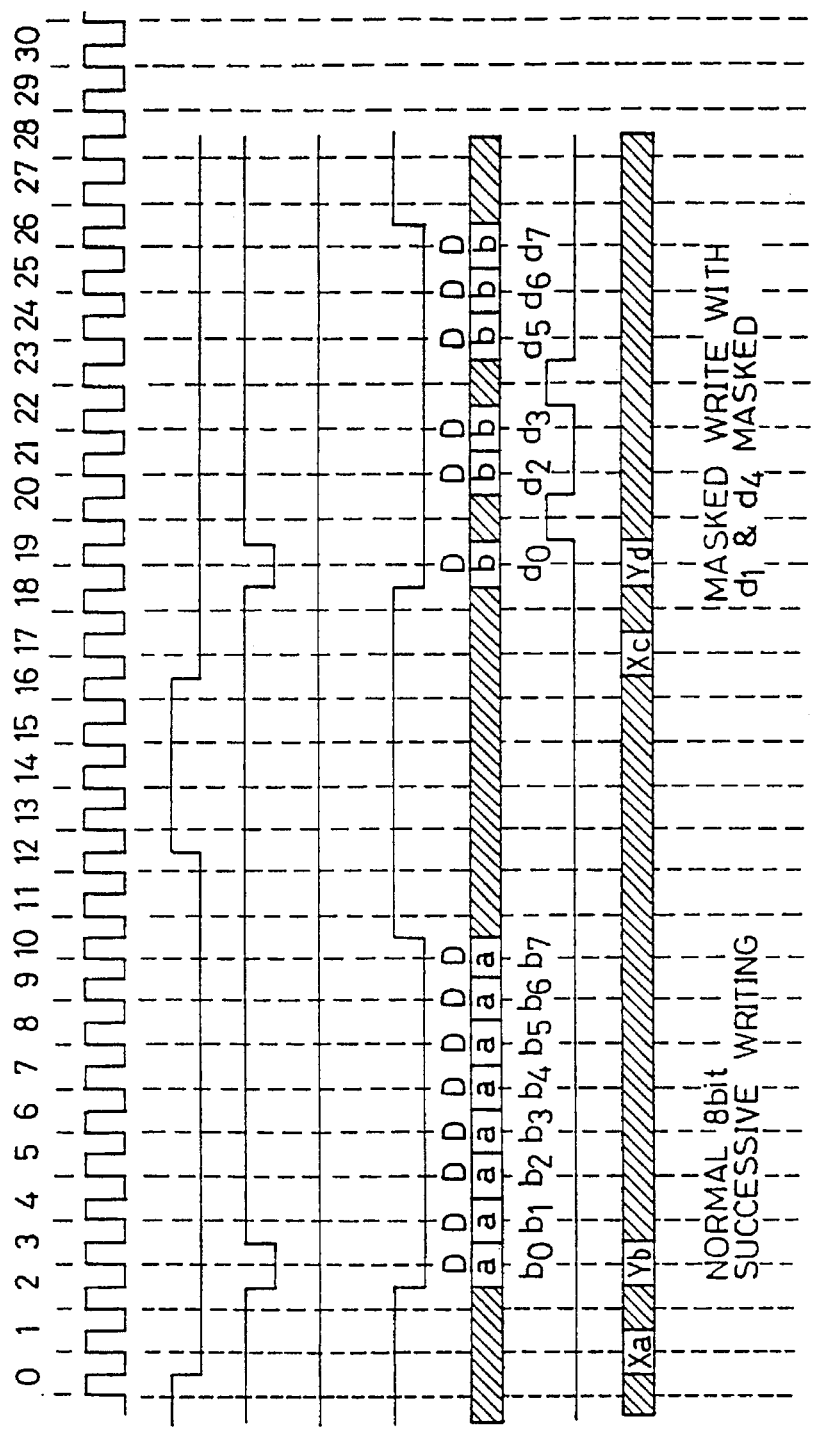

FIG. 21(a) CLK
FIG. 21(b) D
FIG. 21(c) y
FIG. 21(d) WY
FIG. 21(e) WM
FIG. 21(f) WD
FIG. 21(g) MD
FIG. 21(h) ØWM, ØRW

FIG. 26

| INITIAL INPUT ADDRESS | | | WRAP SEQUENCE (WRAP LENGTH = 8) | |
|---|---|---|---|---|
| | | | OUTPUT ADDRESS SEQUENCE | |
| A2 | A1 | A0 | SEQUENTIAL | INTERLEAVE |
| 0 | 0 | 0 | 0,1,2,3,4,5,6,7 | 0,1,2,3,4,5,6,7 |
| 0 | 0 | 1 | 1,2,3,4,5,6,7,0 | 1,0,3,2,5,4,7,6 |
| 0 | 1 | 0 | 2,3,4,5,6,7,0,1 | 2,3,0,1,6,7,4,5 |
| 0 | 1 | 1 | 3,4,5,6,7,0,1,2 | 3,2,1,0,7,6,5,4 |
| 1 | 0 | 0 | 4,5,6,7,0,1,2,3 | 4,5,6,7,0,1,2,3 |
| 1 | 0 | 1 | 5,6,7,0,1,2,3,4 | 5,4,7,6,1,0,3,2 |
| 1 | 1 | 0 | 6,7,0,1,2,3,4,5 | 6,7,4,5,2,3,0,1 |
| 1 | 1 | 1 | 7,0,1,2,3,4,5,6 | 7,6,5,4,3,2,1,0 |

$A_6 = 0 \rightarrow$ SEQUENTIAL $A_6 = 1 \rightarrow$ INTERLEAVE

FIG. 29
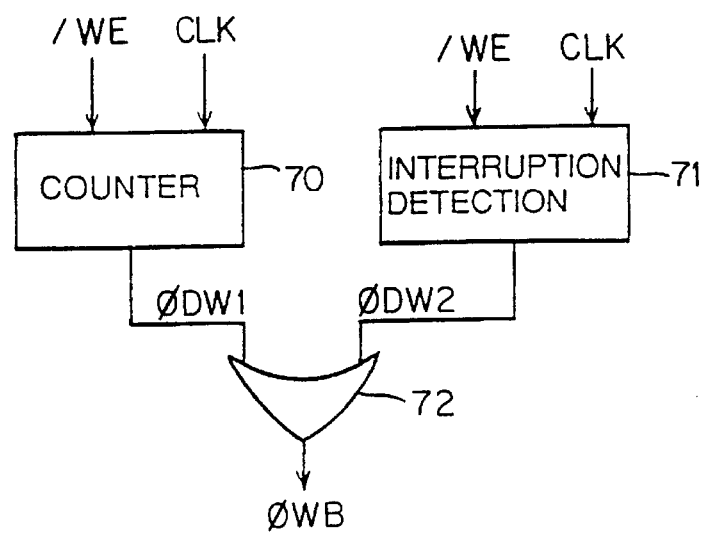
FIG. 30A
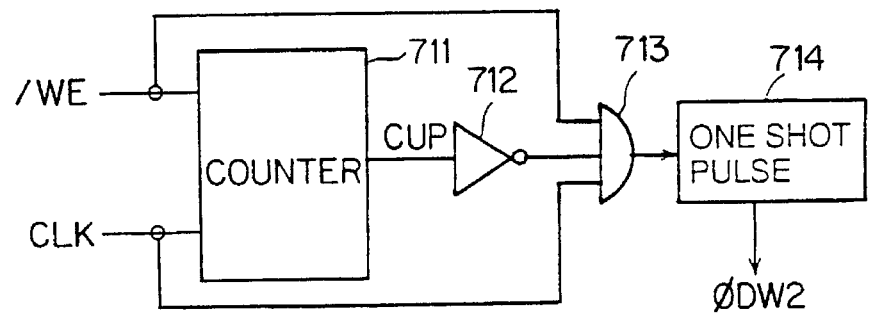
FIG. 30B(a) CLK 
FIG. 30B(b) /WE 
FIG. 30B(c) CUP 
FIG. 30B(d) ØDW2 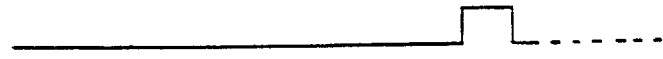

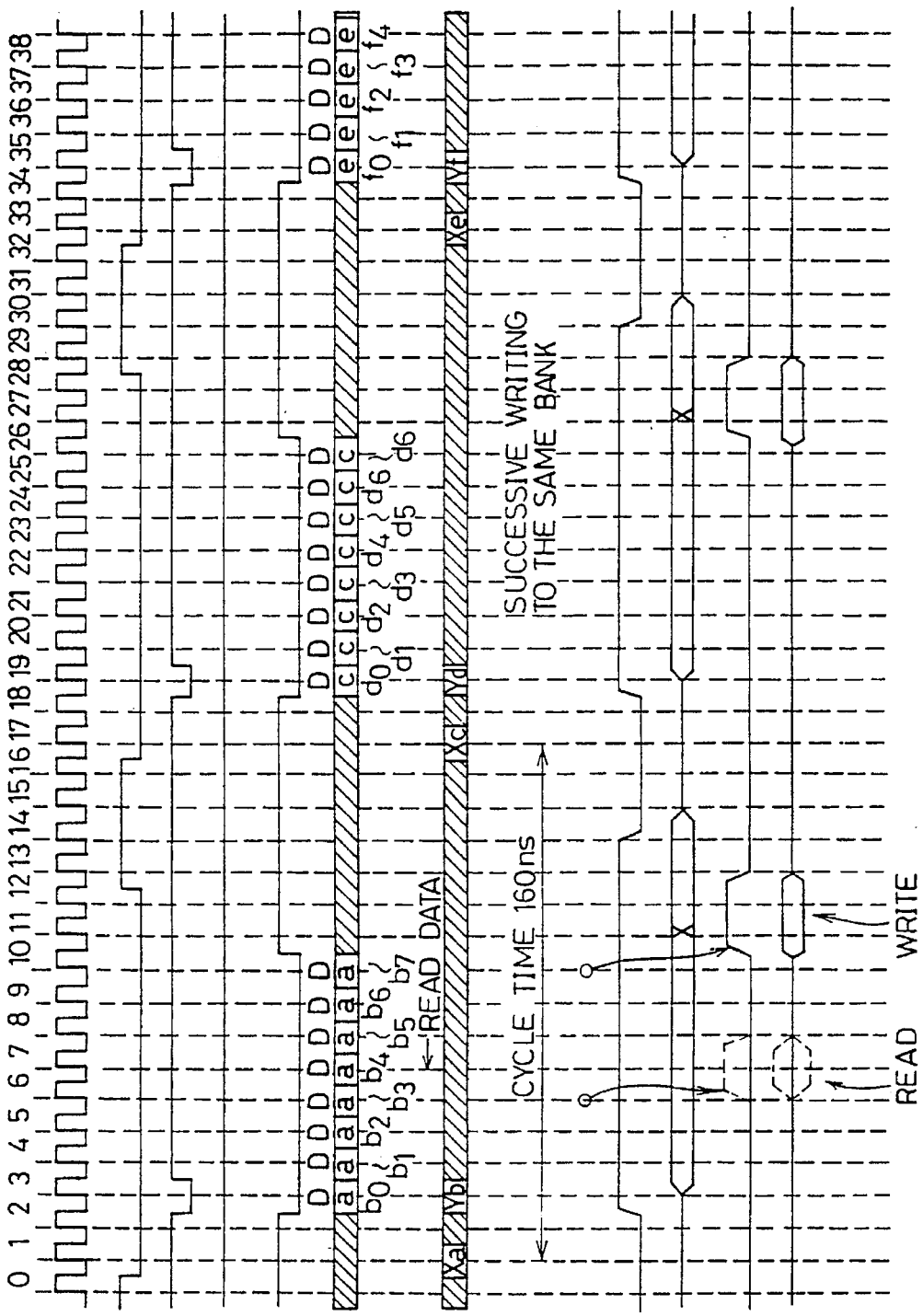

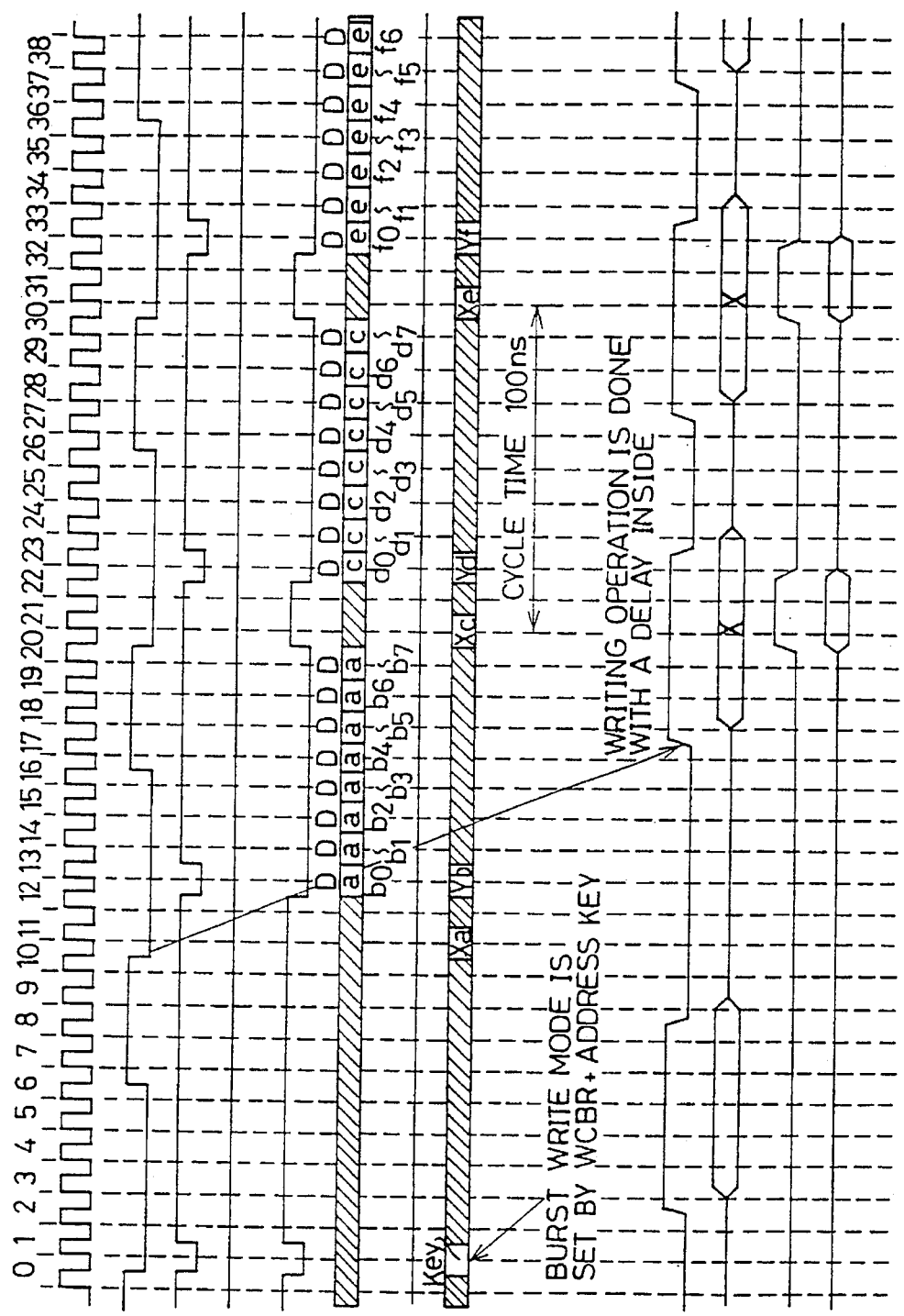

FIG. 35
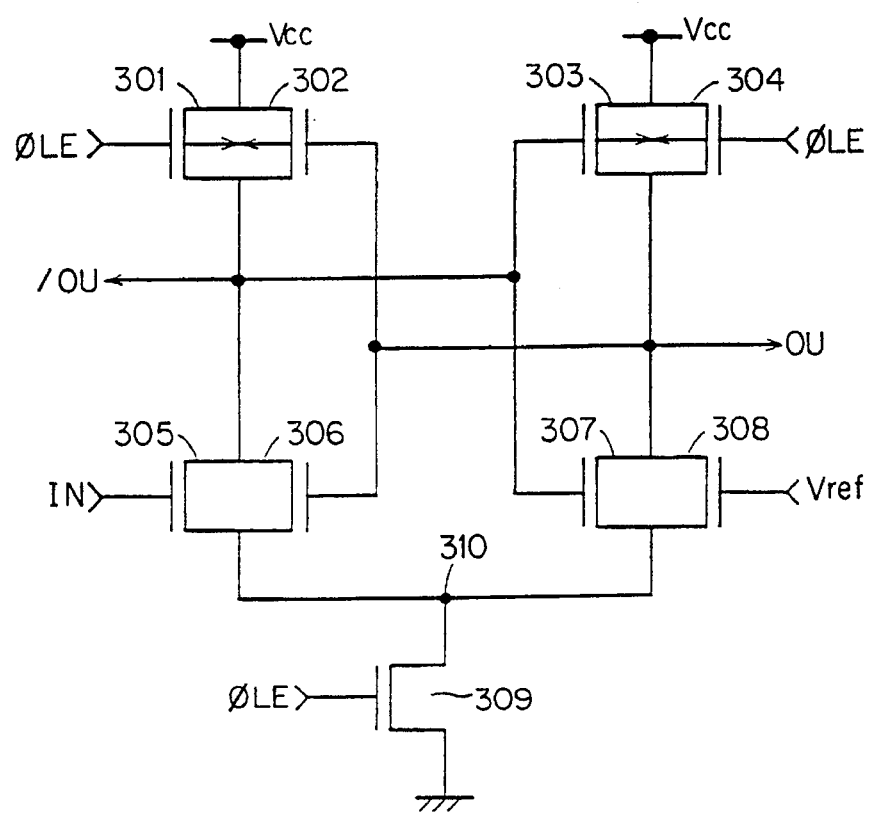
FIG. 36(a) ØLE
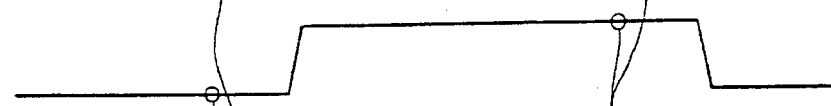
FIG. 36(b) IN
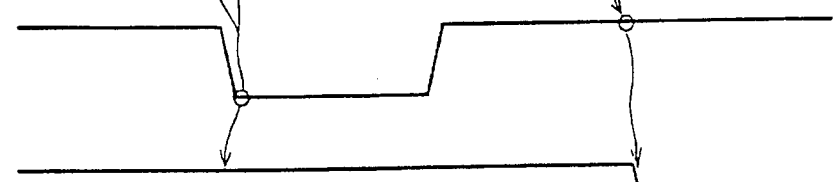
FIG. 36(c) OU
FIG. 36(d) /OU

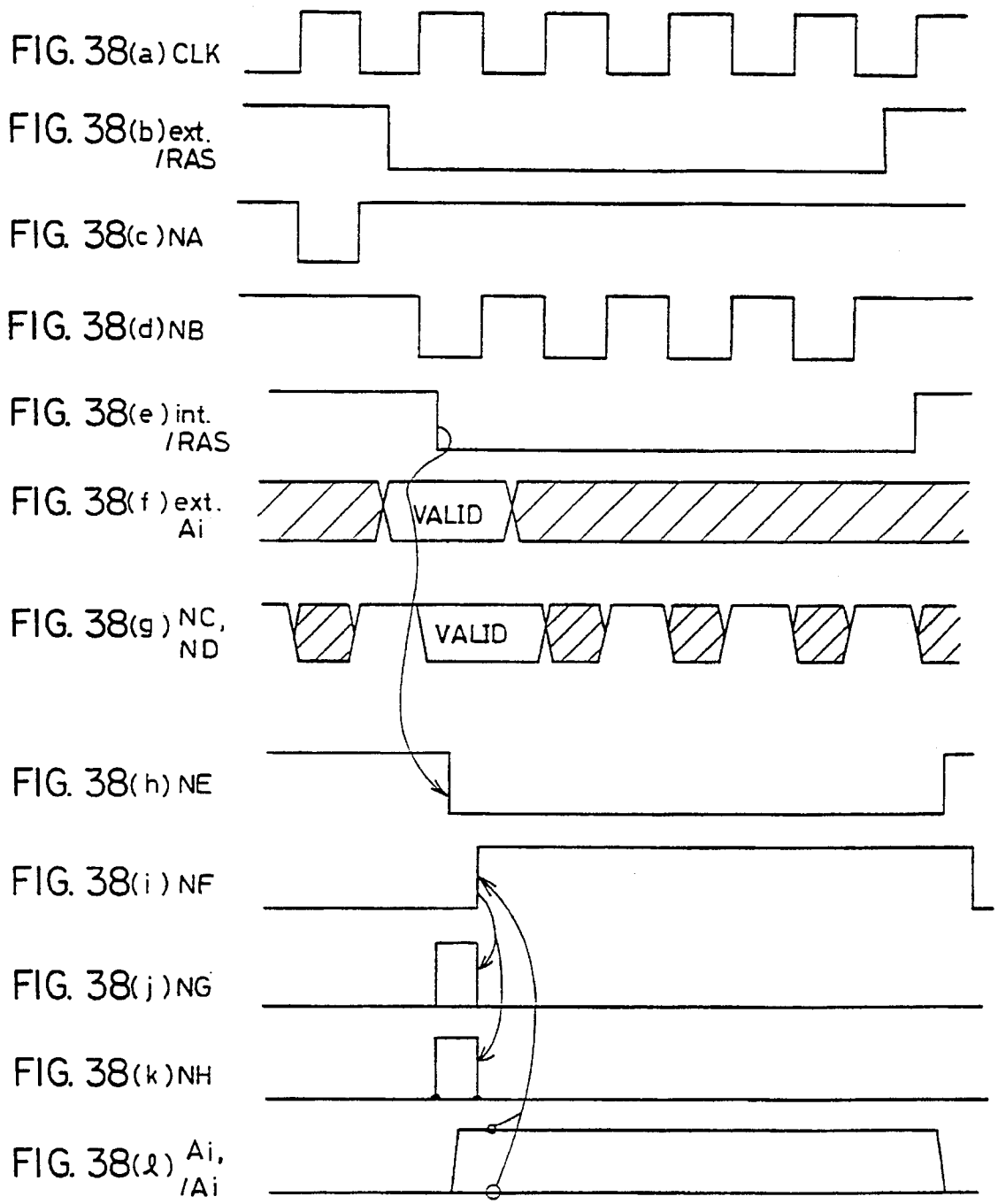

FIG. 40(a) CLK 
FIG. 40(b) ext/RAS 
FIG. 40(c) NA 
FIG. 40(d) NB 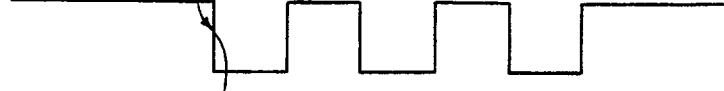
FIG. 40(e) int. RAS 
FIG. 40(f) NC 
FIG. 40(g) ext. Ai 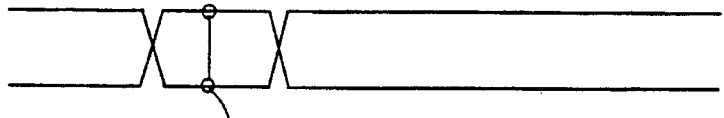
FIG. 40(h) Ai, /Ai 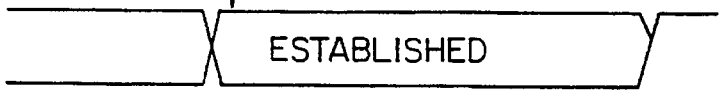

FIG. 41
FREQUENCY — LATENCY
| SET ADDRESS | | MAX FREQUENCY | tRAC | tCAC | tRP | tRCD min. |
| --- | --- | --- | --- | --- | --- | --- |
| A5 | A4 | | | | | |
| 0 | 0 | 100 MHz | 6 | 4 | 4 | 2 |
| 0 | 1 | 66 MHz | 4 | 3 | 3 | 1 |
| 1 | 0 | 50 MHz | 3 | 2 | 2 | 1 |
FIG. 42(a) /RAS
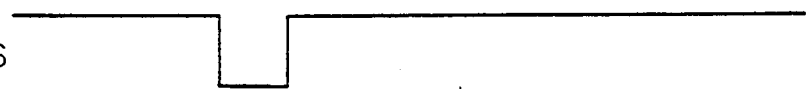
FIG. 42(b) /CAS
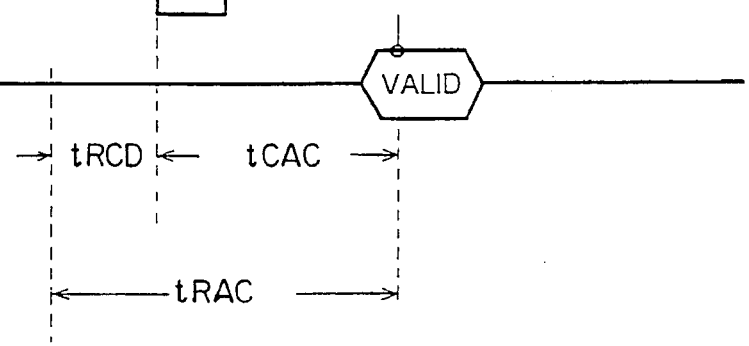
FIG. 42(c) Q

WRAP LENGTH

| $A_2$ | $A_1$ | $A_0$ | LENGTH |
|---|---|---|---|
| 0 | 0 | 0 | 4 |
| 0 | 0 | 1 | 8 |
| 0 | 1 | 0 | 16 |
| 0 | 1 | 1 | 32 |
| 1 | 1 | 1 | ENTIRE PAGE |

400 mil TSOP₁₁ (0.8mm LEAD PITCH)

Vcc(Q), Vss(Q): POWER SUPPLY FOR I/O BUFFER

M₀ ~ M₃ : MASK ENABLE

REFRESH ADDRESS : A₀~A₁₁ (4K REFRESH)
A₀~A₁₀ (2K REFRESH)

COLUMN ADDRESS : A₀~A₈ / A₀~A₉ (4K REFRESH)
A₀~A₉ / A₀~A₁₀ (2K REFRESH)
x8          x4

400 mil TSOP II (0.8 mm LEAD PITCH)

FIG.51

| FUNCTION | /CS | /RAS | /CAS | /WE | DQM |
|---|---|---|---|---|---|
| ROW ADDRESS STROBE & ARRAY ACTIVATION | L | L | H | H | - |
| COLUMN ADDRESS STROBE & READING | L | H | L | H | - |
| COLUMN ADDRESS STROBE & WRITING | L | H | L | L | - |
| PRECHARGE / SELF REFRESH END | L | L | H | L | - |
| REFRESH / SELF REFRESH START | L | L | L | H | - |
| MODE REGISTER SET | L | L | L | L | - |
| WRITE ENABLE / OUTPUT ENABLE | - | - | - | - | L |
| WRITE MASK / OUTPUT DISABLE | L | - | - | - | H |
| NO CHANGE IN OPERATION | L | H | H | H | - |
| NEGLET /RAS, /CAS, /WE | H | X | X | X | - |

FIG. 56
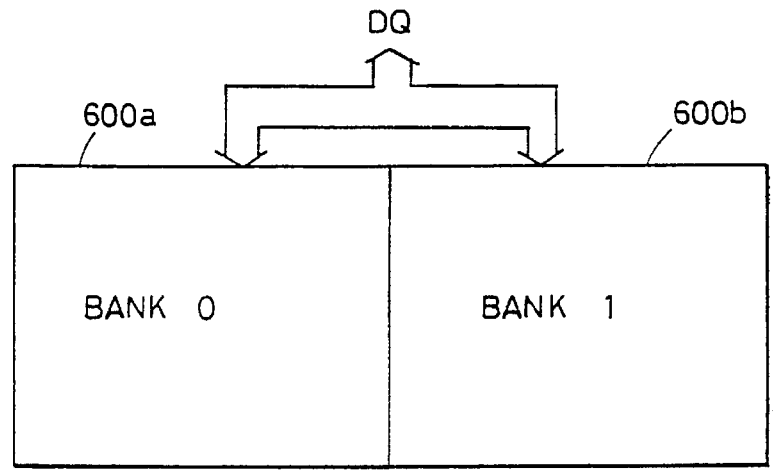
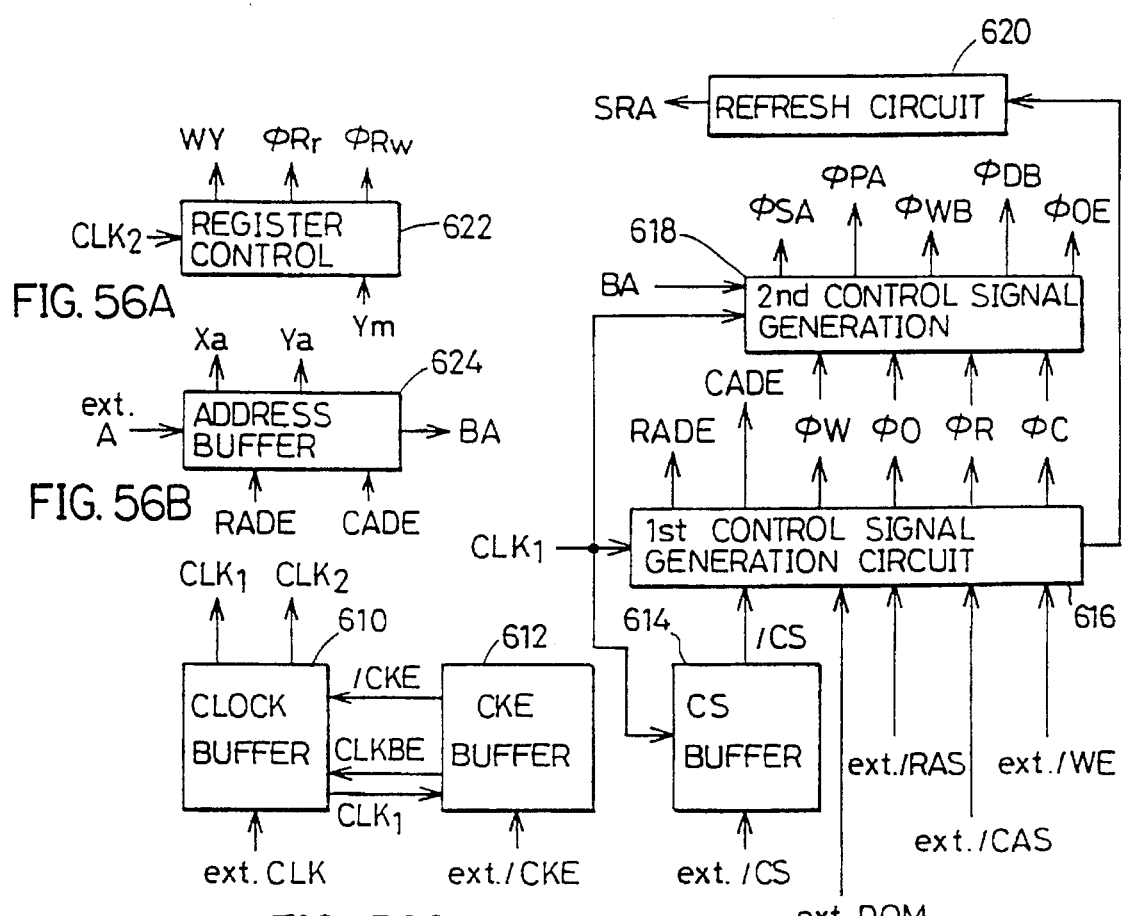
FIG. 56A
FIG. 56B
FIG. 56C
FIG. 56D

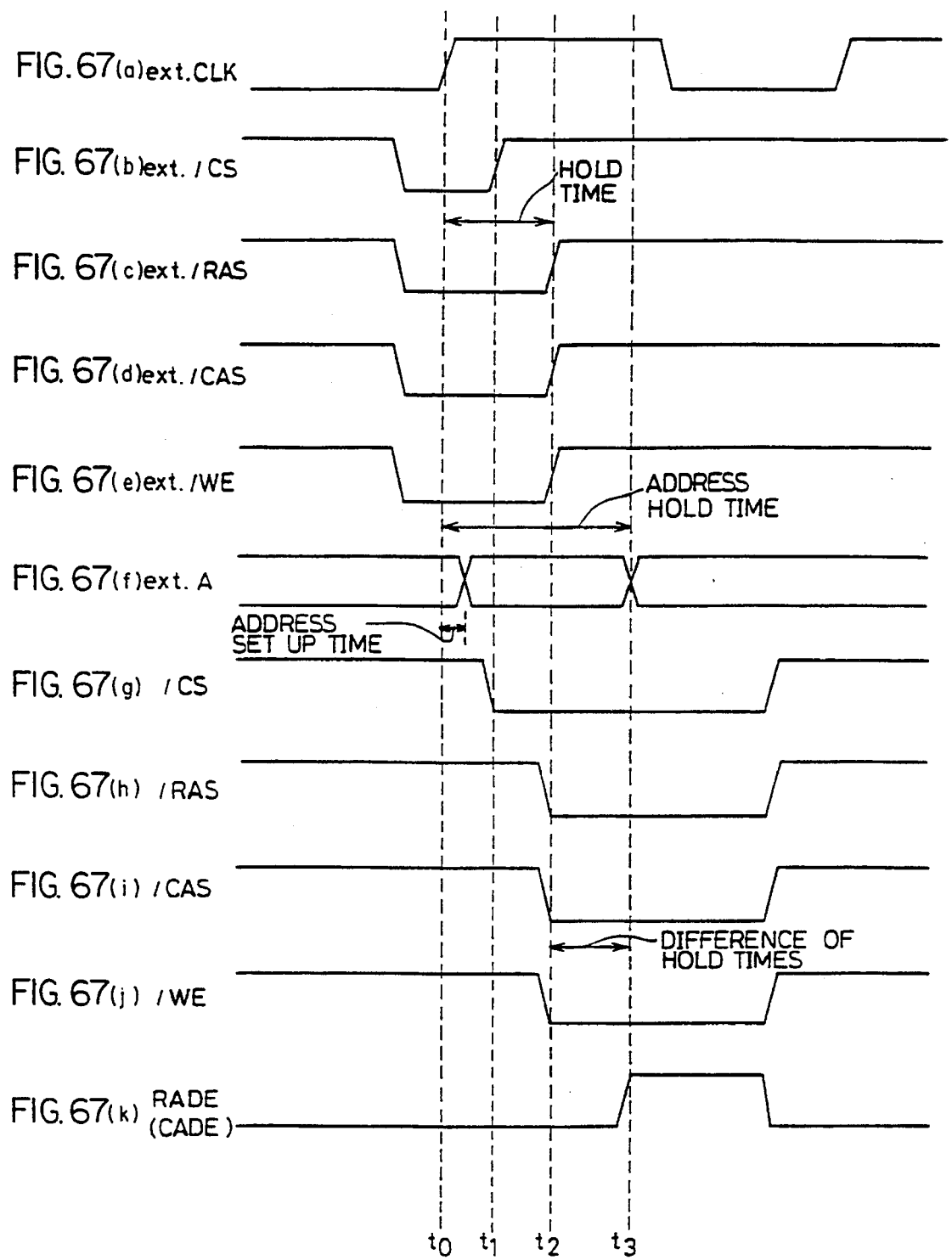

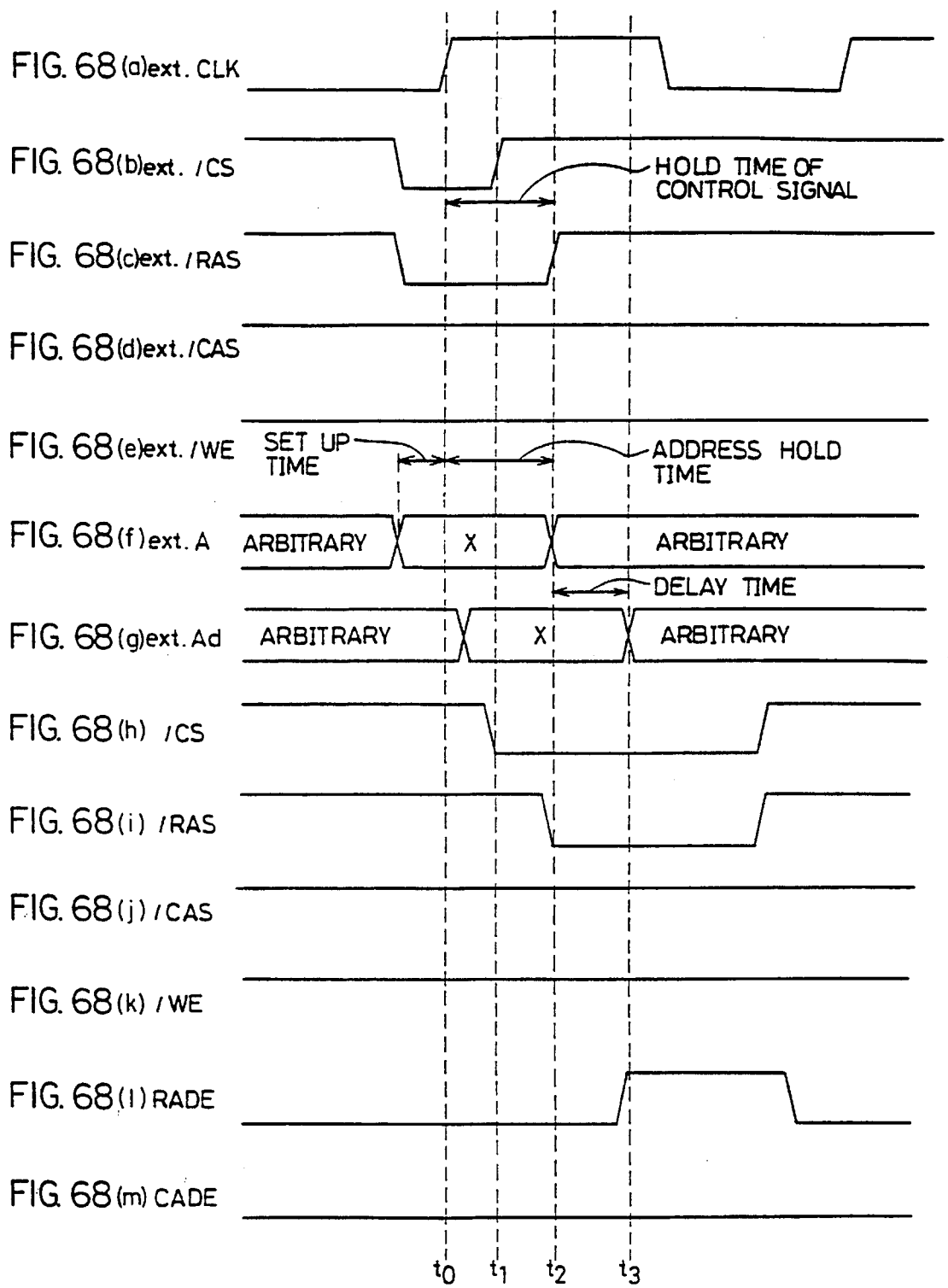

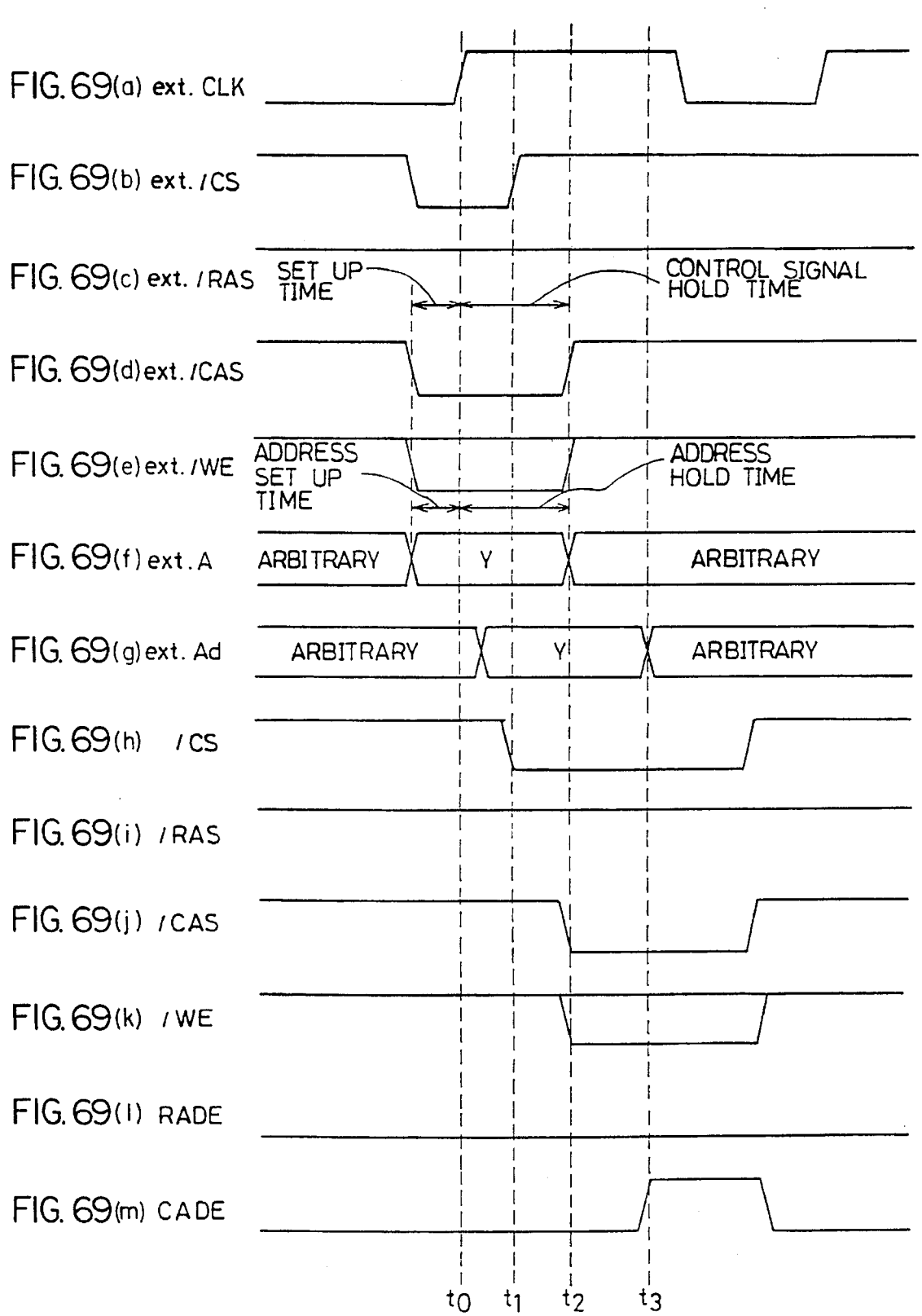

SYNCHRONOUS SEMICONDUCTOR MEMORY DEVICE

This application is a division of application Ser. No. 08/332,626 filed Oct. 31, 1994, which is a division of application Ser. No. 08/046,333 filed Apr. 14, 1993, now U.S. Pat. No. 5,384,745.

BACKGROUND OF THE INVENTION

1. Field of the Invention

The present invention relates to semiconductor memory devices and, more specifically, to a synchronous semiconductor memory device in which external signals are taken in in synchronization with external clock signals applied periodically. More specifically, the present invention relates to a synchronous type random access memory (DRAM) which requires refreshing operation.

2. Description of the Background Art

The speed of operation of a microprocessor (MPU) has been much increased recently. Although the speed of operation of a dynamic random access memory (hereinafter referred to as a DRAM) used as a main memory has been improved, it still can not follow the speed of operation of the MPU. Consequently, the performance of the whole system is degraded because of the access time and the cycle time of the DRAM being a bottle neck.

In order to improve system performance, a method is frequently used in which a high speed memory called a cache memory consisting of a high speed static random access memory (SRAM) is provided between the DRAM and the MPU. Data which are used highly frequently are stored in the cache memory, and if the data required by the MPU is stored in the cache memory, the high speed cache memory is accessed. The DRAM is accessed only when the data requested by the MPU is not in the cache memory. Since data which are frequently used are stored in the high speed cache memory, the frequency of accessing to the DRAM is significantly reduced, and accordingly, the influence of the access time and the cycle time of the DRAM can be removed, and the system performance can be improved.

The use of a cache memory is inexpedient for devices which are relatively inexpensive, such as personal computers, since SRAMs are much expensive than DRAMs. Therefore, it is desired to improve system performance by using inexpensive DRAMs.

If the MPU and the DRAM are to be simply operated in synchronization, a system clock may be applied to the DRAM so that the DRAM is operated in synchronization with the system clock. A structure in which the DRAM is operated in synchronization with the system clock signal is disclosed in U.S. Pat. No. 5,083,296 to Hara.

In the DRAM of Hara, a chip select signal /CS and a write enable signal /WE are latched in synchronization with a clock signal CLK. If the latched chip select signal /CS is active, indicating that the DRAM has been selected, an internal RAS signal and an internal CAS signal are generated in synchronization with the clock signal. In response to the internal RAS and internal CAS signals, an address signal is latched and an internal row address signal and an internal column address signal are generated. Input/output of data is also effected in synchronization with the clock signal CLK.

Hara aims to solve the problems such as variation of timings generated when the DRAM is operated in response to control signals such as the row address strobe signal RAS and the column address strobe signal CAS, by operating the DRAM in synchronization with the clock.

In Hara, only the clock synchronized operation of the DRAM is intended. The address signal is latched by the internal RAS signal and the internal CAS signal generated in synchronization with the clock signal CLK. A desired internal address signal can be generated in response to an external address signal in a case of a clock signal of relatively low speed or of an address signal having sufficient margins for setup time and hold time.

However, if the clock signal CLK is a high speed one or if the margins of the setup time and the hold time of the address signal are small, the internal address signal may possibly have been changed to the invalid state by the time the internal RAS signal and the CAS signal are generated. Therefore, the DRAM of Hara can not be operated in synchronization with a high speed clock signal. In other words, it can not be used as a high speed main memory for the high speed MPU. As for the internal structure, the DRAM of Hara has the similar structure as a common standard DRAM, and only difference is that latch circuits operated by clocks are provided at the input/output portions of external control signals and data.

JEDEC (Joint Electron Device Engineering Council) of the United States adopts a synchronous DRAM (hereinafter referred to as SDRAM) operating in synchronization with the clock signal as a main memory for a high speed MPU, and the specification of the SDRAM is now being standardized. Details of the standard specification have not yet been made public. According to Nikkei Electronics Feb. 3, 1992, p 85, the following structure has been proposed:

(1) Synchronous operation is done with the clock signal having the period of 10 to 15 ns (nano seconds).

(2) In a first random accessing, data is accessed after 4 to 6 clocks after the input of a row address signal. Thereafter, data of successive addresses can be accessed clock by clock.

(3) Circuitry in the chip is operated in the pipe line manner, and a serial input/output buffer is provided at the data input/output portion to reduce access time.

The above mentioned structure is simply a proposal, and specific methods for implementing such structure have not yet been disclosed at all.

SUMMARY OF THE INVENTION

An object of the present invention is to provide a SDRAM having a novel structure and operating at high speed.

Another object of the present invention is to provide an SDRAM which occupies small area on the chip.

According to the present invention, a synchronous memory device with a novel architecture is implemented. External signals such as control signals, address signals and input data are strobed in synchronization with an externally applied clock signal such as a system clock. A read register for storing read-out data and a write register for storing write data are built in. The read register and the write register each includes a plurality of unit stages each of which in turn includes as many unit storages as data input or output terminals. Successive accessing for reading or writing data at a high speed is implemented because the read and write registers communicate data with data input/output terminals in response to the external clock signal.

Various components for supporting or enhancing the high speed accessing are also provided, which include delayed activation of memory arrays in repeated successive data writing, writing data to selected memory cells immediately after all the desired data are written into the write register, variable latency, delayed transfer of external address signal to an address buffer and independent driving of memory banks. The memory device of the invention has a plurality of memory arrays grouped into banks.

The memory device of the invention also includes expedients for reducing power dissipation, which in turn include stopping of generation of an internal clock signal in a special operation mode for inhibiting operation of buffer circuits receiving external signals, and inhibition of transfer of a clock signal to address buffer in an array active cycle or in an external access mode.

The memory device of the invention further includes expedients for implementing the multifunctionization of the memory device, including successive write masking for masking intended data in a successive data train, and a variable wrap length in which the wrap length (the number of data to be accessed successively) can be varied.

According to the present invention, a synchronous memory device with a large storage capacity and high speed operability is implemented and can implement a high speed processor system without need for cache memory.

The foregoing and other objects, features, aspects and advantages of the present invention will become more apparent from the following detailed description of the present invention when taken in in conjunction with the accompanying drawings.

BRIEF DESCRIPTION OF THE DRAWINGS

FIGS. 1A–1C are a block diagram showing a structure of a main portion of a synchronous semiconductor memory device in accordance with one embodiment of the present invention.

FIG. 2(a)–(g) are a diagram of signal waveforms showing a standard operation of a synchronous semiconductor memory device.

FIGS. 13(a)–(n) are a diagram of signal waveforms showing operation of the circuit shown in FIG. 12.

FIG. 14 shows correspondence between the column selecting line and the global IO line.

FIGS. 15A and 15B(a)–15B(c) show correspondence between a global IO line and a data input/output terminal selected by one column selecting line.

FIGS. 19(a)–(h) are a diagram of signal waveforms showing an operation when data is masked in successive access cycles.

FIG. 21(a)–(h) show an operation of the circuit shown in FIG. 20.

FIG. 26 shows correspondence between the order of generated wrap addresses and address keys at that time.

FIG. 29 shows a circuit structure for realizing the successive writing operation shown in FIG. 28.

FIGS. 30A and 30B (d) show specific structure and operation of an interruption detecting circuit shown in FIG. 29.

FIGS. 31(a)–(k) shows standard signal timings of successive writing in different pages of the same bank in the synchronous semiconductor memory device.

FIGS. 32(a)–32(l) are a timing chart showing an example of improvement of the successive writing operation in different pages of the same bank.

FIG. 35 shows a structure of a dynamic latch used in an input buffer for taking in external signals.

FIG. 36(a)–(d) are a diagram of signal waveforms showing the operation of the dynamic latch shown in FIG. 35.

FIGS. 38(a)–(l) are a diagram of signal waveforms showing the operation of the buffer shown in FIG. 37.

FIGS. 40(a)–(h) are a diagram of signal waveforms showing the operation of the circuit shown in FIG. 39.

FIG. 41 shows relation between the clock frequency and the latency in the synchronous semiconductor memory device in accordance with the present invention.

FIGS. 42(a)–(c) specifically shows various parameters shown in FIG. 41.

FIG. 51 shows, in a table, correspondence between states of control signals and designated operation modes in the synchronous semiconductor memory device in accordance with the second embodiment of the present invention.

FIGS. 56A–D schematically show an internal structure of the synchronous semiconductor memory device in accordance with the second embodiment of the present invention.

FIGS. 67(a)–(k) are a diagram for explaining problems when a delay circuit is not provided in the address buffer.

FIGS. 68(a)–(m) are a diagram of signal waveforms showing an operation of taking in a row address of the address buffer shown in FIG. 66.

FIGS. 69(a)–(m) are a diagram of signal waveforms showing an operation of taking a column address of the address buffer shown in FIG. 66.

DESCRIPTION OF THE PREFERRED EMBODIMENTS

[Memory Cell Array Arrangement]

Figure 3:
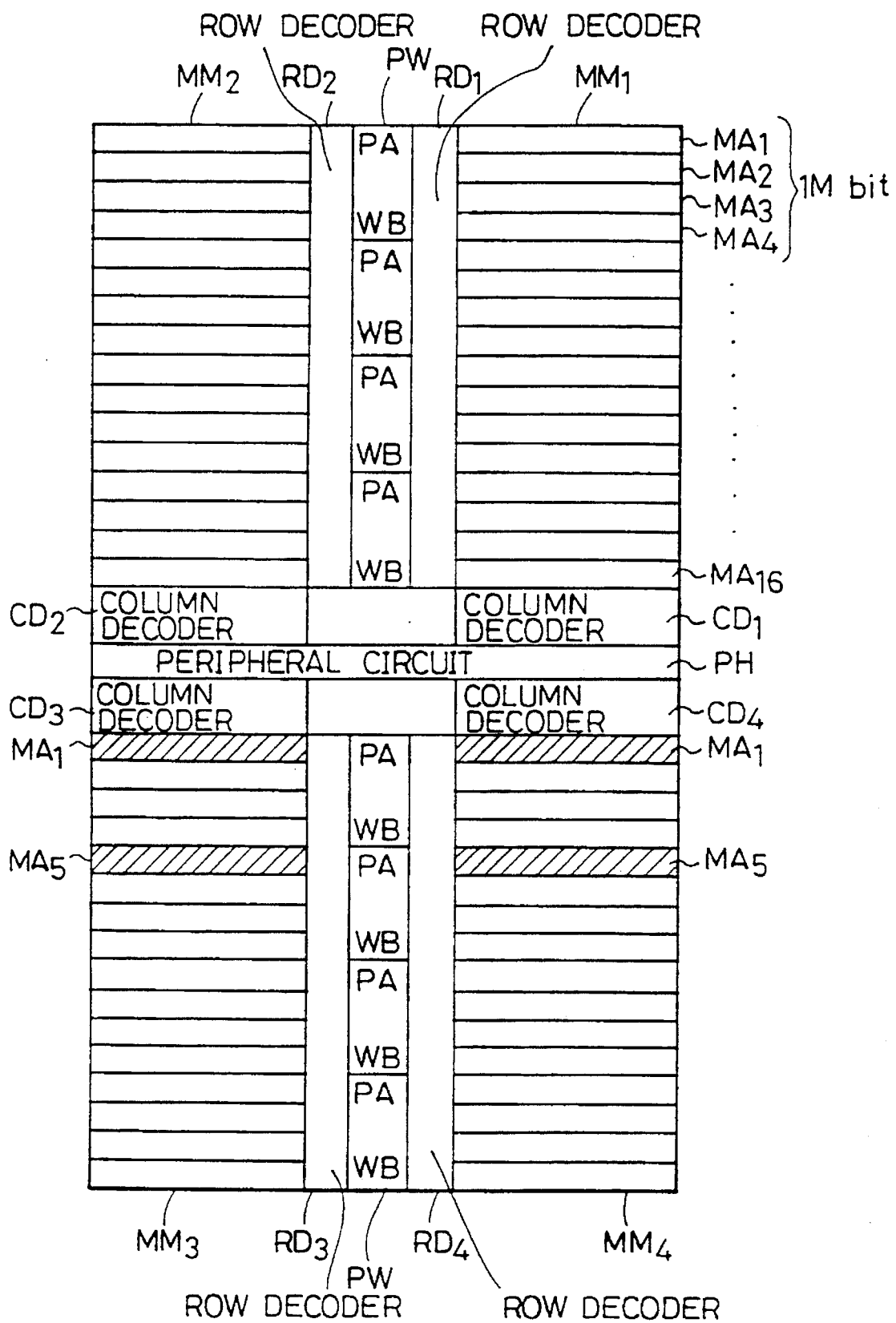
FIG. 3 shows a chip structure of a standard 16MDRAM.

For high speed accessing in the SDRAM, a specification for accessing at high speed several bits, 8 bits, for example, successively in synchronization with system clock signals has been proposed. FIG. 2 is a timing chart of the successive accessing.

FIG. 2 shows an operation of writing or reading 8 bits of data (a total of 8×8=64 bits) successively at each of the data input/output terminals DQ0 to DQ7, in an SDRAM capable of inputting and outputting 8 bits of data (byte data) at a time.

As shown in FIG. 2, in the SDRAM, external control signals such as row address strobe signal /RAS, a column address strobe signal /CAS, an output enable signal (output permitting signal) /OE, a write enable signal (write permitting signal) /WE and an address signal ADD are taken in at a rising edge of an external clock signal CLK, which is, for example, a system clock. A row address signal X and a column address signal Y are applied time divisionally multiplexed as an address signal ADD. When the row address strobe signal /RAS is at active "L" at a rising edge of the clock signal CLK, the address signal ADD at that time is taken in as the row address signal X.

When the column address strobe signal /CAS is at active L at the rising edge of the clock signal CLK, the address signal ADD at that time is taken in as the column address signal Y. In accordance with the taken in row address signal Xa and the column address signal Yb, a row and a column are selected in the SDRAM. After a prescribed clock period (6 clock cycles in FIG. 2) from the fall of the row address strobe signal /RAS to "L", when the output enable signal /OE is at "L", the first 8 bits of data b0 are output. Thereafter, data are output from successive memory positions (or column addresses) in response to the rises of the clock signal.

In writing operation, the taking in of the row address signal Xc is carried out in the similar manner as in data reading. When the column address strobe signal CAS and the write enable signal /WE are both active "L" at the rising edge of the clock signal CLK, the column address signal Yd is taken in and the data D0 applied at that time is taken in as the first write data. In response to the fall of the signals /RAS and /CAS, a row and a column are selected in the SDRAM. Input data d1, . . . , d7 are successively taken in synchronization with the clock signal CLK, and after the final input data d7 is taken in, the input data are written in the successive memory cells.

As described above, different from the method in the conventional DRAM in which the address signals and the input data are taken in synchronization with external control signals such as the row address strobe signal /RAS and the column address strobe signal /CAS, the address strobe signals /RAS and /CAS, address signals and input data are all taken in at a rising edge of the externally applied clock signal CLK, which is, for example, a system clock in SDRAM.

The advantage of effecting synchronous operation in which external signals and data are taken in synchronization with external clock signal is that the time margin for the operation of data input/output in view of the skew (deviation of timings) of address signals is not necessary and therefore the cycle time can be reduced. In some systems to which the SDRAM is applied, several bits of memory cells of successive addresses are frequently accessed. By enabling writing and reading of successive data in synchronization with the clock signal in the above described manner, the successive access time can be improved (reduced), and therefore the average access time of the SDRAM can be made equal to that of the SRAM.

If 8 pieces of data each including 8 bits are to be successively written/read as described above, the simplest method for realizing successive writing/reading is to set 64 bits (8×8) of memory cells to the selected state simultaneously in the SDRAM.

Assume an SDRAM having such an array arrangement as shown in FIG. 3.

FIG. 3 shows a chip structure of a standard 16M bit DRAM. Referring to FIG. 3, the DRAM includes four memory mats MM1, MM2, MM3 and MM4 each having storage capacity of 4M bit. Each of the memory mats MM1 to MM4 includes 16 memory arrays MA1 to MA16 each having the storage capacity of 256K bits. Row decoders RD1, RD2, RD3 and RD4 are arranged along one side of the memory mats MM1 to MM4 in the longitudinal direction (vertical direction in FIG. 3) of the chip. Between the two row decoders provided for two memory mats adjacent in the short side direction of the chip, preamplifier circuits PA for amplifying read data and write buffers WB for amplifying the write data and for transmitting the amplified data to the selected memory cells are positioned. One block of the preamplifier circuit PA and the write buffer WB is provided for each of the four memory array blocks, that is, for an array of 1M bits.

Column decoders CD1, CD2, CD3 and CD4 are arranged along the shorter side direction of the chip at the side near the center of the chip of the memory mats MM1 to MM4. Peripheral circuitry PH including an address buffer, a control signal generating circuit is positioned at the central portion of the chip (the area between the column decoders).

The structure of the 16MDRAM shown in FIG. 3 provides a 2M words ×8 bits structure. In operation, four memory arrays are selected. FIG. 3 shows a state in which memory arrays MA1 and MA5 of the memory mat MM3 and memory arrays MA1 and MA5 of the memory mat MM4 are selected. 4 bits of memory cells are selected from each memory array. Therefore, in the structure of FIG. 3, 16 bits of memory cells can be accessed simultaneously. 8 bits are selected from these 16 bits finally, by the address signal bits.

In each of the memory mats MM1 to MM4, selection is done on a unit of 1M bits (4 memory arrays) at first, and thereafter one memory array at most is selected in the selected 1M bit array block. As shown in FIG. 3, four 256K bit arrays are activated in one RAS cycle (one cycle defined by the signal /RAS). Such partial activation is done for reducing power consumption. Memory arrays except the activated memory arrays are maintained at the precharge state.

Figure 4:
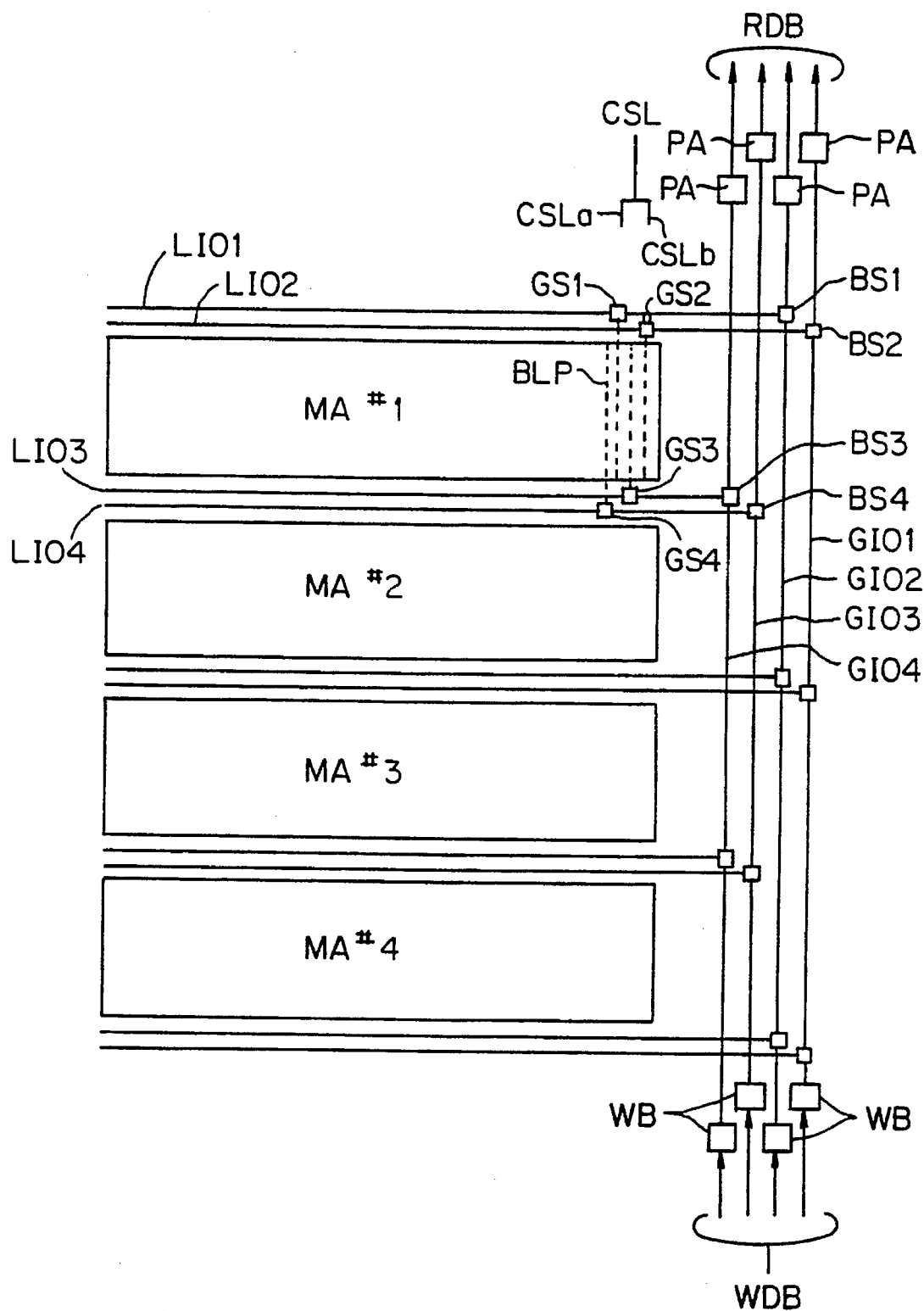
FIG. 4 shows arrangement of internal data transmitting lines (IO lines) of the DRAM shown in FIG. 3.

FIG. 4 schematically shows a structure of four memory array portions in the DRAM of FIG. 3. At most one memory array out of four 256K bit memory arrays MA#1 to MA#4 is activated (word line is selected, bit lines are charged/discharged) in operation.

Referring to FIG. 4, local IO line pairs LIO1, LIO2, LIO3 and LIO4 for transmitting data selected from the memory array are arranged along the longer side direction (shorter side of the chip) for one memory array. The local IO line pair arranged between the memory arrays are shared by adjacent memory arrays. For example, the local IO line pairs LIO3 and LIO4 are shared by the memory arrays MA#1 and MA#2 in FIG. 4. IO switches GS1, GS2, GS3 and GS4 are provided for connecting each of the bit line pairs BLP of the memory arrays and the local IO line pairs LIO (the local IO line pairs are simply referred to as LIO when they are to be generally indicated). An output signal (column selecting signal) of the column decoder CD (column decoders are generally referred to as CD) is transmitted to one column selecting line CSL. The column selecting line CSL is branched into two signal lines CSLa and CSLb. The divided column selecting lines CSLa and CSLb each select two bit line pairs BLP. Namely, four bit line pairs BLP are selected and connected to the local IO line pair LIO by one column selecting line CSL.

The memory array MA has alternately arranged sense amplifier structure in which sense amplifiers are alternately arranged on opposite sides of the bit line pair BLP and the sense amplifiers are shared by adjacent memory arrays. The detailed structure of the memory array will be described later. In other words, each memory array includes an alternately arranged shared sense amplifier structure.

By adopting such shared sense amplifier structure and by sharing the local IO line pair, the area for signal interconnection and the area necessary for the sense amplifiers can be reduced. In addition, by adopting the alternately arranged sense amplifier structure, sufficient pitch of the sense amplifiers can be ensured even when the bit line pitch is made smaller. The column selecting lines extend along the memory arrays in the vertical direction of the figure.

Global IO line pairs GIO1 to GIO4 are arranged commonly to the four memory arrays MA#1 to MA#4. For interconnections of the global IO line pairs GIO1 to GIO4 and the local IO line pairs LIO1 to LIO4, block selecting switches BS1, BS2, BS3 and BS4 are arranged for connecting the local IO line pairs LIO1 to LIO4 to the global IO line pairs GIO1 to GIO4 in response to a block selecting signal. Consequently, data can be exchanged between the global IO line pair GIO (the global IO line pair is generally referred to as GIO) and only the memory array which has been selected and activated.

The global IO line pairs GIO1 to GIO4 are connected to read data buses RDB and write data buses WDB through preamplifiers PA and write buffers WB provided in the corresponding input/output circuits PW. The preamplifier PA and the write buffer WB included in the data input/output circuit PW are activated in response to the block selecting signal and the read designating signal and the write permitting signal, respectively.

By the above described structure, data of 4 bits of memory cells can be read from four memory arrays of 1M bit and data can be written to 4 bits of memory cells. Therefore, in the structure of a 16MDRAM, 16 bits of memory cells can be simultaneously accessed.

The read data bus RDB and the write data bus WDB pass through the input/output circuit PW and are connected to the data input/output terminal through the peripheral circuitry PH. If data input/output by the unit of 8 bits is necessary, 8 bits of data is selected from 16 bits of data in the peripheral circuitry PH. Alternatively, when data input/output by the unit of 8 bits is to be carried out, a structure in which only one memory mat is activated may be used.

When an SDRAM allowing successive accessing of 8 bits (per one data input/output terminal) by utilizing a DRAM having 2M words x 8 bits structure is implemented as described above, it becomes necessary to access memory cells four times as many as memory cells accessed in the 16MDRAM shown in FIG. 3. The number of 256K bit memory arrays which can be activated can not be readily increased, in view of power consumption. When the memory array is activated, the sense amplifier operates and charges/discharges the bit lines, and therefore current for charging/discharging the bit lines by the sense amplifier as well as the current for precharging the bit lines in the precharge cycle are consumed.

Figure 5:
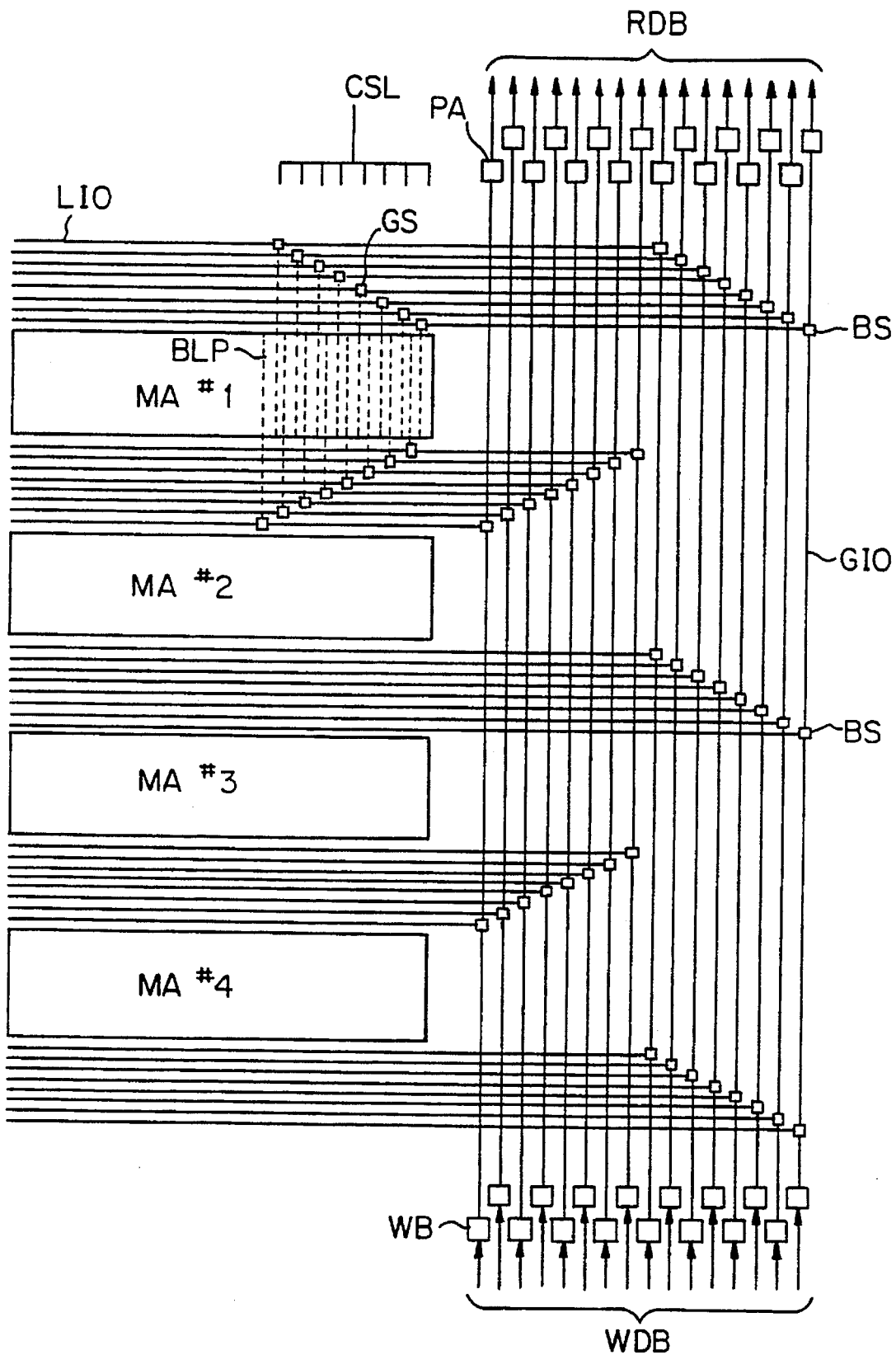
FIG. 5 shows problems generated when the IO line arrangement of FIG. 4 is applied to a synchronous semiconductor memory device having the wrap length of 8.

In order to increase the number of memory cells which are accessed simultaneously while not increasing the number of memory arrays which can be activated at one time, it is necessary to increase the number of memory cells which are selected simultaneously in one memory array. More specifically, the number of local IO line pairs LIO, global IO line pairs GIO, the preamplifiers PA and of the write buffers WB must be fourfold. FIG. 5 shows this state.

Referring to FIG. 5, 16 pairs of local IO lines LIO as well as 16 pairs of global IO lines GIO are provided for one memory array. The column selecting line CSL simultaneously selects and connects 16 pairs of bit lines BLP to the local IO line pair LIO in one memory array. In FIG. 5 also, the branched column selecting lines branched from the column selecting line CSL each select and connect two pairs of bit lines to the local IO line pair LIO.

Similarly, the local IO line pair LIO is connected to the global IO line pair GIO through the block selecting switch BS.

As is apparent from the structure shown in FIG. 5, when the number of the local IO line pairs LIO and the number of the global IO line pairs GIO are increased, the area for interconnection is significantly increased, which leads to considerable increase in chip area. Therefore, it is not advantageous to use the 16M bit DRAM having such a structure as shown in FIG. 3 for implementing the SDRAM allowing successive accessing of 8 bits.

Figure 6:
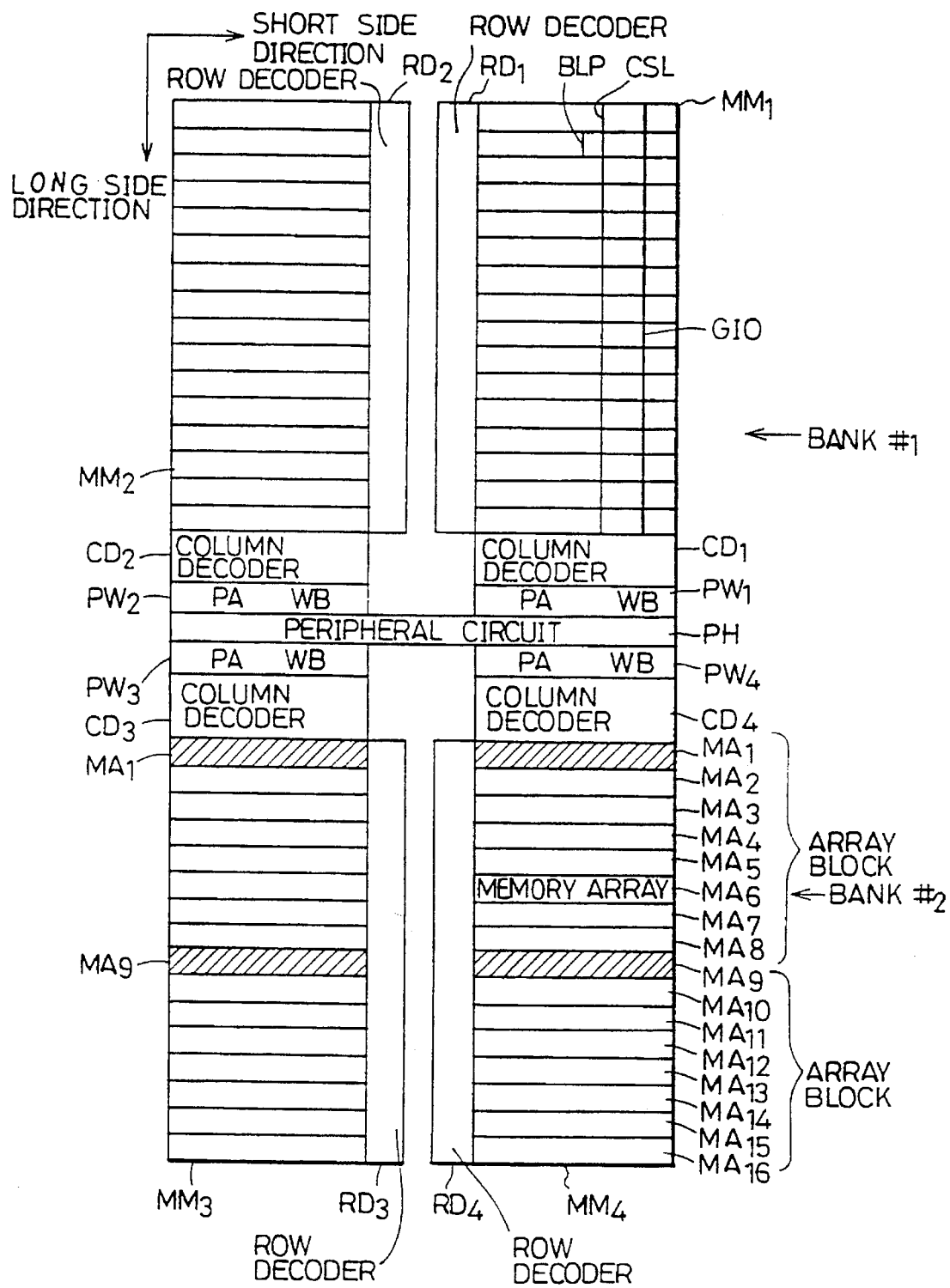
FIG. 6 shows a chip structure of a synchronous semiconductor memory device in accordance with one embodiment of the present invention.

A chip layout for implementing the successive bit accessing without increasing the chip area is shown in FIG. 6.

FIG. 6 shows a chip layout of an SDRAM in accordance with a preferred embodiment of the present invention. FIG. 6 shows, as an example, a 16MSDRAM having a 2M words x 8 bits structure. The SDRAM includes four memory mats MM1 to MM4 each having the storage capacity of 4M bits. Each of the memory mats MM1 to MM4 includes 16 memory arrays MA1 to MA16 each having the storage capacity of 256K bits. Row decoders RD1 to RD4 are respectively arranged along the longer side direction of the chip on one side of the memory mats MM1 to MM4. Column decoders CD1 to CD4 are respectively arranged along the shorter side direction on the side near the central portion of the chip of the memory mats MM1 to MM4. A column selecting line CSL traversing each array of the corresponding memory mat MM (generally refers to the memory mats MM1 to MM4) extends from the column decoder CD (the column decoders CD1 to CD4 are generally indicated as CD). One column selecting line CSL sets 8 pairs of bit lines to the selected state simultaneously, as will be described in detail later.

A global IO line pair GIO for transmitting internal data is arranged to traverse each array along the direction of the longer side of an associated memory mat mm.

Input/output circuits PW1 to PW4 each including a preamplifier PA for amplifying data of the selected memory cell and a write buffer WB for transmitting write data to the selected memory cell are arranged on the side near the central portion of the chip of the memory mats MM1 to MM4, respectively.

Peripheral circuitry PH including a circuit for generating address signals, a circuit for generating control signals and so on is arranged at the central portion of the chip.

The SDRAM shown in FIG. 6 includes two banks, that is, #1 and #2 which can effect precharging operation and activating operation independent from each other. The bank #1 is constituted by the memory mats MM1 and MM2, while the bank #2 is constituted by the memory mats MM3 and MM4. The number of banks can be changed, as will be described in detail later.

The memory mats MM1 to MM4 each include two array blocks, one of which includes memory arrays MA1 to MA8, and the other one includes memory arrays MA9 to MA16. In one array block, at most one memory array is selected. The number of memory arrays activated simultaneously is 4. FIG. 6 shows a state in which memory arrays MA1 and MA9 of the memory mat MM3 and the memory arrays MA1 and MA9 of the memory mat MM4 are activated. In other words, one memory array is selected from the array block of each memory mat in the selected bank. The number of column selecting lines CSL selected simultaneously is 8. One column selecting line CSL selects 8 pairs of bit lines. Therefore, 8×8=64 bits of memory cells are selected at one time.

The input/output circuit PW is shared by the respective memory arrays of the corresponding memory mat MM. 32 preamplifiers PA and 32 write buffers WB are included in one input/output circuit PW, and 128 preamplifiers and 128 write buffers are included in the whole SDRAM. The numbers of the preamplifiers PA and of the write buffers WB are one half of the number 256 in the structure of FIG. 5 which is extended from the structure of FIG. 3. Accordingly, the occupied area on the chip can be significantly reduced.

The preamplifiers PA and the write buffers WB included in the input/output circuit PW are collectively arranged at the center of the chip. These are driven by a control circuit included in the peripheral circuitry PH. Consequently, signal lines for controlling the operations of the preamplifiers PA and the write buffers WB can be made shorter, the load of the signal lines can be made smaller, and speed of operation can be increased.

Since the peripheral circuitry PH is arranged at the central portion of the chip, data input/output is done through the central portion of the chip. Therefore, as for the pin arrangement, when the device is actually accommodated in a package, the data input/output terminals are arranged at the central portion of the package. The distance between the peripheral circuitry PH and the data input/output terminals can be made shorter, and thus data can be input and output at high speed.

The SDRAM shown in FIG. 6 has the alternately arranged shared sense amplifier structure similar to that of the 16MDRAM shown in FIG. 3. More specifically, only the selected memory array is activated and the non-selected memory arrays are maintained at the precharge state. The number of memory arrays activated simultaneously is 4, and therefore current consumption is not increased as compared with the structure of the DRAM shown in FIG. 3.

Figure 7:
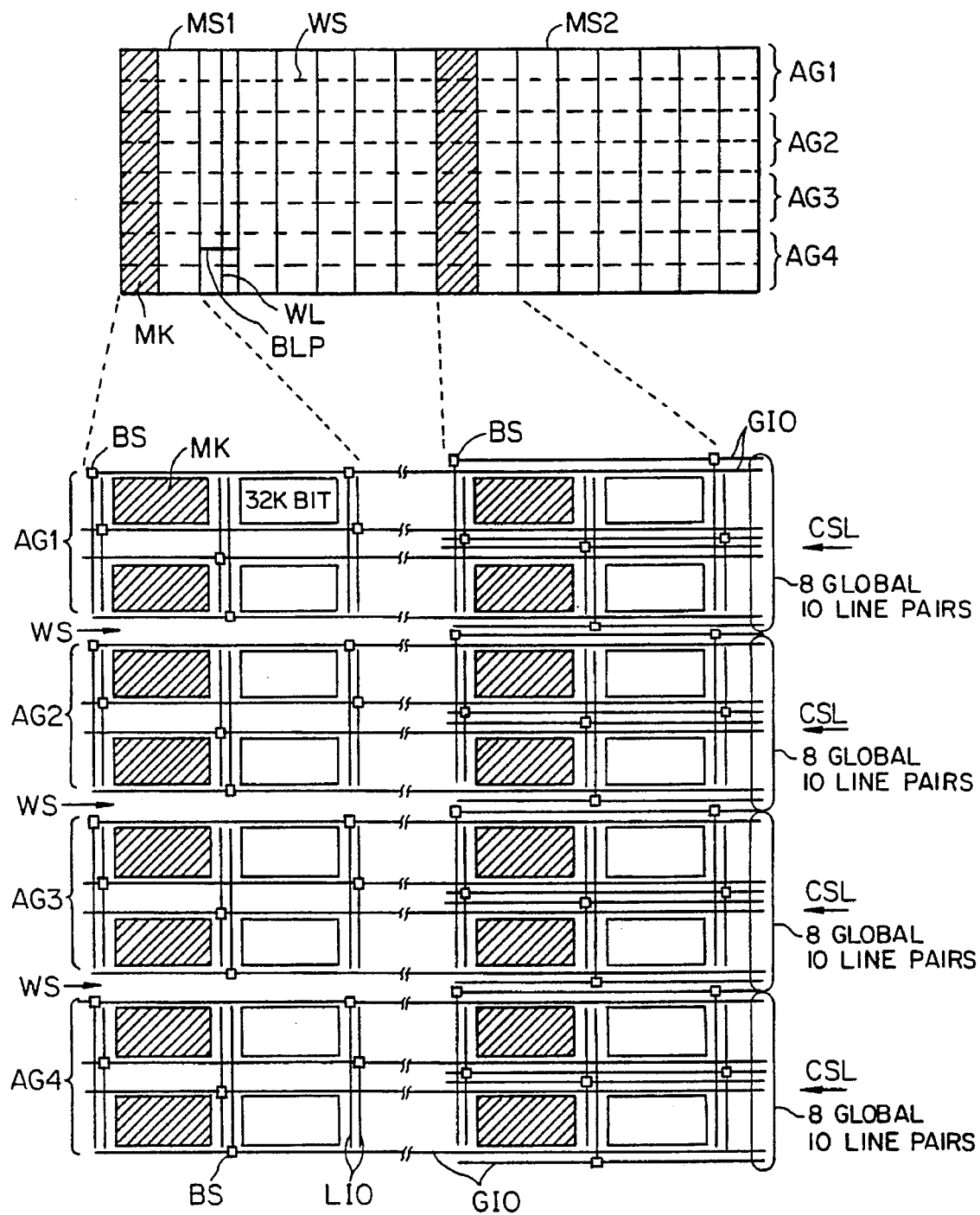
FIG. 7 shows array structure and IO line arrangement of the synchronous semiconductor memory device shown in FIG. 6.

FIG. 7 shows a specific IO line arrangement of the SDRAM shown in FIG. 6. FIG. 7 shows two 1M bit memory arrays MS1 and MS2. The 1M bit memory array MS1 is a 1M bit memory array included in the 2M bit array block arranged away from the chip central portion. The 1M bit memory array MS2 is a memory array included in the 2M bit array block near to the chip central portion.

The 1M bit memory arrays MS1 and MS2 both include 32K bit memory array MK of 8 rows and 8 columns. 1M bit memory array MS (generally refers to the memory array MS1 and MS2) is divided into four array groups AG1, AG2, AG3 and AG4 along the direction of extension of the word lines WL. A word line shunt region WS is provided between adjacent 32K bit memory arrays MK along the direction of the word line WL. Generally, in a DRAM, a metal interconnection of low resistance such as aluminum is arranged in parallel to the word line WL formed of polysilicon in order to decrease resistance of the word lines, and the polysilicon word line and the metal interconnection of low resistance are electrically connected at prescribed intervals. The word line shunt region will be described in the following.

Figure 8:
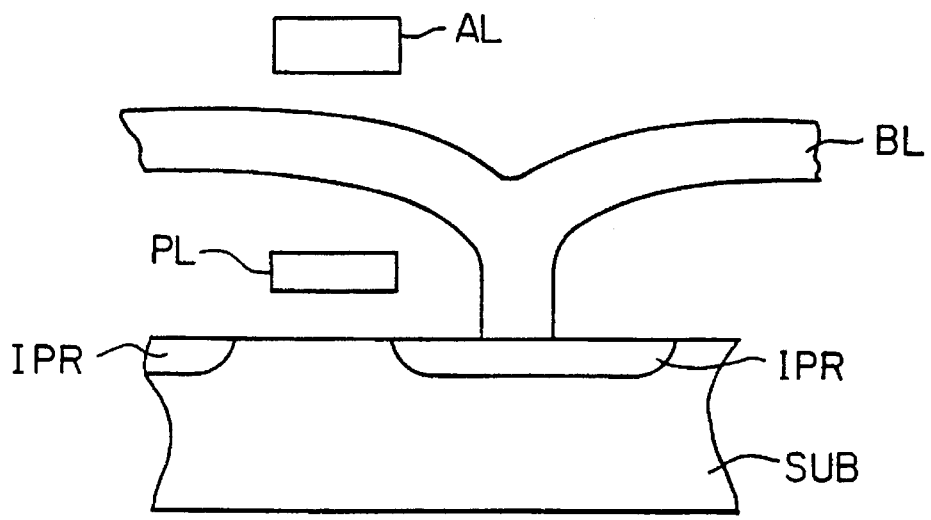
FIG. 8 shows a cross sectional structure of a transistor portion of a memory cell in the synchronous semiconductor memory device.

FIG. 8 schematically shows a cross sectional structure of a transistor constituting a memory cell. An access transistor included in the memory cell includes an impurity region IPR formed on the surface of a semiconductor substrate SUB and a gate electrode PL of polysilicon formed on the impurity region IPR with a gate insulating film interposed therebetween. One impurity region IPR is connected to a bit line BL which is formed, for example, of a first level aluminum interconnection layer. Above the bit line BL, a conductive layer AL of low resistance formed of aluminum, for example, is arranged for word line contact.

Figure 9:
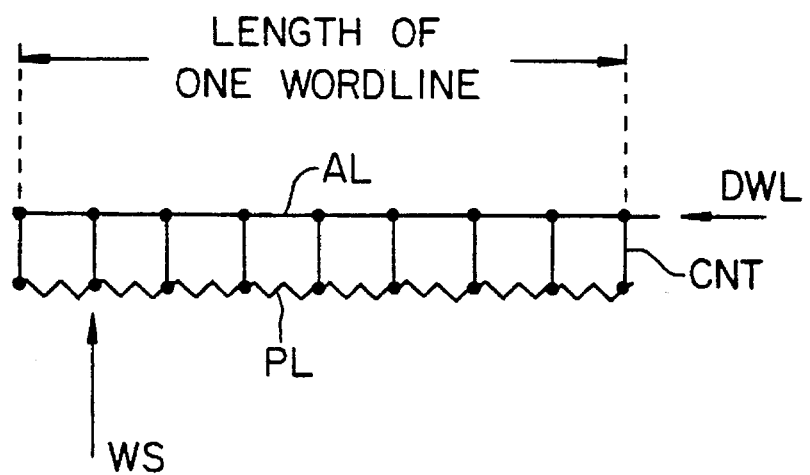
FIG. 9 is an illustration of a word line shunt region.

As shown in FIG. 9, the conductive layer AL of low resistance is electrically connected with the polysilicon gate electrode (word line) PL by contact regions CNT at prescribed intervals. The region in which the electrical connection CNT is provided is referred to as a word line shunt region WS. A word line driving signal DWL is transmitted to the low resistance conductive layer AL. Thus the word line driving signal DWL is transmitted to the terminating end of one word line quickly, and therefore the potential of the word line rises at high speed.

For the electrical connection CNT, it is necessary to connect the polysilicon gate electrode (word line) PL existing in the lower layer of the bit line BL to the low resistance conductive layer AL above the bit line BL. Therefore, the electrical connection CNT must be provided in that region in which the bit line BL does not exist, that is, the region in which there is no memory cell. The region in which there is no memory cell is the region between neighboring memory arrays MK adjacent along the direction of the word line WL in FIG. 7. In this word line shunt region WS, electrical connection between the polysilicon gate electrode (word line) PL and the low resistance conductive layer AL is provided.

Again referring to FIG. 7, the global IO line pair GIO is arranged in the word line shunt region WS. In one word line shunt region WS, four global IO line pairs are arranged in the 2M bit memory array region near the central portion of the chip. Out of the four pairs of global IO lines, two global IO lines further extend in the 2M bit memory array region which is away from the chip central portion. In other words, in the word line shunt region WS in the 2M bit memory array region far from the central portion of the chip, two global IO line paris GIO are provided.

Local IO line pairs LIO for exchanging data with the selected memory arrays are provided corresponding to the respective array groups AG1, AG2, AG3 and AG4. For one 32K bit memory array MK, two local IO line pairs LIO arranged on one side and two local IO line pairs LIO arranged on the other side, that is, a total of four local IO line pairs are arranged. The local IO line pair LIO is shared by 32K bit memory arrays MK adjacent along the direction of the word line WL and belonging to the same allay group, and it is also shared by the 32K bit memory arrays MK adjacent along the direction of the bit line BL. The memory array MK has the alternately arranged shared sense amplifier structure, as will be described in detail later. A sense amplifier is arranged at a region between two 32K bit memory arrays MK adjacent in the direction of the bit line BL. A block selecting switch BS is arranged for connecting the global IO line pair GIO to the local IO line pair LIO. The block selecting switch BS is arranged at an intersection of the word line shunt region WS and the sense amplifier train.

As to the column selecting line CSL transmitting the column selecting signal from the column decoder, one line is selected in each of the array groups AG1 to AG4. One column selecting line CSL selects and connects four pairs of bit lines BLP to the local IO line pair LIO in the region far from the central portion of the chip, and selects four pairs of bit lines BLP in the 2M bit memory array region near the central portion of the chip and connects these pairs of bit lines to the local IO line pair LIO. In other words, 8 bit line pairs BLP are set to the selected state by one column selecting line CSL, which are connected to 8 global IO line pairs GIO through the local IO line pairs LIO. In one memory mat MM, 8×4=32 bit line pairs BLP are selected, and a total of 64 bit line pairs BLP are selected, and therefore a total of 64 bits of memory cells can be accessed at one time as a whole.

Figure 10:
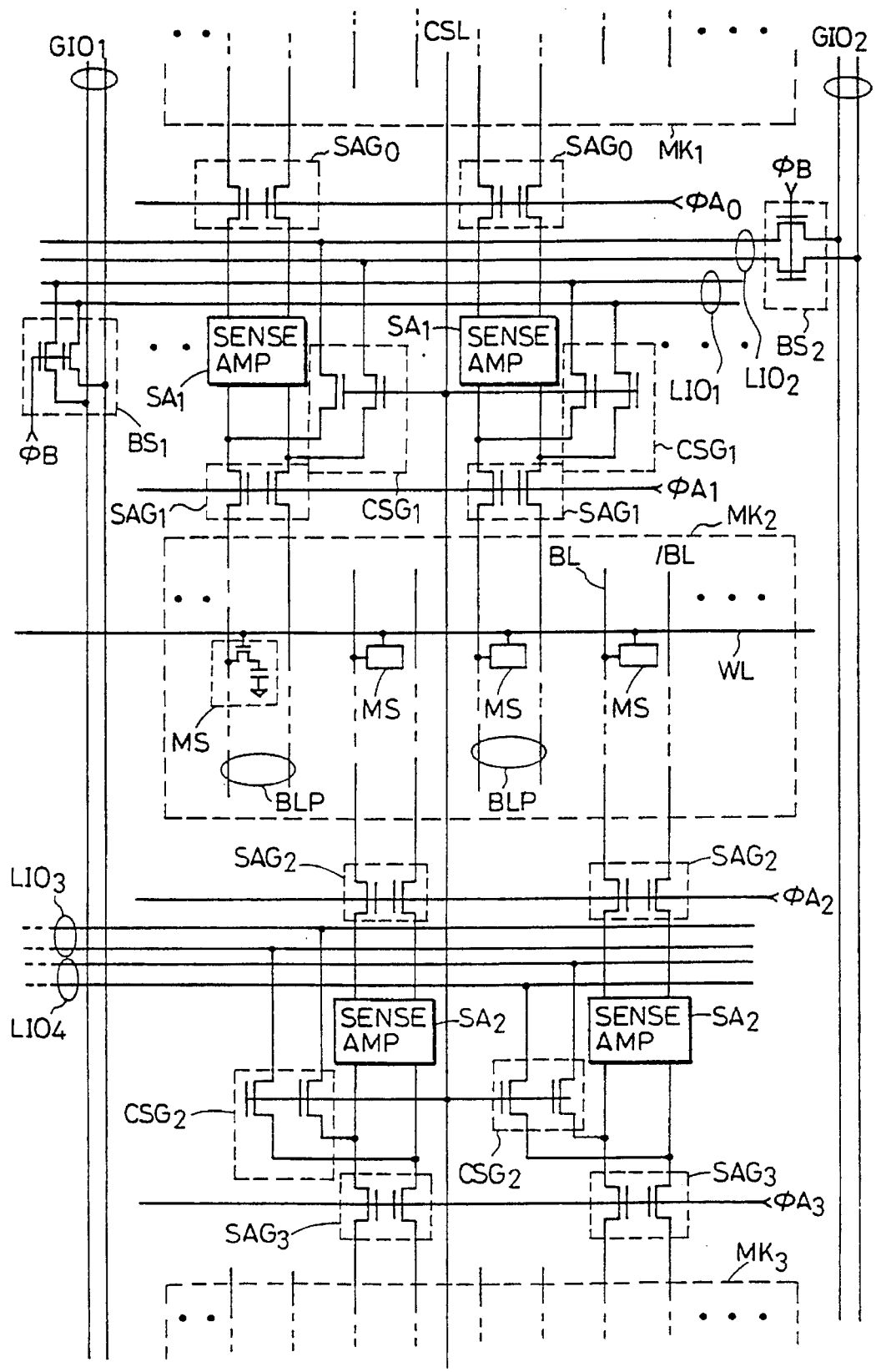
FIG. 10 shows a structure of one 32K bit memory array in the synchronous semiconductor memory device shown in FIG. 7.

FIG. 10 shows a structure of a portion related to one 32K bit memory array. Referring to FIG. 10, the 32K bit memory array MK2 includes a word line WL to which a row selecting signal from the row decoder is transmitted, a bit line pair BLP arranged in a direction crossing the word line WL, and a dynamic memory cell MC arranged corresponding to the crossing of the word line WL and the bit line pair BLP. The memory cell MS includes a transistor for accessing and a capacitor for storing information. The bit line pair BLP includes bit lines BL and /BL to which signals complementary to each other are transmitted. FIG. 10 shows an example in which a memory cell MS is arranged corresponding to a crossing between the bit line BL and the word line WL.

Array selecting gates SAG1 and SAG2 are arranged on both sides of the memory array MK2. The array selecting gates SAG1 and SAG2 are arranged alternately with respect to bit line pairs BLP. The array selecting gate SAG1 is rendered conductive in response to an array selecting signal φA1, while the array selecting gate SAG2 is rendered conductive in response to an array selecting signal φA2. The pair of bit lines BLP are connected to the sense amplifier SA1 and to the sense amplifier SA2 through the array selecting gates SAG1 and SAG2, respectively. More specifically, the sense amplifier SA1 is arranged in parallel to the word line WL on one side of the memory array MK2, and the sense amplifier SA2 is arranged in parallel to the word line WL on the other side of the memory array MR2. Sense amplifiers SA1 and SA2 are arranged alternately on both sides of the bit line pair BLP of the memory array MK2. The sense amplifier SA1 is shared by the memory arrays ME1 and MK2. The sense amplifier SA2 is shared by the memory arrays MK2 and MK3.

In parallel with the train of sense amplifiers SA1, local IO line pairs LIO1 and LIO2 are arranged. In parallel with the train of the sense amplifier SA2, local IO line pair LIO3 and LIO4 are arranged. FIG. 10 shows an arrangement in which two local IO line pairs are provided on one side of the sense amplifier SA. The local IO line pair may be arranged on both sides of the sense amplifier SA.

For the sense amplifier SA1, a column selecting gate CAG1 for transmitting the data sensed and amplified by the sense amplifier SA1 to the local IO line pairs LIO1 and LIO2 is provided. Similarly, for the sense amplifier SA2, a column selecting gate CSG2 for transmitting the data sensed and amplified by the sense amplifier SA2 to the local IO line pairs LIO3 and LIO4 is provided. The column selecting line CSL from the column decoder simultaneously sets the two column selecting gates CSG1 and the two column selecting gates CSG2 conductive. Consequently, four bit line pairs BLP are simultaneously connected to the local IO line paris LIO1, LIO2, LIO3 and LIO4. The data sensed and amplified by the sense amplifier SA1 is transmitted to the local IO line pairs LIO1 and LIO2. The data sensed and amplified by the sense amplifier SA2 is transmitted to the local IO line pairs LIO3 and LIO4.

In order to connect the local IO line pair LIO to the global IO line pair GIO, a block selecting switch BS which is rendered conductive in response to a block selecting signal φB is provided. FIG. 10 shows a block selecting switch BS1 for connecting the local IO line pair LIO1 to the global IO line pair GIO1 and a block selecting switch BS2 for connecting the local IO line pair LIO2 to the global IO line pair GIO2.

The local IO line pairs LIO3 and LIO4 are connected to adjacent global IO line pairs GIO through block selecting switches, respectively, as shown in FIG. 7 (not shown in FIG. 10).

The operation will be described briefly. When the selected word line WL is included in the memory array MK2, array selecting signals φA1 and φA2 are rendered active, and the bit line pairs BLP included in the memory array MK2 are connected to the sense amplifiers SA1 and SA2. The array selecting gates SAG0 and SAG3 provided for the memory arrays MK1 and MK3 are non-conductive, and therefore memory arrays MK1 and MK3 are maintained at the precharge state.

After the memory cell data has appeared on each bit line pair BLP, the sense amplifiers SA1 and SA2 are activated to sense and amplify the memory cell data.

Thereafter, when the signal on the column selecting line CSL rises to active "H", the column selecting gates CSG1 and CSG2 are rendered conductive, and the data sensed and amplified by the sense amplifiers SA1 and SA2 are transmitted to the local IO line pairs LIO1 to LIO4.

Thereafter or simultaneously, the block selecting signal φB is set to active "H", and the local IO line pairs LIO1 to LIO4 are connected to the global IO line pairs GIO1 to GIO4. In data reading, the data on the global IO line pair is amplified and output through the preamplifier PA. In data writing, write data applied from the write buffer WB are transmitted to each bit line pair BLP through the global IO line pair GIO and the local IO line pair LIO, and data is written to the selected memory cell.

The block selecting signal φB is rendered active only for the memory array MK2 to which the selected word line WL belongs. The same applies to the array selecting signals φA1 and φA2. The block selecting signal φB and the array selecting signals φA1 and φA2 can be generated by using a prescribed number of bits (for example, higher 4 bits) of the row address signal.

As described above, by arranging the global IO line pairs GIO in the word line shunt region WS and by arranging the sense amplifier in the alternately arranged shared sense amplifier structure, the wiring region for the signal lines is not increased even if the structure is adapted to select 64 bits of memory cells at one time, and the current consumption is not increased, since the number of 256K memory arrays which are activated simultaneously is 4, which is the same as in the standard 16MDRAM.

Figure 11A:
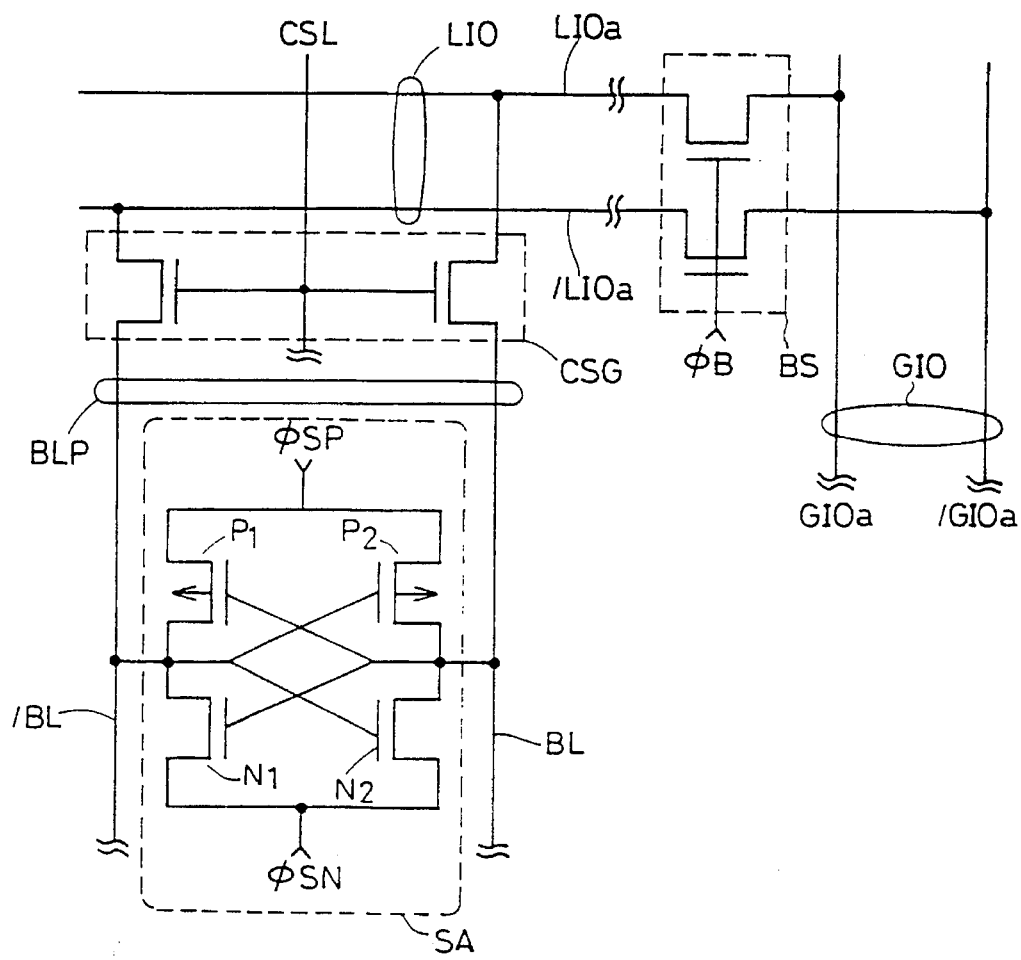
FIGS. 11A and 11B show a structure of a portion related to data reading in the synchronous semiconductor memory device of the present invention.

FIG. 11 shows a structure of a data output path related to a pair of bit lines BLP. Referring to FIG. 11, the sense amplifier SA includes cross coupled p channel MOS (insulated gate type) transistors P1 and P2, and cross coupled n channel MOS transistors N1 and N2. The sense amplifier portion formed by the p channel MOS transistors P1 and P2 charges the potential of the bit line of higher potential in the bit line pair BLP to "H" when the sense amplifier driving signal φSP rises to "H". The sense amplifier portion formed by n channel MOS transistors N1 and N2 discharges the potential of the bit line of the lower potential in the bit line pair BLP to the ground potential, when the sense amplifier driving signal φSN falls to "L". The bit line pair BLP is connected to the local IO line pair LIO through the column selecting gate CSG which is rendered conductive in response to the signal potential on the column selecting line CSL.

The local IO line pair LIO includes local IO lines LIOa and /LIOa which transmit signals complementary to each other. The local IO line pair LIO is connected to the global IO line pair GIO through a block selecting gate BS which is rendered conductive in response to a block selecting signal φB. The global IO line pair GIO includes global IO lines GIOa and /GIOa for transmitting signals complementary to each other. The global IO line pair GIO is coupled to a preamplifier PA included in the input/output circuit PW.

The preamplifier PA includes a structure of a current mirror type differential amplifier circuit. More specifically, the preamplifier PA includes p channel MOS transistor P3 and P4 constituting a current mirror circuit for supplying current from the supply potential Vcc, n channel MOS transistors N3 and N4 constituting a differential amplifying portion to which gate the global IO lines GIOa and/GIOa are connected, and n channel MOS transistor N5 which is rendered conductive in response to a preamplifier activating signal φPAE for rendering active the preamplifier PA. The transistors P3 and P4 have their gates connected to the node between the transistors N3 and P3. The amplified data RD is output from the node between the transistors P4 and N4. The operation will be described briefly.

By selecting a word line, the data of the memory cells connected to the selected word line are transmitted to the bit line BL or /BL. Then, the sense amplifier driving signal /SN falls to "L", then sense amplifier driving signal φSP rises to "H", and accordingly the potential difference of the bit line pair BLP is amplified and latched.

Then, the signal on the column selecting line CSL rises to "H", the column selecting gate CSG is rendered conductive, and the bit lines BL and /BL of the bit line pair BLP are connected to the local IO lines LIOa and LIOa of the local IO line pair LIO. Thereafter, or simultaneously, the block selecting signal φB rises to "H", the block selecting switch BS is rendered conductive, and the local IO lines LIOa and /LIOa of the local IO line pair LIO are connected to the global IO lines GIOa and GIOa of the global IO line pair GIO, respectively.

Then, when the preamplifier activating signal φPAE rises to "H", the transistor N5 is rendered conductive and the preamplifier PA is activated. If the potential of the global IO line GIOa is higher than the potential of the global IO line /GIOa, the conductance of the transistor N3 becomes larger than the conductance of the transistor N4, and therefore more current flows through the transistor N3. When more current flows through the transistor N3, the gate potentials of the transistors P3 and P4 become lower, and because of the current mirror effect, much current flows to the transistor P4. Since the conductance of the transistor N4 is small, the amplified data RD attains "H" at high speed. The amplified data RD is transmitted to a read register for storing read data, which will be described later.

In the structure shown in FIG. 11, the local IO line pair LIO and the global IO line pair GIO in the signal transmitting path both include pairs of signal lines complementary to each other. In order to reduce chip area, the number of signal lines should be as small as possible. The structure for realizing this is shown in FIG. 12.

Figure 12:
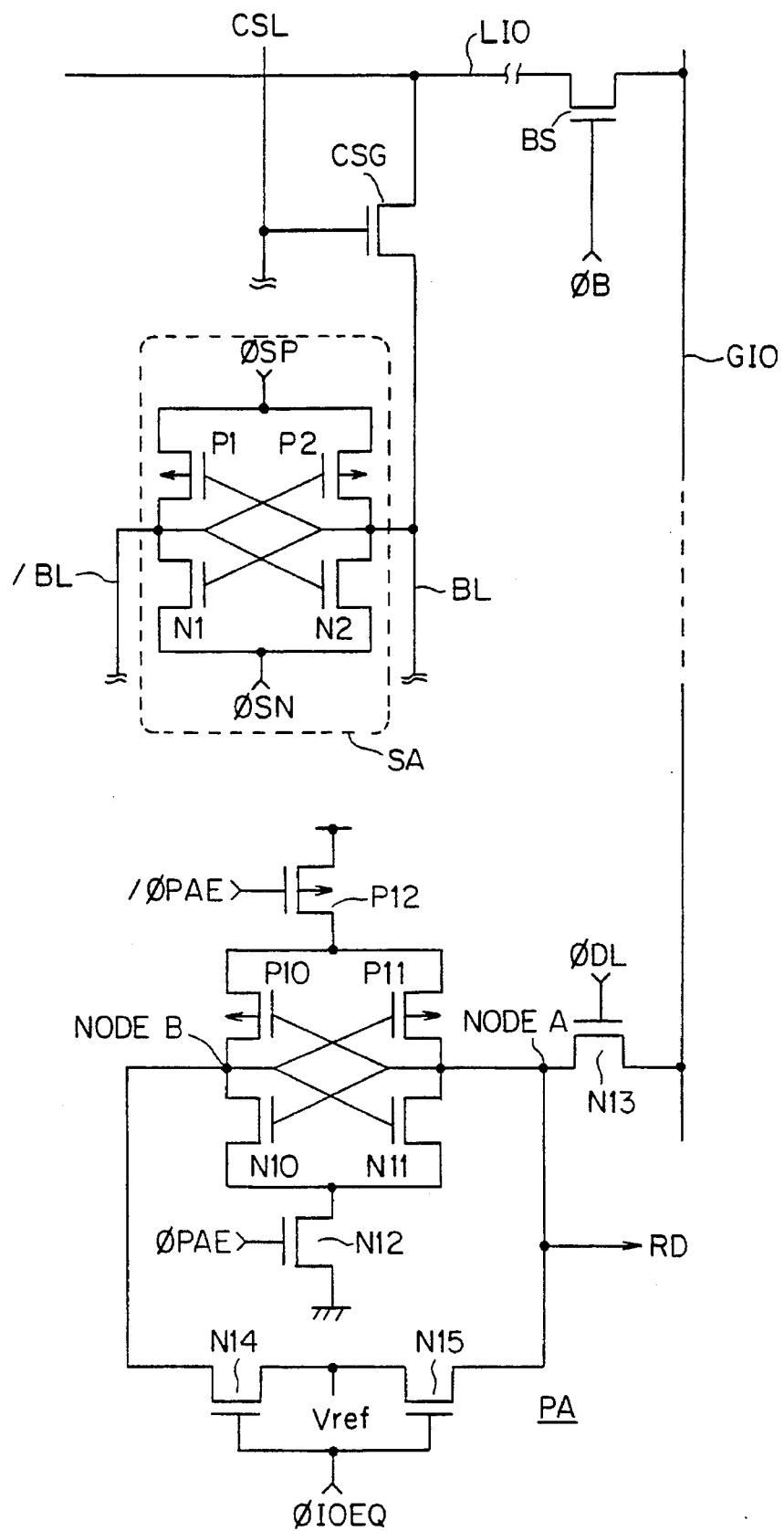
FIG. 12 shows an improvement of the data reading circuitry shown in FIG. 11.

FIG. 12 shows another example of the structure of the data reading path related to a pair of bit lines. Referring to FIG. 12, one bit line BL of the bit line pair BLP is connected to the local IO line LIO through the column selecting gate CSG. The local IO line is formed by one signal line. The local IO line LIO is connected to the global IO line GIO formed of one signal line through the block selecting switch BS. In other words, in the structure of FIG. 12, the IO line for transmitting internal data is not a pair of complementary signal lines. Internal data is transmitted by one signal line.

The preamplifier PA generates internal read data RD by amplifying the signal potential of this one global IO line GIO. The preamplifier PA has a structure of a charge confined preamplifier. More specifically, the preamplifier PA includes p channel MOS transistors P10 and P11 and n channel MOS transistors N10 and N11 constituting a cross coupled amplifier having the similar structure as the sense amplifier SA, and p channel MOS transistor P12 and an n channel MOS transistor N12 for activating this cross coupled amplifier. The transistor P12 receives the preamplifier activating signal /φPAE at its gate and supplies the supply potential Vcc to the cross coupled amplifier. The transistor N12 supply the ground potential to the cross coupled amplifier in response to the preamplifier activating signal φPAE.

The preamplifier PA further includes n channel MOS precharging transistors N14 and N15, transmitting prescribed reference potential Vref to the nodes A and B in response to an equalizing signal φIOEQ, and an n channel MOS transistor N13 for connecting the node A to the global IO line GIO in response to a transfer signal φDL. Internal read data RD after amplification is generated from the node A. The cross coupled amplifier differentially amplifies the potentials at the nodes A and B. The reference potential Vref is set, for example, at an intermediate potential of Vcc/2. The operation of the structure shown in FIG. 12 will be described with reference to FIG. 13, which is a diagram of signal waveforms in this operation.

When the potential of the word line WL rises, the data of the memory cells connected to the word line WL are transmitted to each bit line pair BLP. The bit lines BL and /BL of the bit line pair BLP have been precharged at the intermediate potential of Vcc/2. The data of the memory cells are transmitted to the bit line BL or to /BL in accordance with the selection of the word line, and the potentials of the bit lines BL and /BL change in accordance with the memory cell data. The potential of the bit line to which the selected memory cell is not connected is maintained at the intermediate potential Vcc/2. FIG. 13 shows both examples in a combined manner, in which data of "H" is read to the bit line and in which data of "L" is read to the bit line. When the potential difference of the bit line pair BLP becomes sufficiently large, the sense amplifier driving signals φSN and φSP which have been maintained at the potential of Vcc/2 change to "L" and "H", respectively. Thus the sense amplifier SA is activated, and the potential of the bit line which is at the higher potential of the bit line pair BLP is set to "H" which is at the level of the supply potential Vcc, and the potential of the bit line of lower potential falls to "L", which is at the level of the ground potential Vss.

When the sensing operation by the sense amplifier SA is completed and the potentials of the bit lines BL and /BL of the bit line pair BLP are established, the potential of the column selecting line CSL rises to "H", and the column selecting gate CSG is rendered conductive. Thus the data of the bit line BL is transmitted to the local IO line LIO. The potential of the local IO line LIO changes from the intermediate potential (precharge potential) to the value corresponding to the read memory cell data.

Thereafter, the block selecting signal φB rises to "H", the block selecting switch BS is rendered conductive, and the local IO line LO is connected to the global IO line GIO. Consequently, the potential of the global IO line GIO which has been at the intermediate potential changes to the potential corresponding to the potential of the local IO line LIO.

When the potential of the global IO line GIO is established, the precharge signal φIOEQ falls from "H" to "L". Consequently, transistors N14 and N15 are rendered nonconductive, and the nodes A and B are set in the floating state at the reference potential Vref.

Thereafter, the transfer signal φDL rises, for a prescribed time period, to "H", and the potential of the node A changes to the potential corresponding to the potential of the global IO line GIO. When the transfer signal φDL falls to "L" and the electric charges are confined at the node A, preamplifier activating signals φPAE and /φPAE change to "H" and "L", respectively. Accordingly, the cross coupled amplifier is activated, and the potential of the node which is at the higher potential of nodes A and B is changed to "H", and the potential of the node which is at the lower potential is lowered to "L". The potential at the node A is transmitted to the read register, as will be described later, as the internal read data RD.

In the structure of the preamplifier shown in FIG. 12, the node A is separated from the global IO line GIO by the transistor N13. After the global IO line GIO is separated from the node A, the cross coupled amplifier operates. The global IO line GIO extends over at least 2M bit array region, and over 4M bit arrays at the longest. Thus the global IO line GIO has a large load capacitance. By separating the node A from the global IO line GIO by means of the transistor N13, the load capacitance associated with the node A can be made sufficiently small. Because of this small load capacitance, the cross coupled amplifier can differentially amplify the signal potentials of the nodes A and B at high speed, thus enabling data reading at high speed.

By implementing the signal transmitting path from the bit line pair BLP to the preamplifier PA by one signal line as shown in FIG. 12, the number of signal lines can be reduced to one half, and the area occupied by the interconnections can be reduced.

Although the global IO line GIO is shown to be connected only to the preamplifier PA, the write buffer WB is also connected to the global IO line GIO. Similar operation is carried out in this case also, except that the transmission direction of the signal is reverse to that in data reading.

Figure 11B:
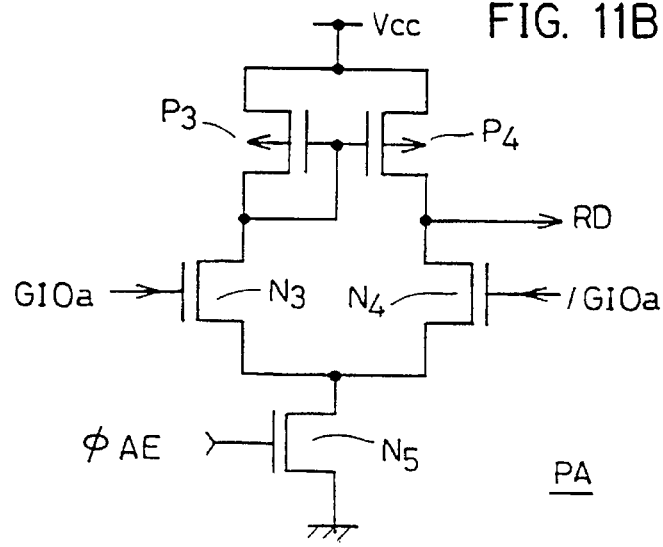

In the structure of FIG. 12, a charge confined type preamplifier is shown as the preamplifier PA. The preamplifier PA shown in FIG. 11B may be used instead of the preamplifier shown in FIG. 12. When the current mirror type preamplifier shown in FIG. 11B is used, the reference potential vref is applied to the gate of the transistor N4, in place of the global IO line /GIOa.

[Correspondence Between the Global IO Lines and Data Input/Output Terminals]

By selecting 8 bit line pairs BLP by one column selecting line CSL and by selecting four column selecting lines CSL in one memory mat, two memory mats can be simultaneously activated, and therefore a total of 64 bits of memory cells can be accessed by one address designation.

As shown in FIG. 14, one column selecting line CSL corresponds to 8 pairs of global IO lines. In one memory mat MM, one column selecting line CSL is selected in each array group AG. For one array group, 8 pairs of global IO lines GIO0 to GIO7 are arranged. Two memory mats MMA and MMB are selected simultaneously. Therefore, 64 global IO line pairs GIO in total can be accessed. There are various possibilities with respect to the correspondence between 64 global IO line pairs, that is, 64 bits of memory cells and the data input/output terminals DQ. The correspondence between the data input/output terminals DQ and 64 bits of memory cells will be described.

(1) Approach 1

There are 8 data input/output terminals DQ, i.e., DQ0 to DQ7. In this method 1, 8 pairs of global IO lines GIO0 to GIO7 corresponding to one column selecting line CSL are made associated with 8 data input/output terminals DQ0 to DQ7, respectively. FIG. 15A shows this correspondence.

In accordance with the relation shown in FIG. 15A, the 8 global IO line pair can be associated simultaneously with the 8 data input/output terminals DQ0 to DQ7 by one column selecting line CSL. In this case, internal structure can be easily changed if wrap length (the number of data which can be successively accessed) is changed. More specifically, if the wrap length is 8, 8 successive data can be associated with the column selecting lines successively, by setting 8 column selecting lines CSL simultaneously to the selected state. If the wrap length is 4, 4 column selecting lines may be adapted to be set to the selected state at one time.

The change of the number of column selecting lines selected as the wrap length is changed can be done by changing the number of unit decoder circuits which are set to the selected state simultaneously in the column decoder, by using the wrap length setting information and 1 bit of the column address bit applied to the column decoder. More specifically, by applying 1 bit of column address as an activating signal in accordance with the wrap length setting information to the column decoder portion provided corresponding to each array group or to the memory mat, the number of column selecting lines selected at one time can be changed in accordance with the wrap length. In this example, by switching the preamplifiers PA or the write buffers WB in synchronization with the clock signal array group by array group successively, successive data writing/reading can be realized. FIG. 15B shows correspondence between the input (or output) data a and the column selecting lines CSL when 8 pieces of data each including 8 bits are to be successively accessed. FIG. 15B also shows the structure for changing the number of column selecting lines selected corresponding to the wrap length. The wrap length setting signal φLA indicates the wrap length of 8 when it is at "H". The reference character CA2-CA0 represents the column address bit. The column selecting lines are divided into two groups, that is, CSL0 to CSL3 and CSL4 to CSL7. Least significant column address bits CA0 and CA1 are employed for selecting a column selecting line from each of the groups of the lines CSL0-CSL3 and the lines CSL4-CLS8 if the signal φLA is at "H" indicating that the wrap length is 8. If the wrap length is 4, additional column address bit CA2 is employed to select one of the column selecting line groups.

(2) Approach 2

Figure 16A:
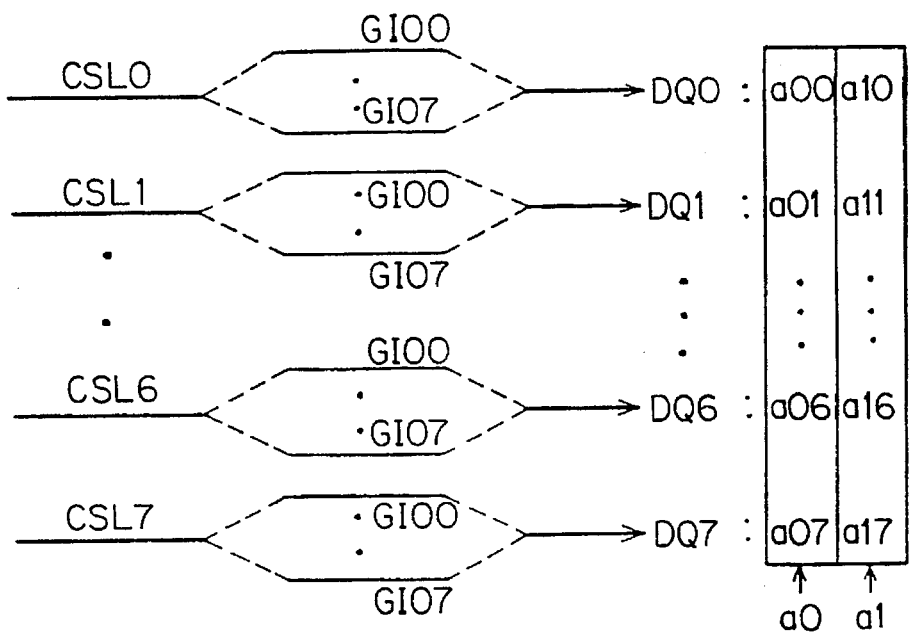
FIGS. 16A–B show correspondence between the column selecting line and the data input/output terminal and advantages thereof.

In the first method of the approach 2, one column selecting line CSL corresponds to one data input/output terminal DQ as shown in FIG. 16A. More specifically, when the wrap length is 8, the global IO line pairs GIO0 to GIO7 are associated with 8 bit wrap data related to one data input/output terminal.

In this structure, preamplifiers PA or write buffers WB are sequentially activated with respect to one array group.

If one column selecting line is associated with one data input/output terminal DQ as shown in FIG. 16A, the write per bit operation, for example, can be easily implemented. In the write per bit operation, writing of data to the data input/output terminals DQ0 to DQ7, is inhibited independently. In that case, the column selecting line CSL corresponding to that data input/output terminal DQ to which data writing is inhibited may be set to the non-selected state. This structure is shown in FIG. 16B.

Figure 16B:
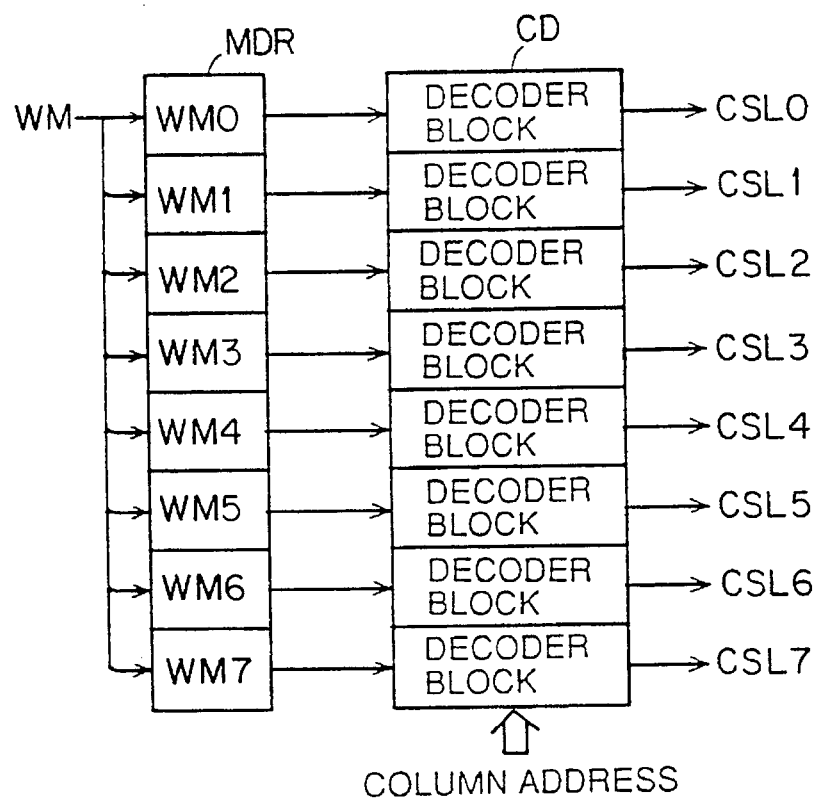

FIG. 16B shows a structure for effecting write inhibition when there are 8 data input/output terminals. A mask data register MDR receives and stores 8 bits WM0-WM7 of mask data WM. The column decoder CD is divided into 8 blocks, and one column selecting line is selected from each block. In this case, by inactivating the corresponding column decoder block in accordance with the mask data stored in the mask data register MDR, the column selecting signal is not transmitted from the corresponding column decoder block to the column selecting line.

By employing this structure, data writing to an intended data input/output terminal DQ can be masked easily, as in the write per bit operation.

As for the taking of the mask data WM, a structure in which the data applied to respective data input/output terminals DQ are taken in as the mask data WM at a prescribed timing, for example the timing of write enable and CAS before RAS (WCBR) may be used.

[Bank Structure]

In the SDRAM, the memory array is divided into a plurality of banks. The banks must carry out precharging operation and activating operation (selection of word lines, activation of sense amplifiers and so on) independent from each other. In the arrangement shown in FIG. 6, four memory mats MM1 to MM4 are divided into two banks #1 and #2. The bank #1 includes memory mats MM1 and MM2, while bank #2 includes memory mats MM3 and MM4.

In this structure, a row decoder and a column decoder are provided for each memory mat, and the internal data transmitting lines are independent for each memory mat. Therefore, the condition for banks are satisfied.

In the structure of FIG. 6, the input/output circuit PW including preamplifiers PA and write buffers WP is provided for each memory mat. Therefore, interleave operation in which the bank #1 and the bank #2 are alternately accessed can be realized.

[Switching of the Number of Banks]

In a standard DRAM, a DRAM formed by the same chip is frequently made to have x 8 structure or x 4 structure by wire bonding. In this case, generally, the internal circuit is adapted to operate in the x 8 structure. By connecting a specific pad to the supply potential Vcc or to the ground potential Vss, the internal structure is changed to the x 4 structure. In that case, only 4 bits of data bus are connected to the data input/output terminals by setting potential of a specific pad by wire bonding, out of 8 bits of internal data transmitting buses. Generally, if it is changed to have the x 4 structure, activation of the memory arrays is also changed to correspond to the x 4 structure.

In the SDRAM having the x 8 structure in which data input/output is carried out 8 bits by 8 bits, 8 (DQ) x 8 (wrap length) x 2 (banks)=128 bits of global IO line pairs and the like are necessary. This is because 64 bits of memory cells are simultaneously selected in 1 RAS cycle. However, if it has the x 4 structure, what is needed is simultaneous selection of 4 (DQ) x 8 (wrap length) x 2 (banks)=64 bits of memory cells. In the SDRAM, a structure in which 64 bits of memory cells are simultaneously selected in one bank has been already prepared for the x 8 structure. Therefore, if it is set to have the x 4 structure, it is possible to change the number of banks in the SDRAM to 4. There are various methods of dividing the banks. In the arrangement of FIG. 6, the memory mats MM1, MM2, MM3 and MM4 may be each associated with one bank.

Figure 17:
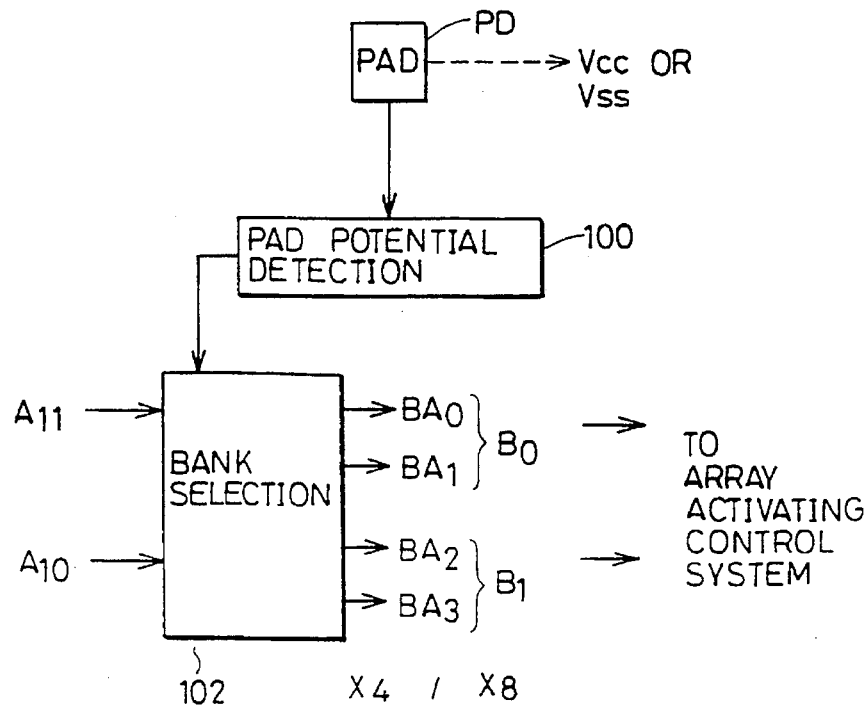
FIG. 17 shows a circuit structure for switching the number of banks.

FIG. 17 shows a structure of a control system for switching the number of banks between the x 8 structure and x 4 structure. Referring to FIG. 17, a pad PD is connected to the supply potential Vcc or to the ground potential Vss. A pad potential detecting circuit 100 detects the potential of the pad PD and outputs a signal of "H" or a signal of "L". A bank selecting circuit 102 generates a bank selecting signal by carrying out 2 bit decoding operation or 1 bit decoding operation in response to the signal potential from the pad potential detecting circuit 100. 2 bits of address signals A11 and A10, for example, are applied to the bank selecting circuit 102. If the output signal from the pad potential detecting circuit 100 indicates the x 4 structure, the bank selecting circuit 102 decodes the 2 bits of signals A11 and A10 and sets one of the 4 bits of bank selecting signals BA0 to BA3 to a selected state.

If the output signal from the pad potential detecting circuit 100 indicates the x 8 structure, the bank selecting circuit 102 generates 2 bits of bank selecting signals B0 and B1 in accordance with the address signal bit A11. The output from the bank selecting circuit 102 is applied to an array activating control system (included in the peripheral circuitry shown in FIG. 6).

In manufacturing the chip, four banks are prepared, and bank selecting signals BA0 to BA3 are generated correspondingly to the respective banks. If the pad PD is set to the supply potential Vcc or to the ground potential Vss, the output of the pad potential detecting circuit 100 is fixed at a signal potential indicating the x 4 structure or the x 8 structure. The bank selecting circuit 102 makes valid/invalid 1 bit address signal A10, by the output from the pad potential detecting circuit 100.

The bank selecting circuit 102 makes valid the address signal bit A10 and carries out decoding operation of 2 bits when the pad potential detecting circuit 100 indicates the x 4 structure. If the pad potential detecting circuit 100 indicates the x 8 structure, the bank selecting circuit 102 makes invalid the address signal bit A10, and fixes it to the potential at "H" or "L". In this case, a set of signals (A11, X) is applied in equivalence, to the bank selecting circuit 102. X indicates an arbitrary signal level. In this case, bank selecting operation is carried out in accordance with the address signal bit A11, and either the bank selecting signal B0 or B1 is set to the selected state.

Therefore, if the bank selecting signals BA0, BA1, BA2 and BA3 are used for activating circuits related to the memory mats MM1, MM2, MM3 and MM4, respectively, one of the memory mats is activated according to the address bits A10 and A11.

As for switching of the data input/output system, if the data input/output terminals and the column selecting lines are in one to one correspondence as shown in FIG. 16, data buses of the higher bits are switched to the data buses of lower bits, by the output potential of the pad potential detecting circuit 100 (provided that the data input/output terminals DQ0 to DQ3 are used when x 4 structure is employed).

If the column selecting lines and the data input/output terminals have such correspondence as shown in FIG. 15, the output path of the preamplifiers PA and the input path of the write buffers WB are switched by the output of the pad potential detecting circuit 100 such that two pieces of wrap data (each wrap data including 4 bits) are applied to one column selecting line, and 4 bits of preamplifiers PA and write buffers WB are successively activated. Consequently, even when 8 pieces of wrap data each including 4 bits are applied successively, such accessing can be easily coped with by the above-described sequential and successive activation.

Figure 18:
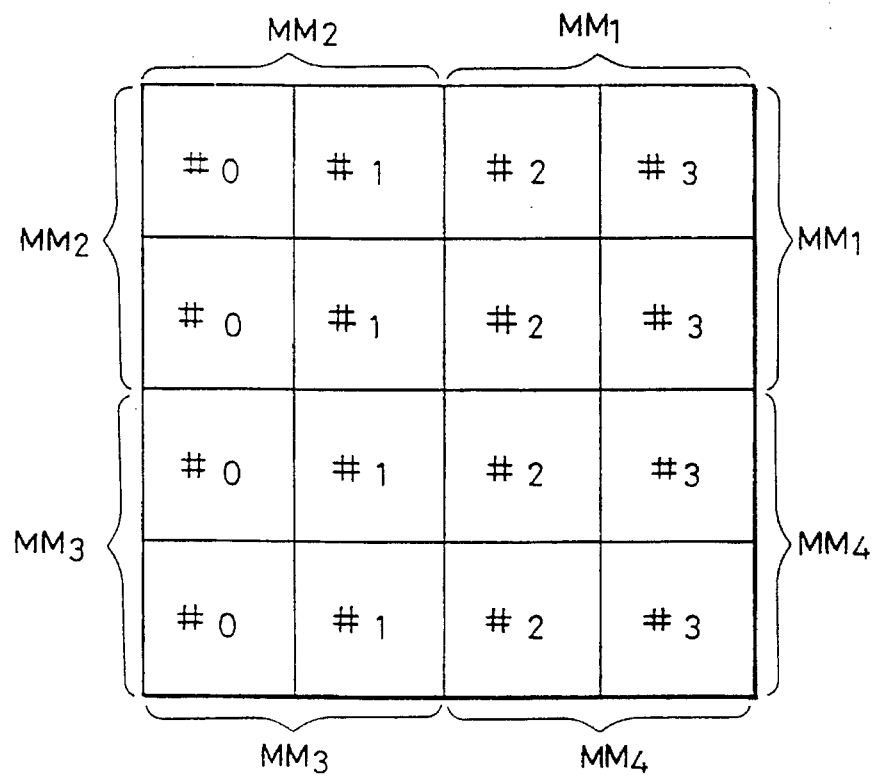
FIG. 18 shows an example of the bank structure in a 16M bit SDRAM.

FIG. 18 shows another example of the bank structure of the memory array. Referring to FIG. 18, one memory mat MM is divided into two banks, In other words, one memory mat MM is divided into four 1M bit arrays. There are four memory mats MM1 to MM4, and 1M bit array regions arranged in the vertical direction of the figure constitute one bank. The memory array can be divided to have such a bank structure. In this case also, the preamplifiers PA, the write buffers WB and the global IO lines can be operated independently in each bank, and the column selecting operation can be effected independently. In this example, if 2 bank structure is employed, banks #0 and #3 constitute one bank, while banks #1 and #2 constitute one bank.

Based on the same concept, if the wrap length is set to 4 when x 8 structure is employed, 64 bits of global IO lines become unnecessary. In that case also, the number of banks can be set to 4. For this structure, the pad potential detecting circuit 100 in FIG. 17 should be replaced by the wrap length setting circuit. In this case, if the wrap lengths of 8 and 4 are switched by wire bonding, the pad potential detecting circuit 100 itself can be used as a wrap length setting circuit. Alternatively, a structure in which the pad potential detecting circuit 100 is omitted and the pad PD is directly connected to the bank selecting circuit 102 may be employed.

[Functional Structure of SDRAM]

FIG. 1 is a block diagram functionally showing the structure of a main portion of the SDRAM in accordance with the present invention. FIG. 1 shows a portion of a functional structure related to 1 bit of the SDRAM having x 8 bit structure.

An array portion related to a data input/output terminal DQi includes a memory array 1a constituting a bank #1 and a memory array 1b constituting a bank #2.

The memory array 1a of the bank #1 includes an X decoder group 2a constituting a row decoder for selecting corresponding rows in the memory array 1a by decoding address signals X0 to Xj, a Y decoder group 4a constituting a column decoder for generating a column selecting signal to select corresponding columns in the memory array 1a by decoding column address signals Y3 to Yk, and a sense amplifier group 6a for detecting and amplifying data of the memory cells connected to the selected row in the memory array 1a.

The X decoder group 2a includes X decoders provided corresponding to respective word lines of the memory array. In accordance with the address signal X0 to Xj, a corresponding X decoder is set to the selected state, and sets the corresponding word line to the selected state. The Y decoder group 4a includes Y decoders provided corresponding to the respective column selecting lines. One column selecting line CSL sets 8 pairs of bit lines to the selected state. By the X decoder group 2a and the Y decoder group 4a, 8 bits of memory cells are simultaneously selected in the memory array 1a. The X decoder group 2a and Y decoder group 4a are activated by the bank designating signal B1, respectively.

For the bank #1, a bus GIO of internal data transmitting line (global IO line) for transmitting the data detected and amplified by the sense amplifier group 6a and for transmitting write data to the selected memory cell of the memory array 1a is provided. The global IO line bus GIO includes 8 pairs of global IO lines.

For data reading, a preamplifier group 8a activated in response to a preamplifier activating signal $\phi$PA1 for amplifying data on the global IO line bus GIO, a read register 10a for storing data amplified by the preamplifier group 8a and an output buffer 12a for successively outputting the data stored in the read register 10a are provided. Each of the preamplifier group 8a, the read register 10a and the output buffer 12a has a structure of 8 bit width, corresponding to the 8 bits of global IO line pairs. The read register 10a latches the output data from the preamplifier group 8a in response to a register activating signal $\phi$Rr1 and successively outputs the data. The output buffer 12a transmits, in response to an output enable signal $\phi$OE1, 8 bits of data stored in the read register 10a successively to the data input/output terminal DQi. Data input/data output are commonly carried out through the data input/output terminal DQi.

For data writing, an input buffer 18a having 1 bit width which is activated in response to an input buffer activating signal $\phi$DB1 for generating write data from an input data applied to the data input/output terminal DQi, a write register 16a activated in response to a register activating signal $\phi$Rw1 for successively storing write data from the input buffer 18a, and a write buffer group 14a activated in response to a write buffer activating signal $\phi$WB1 for amplifying the data stored in the write register 16a and for transmitting the data to the global IO line pair GIO are provided. The write buffer group 14a and the write register 16a each have 8 bit width.

The bank #2 similarly includes an X decoder group 2b, a Y decoder group 4b, a sense amplifier group 6b which is activated in response to a sense amplifier activating signal $\phi$SA2, a preamplifier group 8b which is activated in response to a preamplifier activating signal $\phi$PA2, a read register 10b activated in response to a register activating signal err2, an output buffer 12b activated in response to an output enable signal $\phi$OE2, a write buffer group 14b activated in response to a buffer activating signal $\phi$WB2, a write register 16b activated in response to a register activating signal $\phi$Rw2 and an input buffer 18b activated in response to a buffer activating signal $\phi$DB2.

The banks #1 and #2 have identical structure. The read registers 10a and 10b and the write register 16a and 16b are registers for storing wrap data for successive accessing.

As for the control signals to the banks #1 and #2, only the control signals for either one of the banks are generated, in response to the bank designating signals B1 and B2.

In connection with the chip arrangement of FIG. 6, the read registers 10a and 10b, the write registers 16a and 16b, the input buffers 18a and 18b and the output buffers 12a and 12b are arranged in the peripheral circuitry PH. The preamplifier groups 8a and 8b and the write buffer groups 14a and 14b are arranged in the input/output circuit PW.

This functional block 200 is provided for each data input/output terminal. If x 8 bit structure is used, 8 functional blocks 200 are provided.

As described above, by providing approximately identical structures for the banks #1 and #2 and by activating only one of the banks by the bank designating signals B1 and B2, it becomes possible to operate the banks #1 and #2 substantially independent from each other. Further, by providing registers 10a and 10b for data reading and registers 16a and 16b for data writing separately and for the banks #1 and #2, respectively, confliction of data at the time of switching between reading and writing of data and at the time of switching banks can be prevented, which allows accurate data reading and writing.

As for the control system for activating memory arrays in the banks #1 and #2 independent from each other, a first control signal generating circuit 20 which takes in externally applied control signals, that is, an external row address strobe signal ext./RAS, an external column address strobe signal ext./CAS, an external output enable signal ext./OE, an external write enable signal (write permitting signal) ext./WE and a mask designating signal WM in synchronization with an external clock signal CLK, which is, for example, a system clock and generates internal control signals $\phi$xa, $\phi$ya, $\phi$W, $\phi$O, $\phi$R and $\phi$C, and a second control signal generating circuit 22 responsive to the bank designating signals B1 and B2, the internal control signals $\phi$W, $\phi$O, $\phi$R and $\phi$C and to the clock signal CLK for generating control signals for independently driving the banks #1 and #2, that is, sense amplifier activating signals $\phi$SA1, $\phi$SA2, preamplifier activating signals $\phi$PA1, $\phi$PA2, write buffer activating signals $\phi$WB1, $\phi$WB2, input buffer activating signals $\phi$DB1, $\phi$DB2 and output buffer activating signals $\phi$OE1, and $\phi$OE2 are provided.

The internal control signal $\phi$W is an internal write permitting signal generated in synchronization with the external write permitting signal ext./WE. The internal control signal $\phi$O is an internal read permitting signal generated in synchronization with the external read permitting (read enable) signal ext./OE. The internal control signal $\phi$R is an internal row address strobe signal (internal RAS signal) generated in synchronization with the external row address strobe signal ext./RAS. The internal control signal $\phi$C is an internal column address strobe signal (internal CAS signal) generated in synchronization with the external column address strobe signal ext./CAS. The internal control signals $\phi$xa and φya are internal address buffer activating signals generated in synchronization with external control signals ext./RAS and ext./CAS, respectively.

The second control signal generating circuit 22 activates only the control signals corresponding to the designated bank, in accordance with the bank designating signals B1 and B2. The timings of the control signals generated by the second control signal generating circuit 22 is controlled by the clock signal CLK. For example, the read permitting signal φOE1 or φOE2 is generated after 6 clock signals CLK are counted after the external row address strobe signal ext./RAS (or the internal row address strobe signal φR) is rendered active. The write buffer activating signal φWB1 or φWB2 is generated in response to a clock signal after 8 write data have been applied. More specifically, when the external write permitting signal ext./WE is activated and 8 clocks CLK are counted, then write data to the selected memory cell of the memory array is transmitted. Here the wrap length of 8 is assumed, and in the normal operation mode, the SDRAM operates on the assumption of the wrap length of 8.

The SDRAM further includes as the peripheral circuitry, an X address buffer 24 responsive to an internal control signal φxa for taking in the external address signal ext. A0 to ext. Ai for generating internal address signals X0 to Xj as well as the bank selecting signals B1 and B2; a Y address buffer 26 which is activated in response to the internal control signal φya for generating a column address Y3 to Yk for designating the column selecting line and wrap address bits Y0 to Y2 for designating the first bit line pair (column) at successive accessing; and a register control circuit 28 responsive to the clock signal CLK for decoding the wrap address bits Y0 to Y2 for generating wrap addresses WY0 to WY7, register driving signals φRr1 and φrr2 for controlling the read registers 10a and 10b, and control signals φRw1 and φRw2 for driving the write registers 16a and 16b. A structure in which the bank designating signals B1 and B2 are applied to the register control circuit 28 and the register driving signals are generated only for the selected bank may be employed. Specific internal operation will be described in the following.

[Successive Write Mask Function]

In the SDRAM, 8 bits of data are successively written for one data input/output terminal in the normal operation mode. If only the even numbered byte data of a series of data are to be rewritten, for example, the desired even numbered data only can be rewritten if the odd numbered data are masked. A structure for masking the desired byte data in the successive accessing operation will be described.

FIG. 19 is a timing chart for masking in successive accessing. In FIG. 19, the indicated various control signals are all external control signals. However, the reference character "ext." indicating that the signal is an external signal, is omitted. In data writing operation, first the external row address strobe signal /RAS is set to "L". Consequently, the external address ADD is taken in as the row address signal Xa and an internal row address signal is generated. Accordingly, a bank is selected and memory arrays are activated (word lines are selected and sense amplifiers are driven) in the selected bank.

Then, the external column address strobe signal /CAS and the external write permitting signal /WE are set to "L". In the general specification, the RAS-CAS delay time tRCD, that is, the time necessary from the fall of the external row address strobe signal /RAS to the fall of the external column address strobe signal /CAS, is 2 clock cycles.

As the write permitting signal /WE falls to "L", the input buffer at the selected bank is activated, and data is written to the write registers. The position of writing data in the write registers is designated by the lower three bits Y0 to Y2 of the internal column address signal Yb generated from the external address signal ADD which is taken in at the fall of the external column address strobe signal /CAS. Thereafter, at the rising edge of the clock signal, the data are successively written to the write registers through the input buffer. Thus 8 bytes of data b0 to b7 are successively written. After 8 bytes of data b0 to b7 are written, these 8 bytes of data are simultaneously written to the memory cells of 64 bits, which have been already selected. The transmission of the write data to the selected memory cells is carried out in response to the rise of the clock signal CLK after 8 counts of the clock signals CLK from the fall of the write permitting signal /WE to "L".

In the masked write operation in which desired byte data are masked during successive writing, the external mask designating signal WM is raised to "H" corresponding to the data which should be masked. FIG. 19 shows an example in which the second byte data d1 and the fifth byte data d4 are to be masked. In this case, although 64 bits of memory cells are selected simultaneously, write data are not transmitted to the corresponding memory cells. In this case, only the re-writing or restoring operation is effected to the memory cells corresponding to the masked data. The structure for masking in the successive writing operation will be described.

Figure 20A:
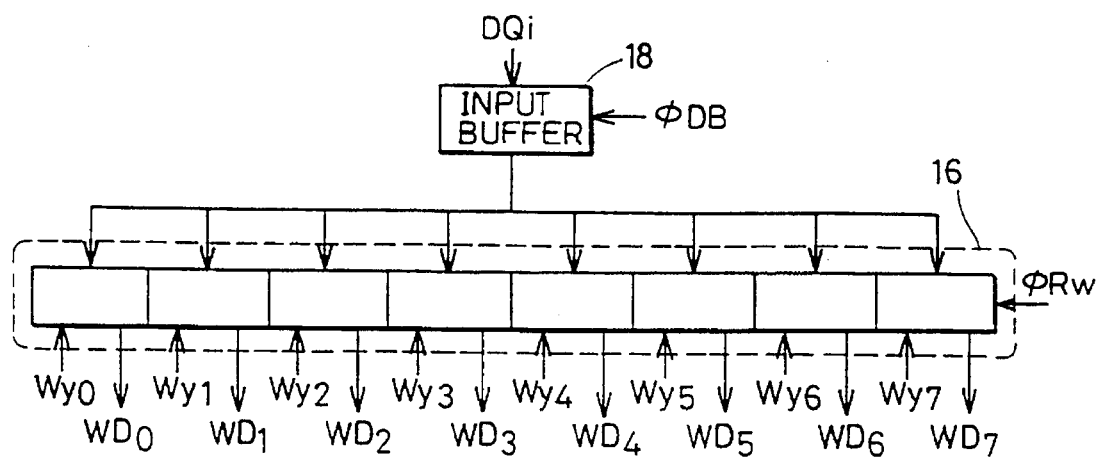
FIGS. 20A–C show a structure for masking a desired data bit in the successive access cycles.

FIG. 20 shows a circuit structure implementing the masked write function in the successive writing operation. FIG. 20A shows a write register 16 and an input buffer 18. The input buffer 18 takes in the input data applied to the data input/output terminal DQi and generates a write data. The input buffer 18 is activated in response to the input buffer activating signal φDB. The input buffer activating signal φDB is generated in response to the internal write signal φW from the second control signal generating circuit 22 shown in FIG. 1. The output from the input buffer 18 is applied to the write register 16 having 8 unit registers. The write register 16 latches the write data from the input buffer 18 in that unit register which corresponds to the wrap address which has been activated out of the wrap addresses wy0 to wy7. The write register 16 is activated in response to the write register activating signal φRw and generates write data WD0 to WD7 at one time. Only one of the wrap addresses WY0 to WY7 is rendered active. The activated write address is successively shifted clock cycle by clock cycle.

Figure 20B:
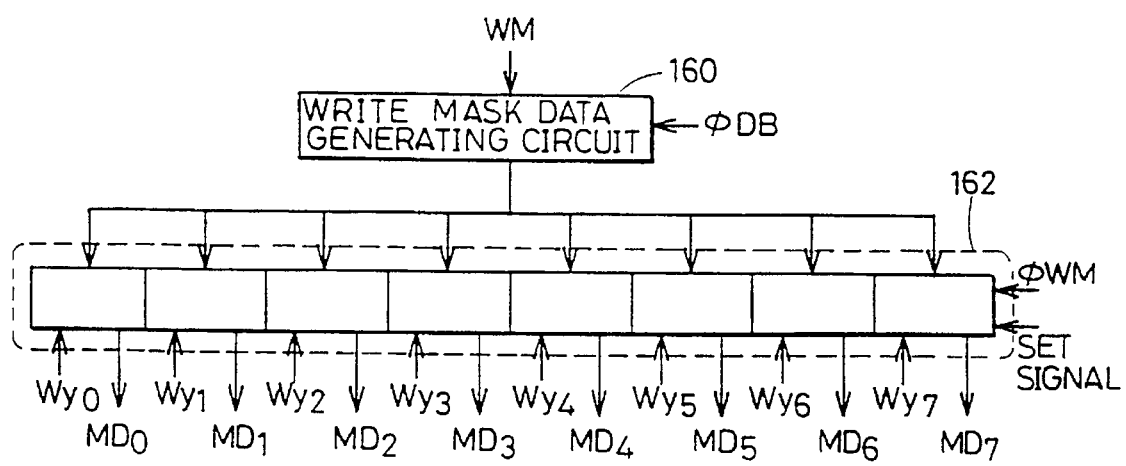

FIG. 20B shows a structure for generating the mask data. Referring to FIG. 20B, the mask data generating system includes a write mask data generating circuit 160 activated in response to the input buffer activating signal φDB for taking in the write mask designating signal WM and for generating the write mask data, and a write mask register 162 for taking in the write mask data from the write mask data generating circuit 160. The write mask register 162 includes 8 unit registers. In the write mask register 162, before the start of the writing operation, each unit register is kept at a set state by a setting signal, and the data held therein is set to "1". If the data held by the unit register is "1", writing is inhibited, while if the data held therein is "0", writing is effected.

The write mask register 162 stores the write mask data from the write mask data generating circuit 160 successively in the unit registers in accordance with the wrap addresses wy0 to wy7. The data held in the write mask register 162 are output simultaneously as mask data MD0 to MD7 in response to the write mask register activating signal φWM. The write mask register activating signal φWM is generated substantially at the same timing as the write register activating signal φRw. The mask data MD0 to MD7 held in the write mask register 162 are transmitted to the write buffer, as will be described later, to control the output of the corresponding write buffer.

Figure 20C:
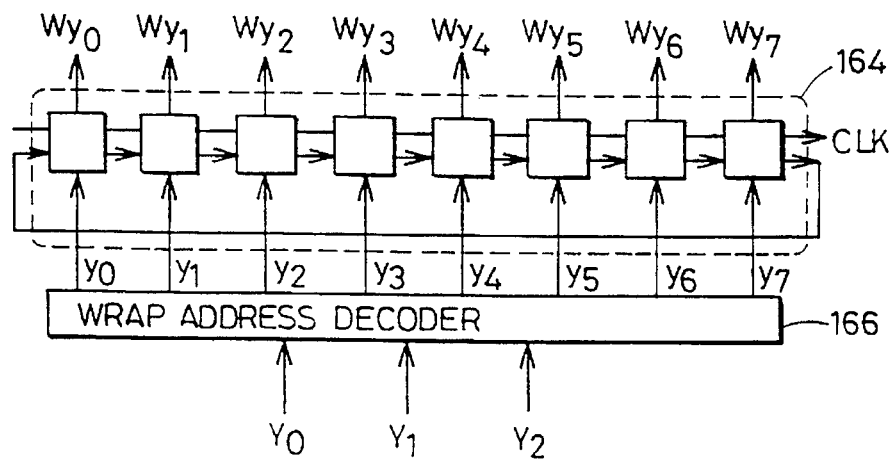

FIG. 20C shows a structure for generating the wrap addresses. Referring to FIG. 20C, the wrap address generating system includes a wrap address decoder 166 for decoding 3 bits of internal column address Y0 to Y2, and a wrap address register 164 for latching the output from the wrap address decoder 166 and for successively shifting the contents in response to the clock signal CLK. The wrap address decoder 266 decodes the three bits Y0 to Y2 of column address and sets only one of the outputs Y0 to Y7 therefrom to the selected state.

The wrap address register 164 includes 8 stages of shift registers, the outputs Y0 to Y7 from the wrap address decoder 166 are latched in the unit shift registers and are successively shifted in accordance with the clock signal CLK. From each unit shift register of the wrap address register 164, the wrap addresses wy0 to wy7 indicating the position of the memory cell to which the data is written first are generated. The wrap address register 164 is included in the register control circuit 28 in the structure shown in FIG. 1. The write mask register 162 may be included in the first control signal generating circuit 20 in the structure of FIG. 1, or it may be included in the second control signal generating circuit 22. The operation of the circuit implementing the masked write function shown in FIG. 20 will be described with reference to FIG. 21, which is a timing chart of the operation. Now, assume that the second input data d1 and the fifth input data d4 are to be masked, as shown in FIG. 19.

The wrap address decoder 166 decodes 3 bits of internal column address, Y0 to Y2, and generates wrap addresses y0 to y7. Now, when 3 bits of column address Y0 to Y2 are (Y0, Y1, Y2)=(0, 1, 0), only the output y2 from the wrap address decoder 166 is set to the selected state first. The output signal y2 is taken in in the wrap address register 164. The wrap address wy2 of the wrap address register 164 is set to the selected state. Thereafter, every time the clock signal CLK is toggled, the wrap address output from the wrap address register 164 is activated in the order of wy3→wy4→wy5→ wy6→wy7→wy0→wy1.

The external mask bit designating signal WM is generated corresponding to the input data d1 and d4. In the write mask register 162, the data held in each unit register is set to "1" in response to the write permitting signal /WE. Each unit register of the write mask register 162 stores the write mask data WM from the write mask data generating circuit 160 in accordance with the wrap address wy. Therefore, in the write mask register 162, mask data MD3 and MD6 are rendered active "1", and the remaining mask data MD2, MD4, MD5, MD7, MD0 and MD1 store the data "0" indicating the write enable state.

The write register 16 stores the data applied from the input buffer 18 in accordance with the wrap addresses wy0 to wy7. After 8 bits of data are written, the write register activating signal φRw and the write mask register activating signal φWM are activated in response to the rise of the clock signal CLK, and the data stored in the respective registers are transmitted to the write buffer in parallel. The write buffer transmits the write data WD0 to WD7 in accordance with the mask data MD0 to MD7 to the corresponding global IO line pairs GIO, as will be described in detail later.

Specific structure of each register will be described.

Figure 22:
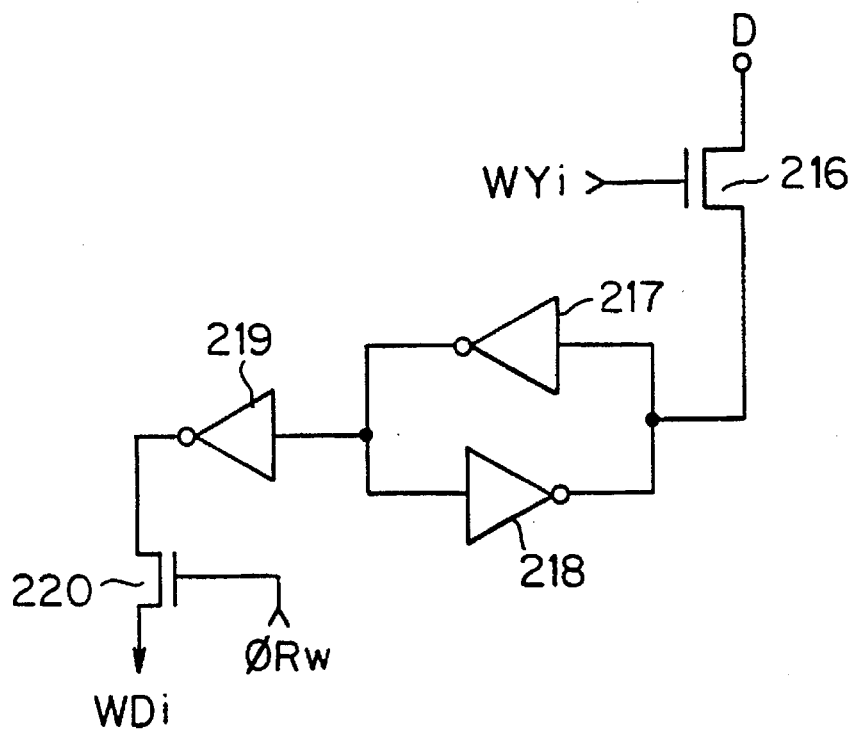
FIG. 22 shows a structure of a unit circuit of the write register shown in FIG. 20.

FIG. 22 shows a structure of a unit register of the write register 16 shown in FIG. 20. Referring to FIG. 22, the unit write register includes an n channel MOS transistor 216 for passing the write data D from the input buffer 18 in response to the wrap address wyi, inverter circuits 217 and 218 constituting an inverter latch circuit for latching the write data transmitted through the transistor 216, an inverter circuit 219 for inverting the output from the inverter latch circuit (inverter circuits 217 and 218), and an n channel MOS transistor 220 for outputting the output from the inverter circuit 219 in response to the register activating signal φRw. The output from the inverter circuit 217 is coupled to the input of the inverter circuit 218, and the output of the inverter circuit 218 is coupled to the input of the inverter circuit 217.

In operation, the unit register takes in the write data D from the input buffer 18 when the wrap address wyi is rendered active ("H") and this data D is latched by the inverter latch circuit. When the activating signal φRw is activated, the transistor 220 is rendered conductive to generate the internal write data WDi. In the structure shown in FIG. 22, the transistor 220 may be provided between the input of the inverter circuit 219 and the output of the inverter latch circuit (inverter circuits 217 and 218). A structure in which the input portion of the inverter latch circuit (input portion of the inverter circuit 217) is precharged to a prescribed potential may be employed.

Figure 23:
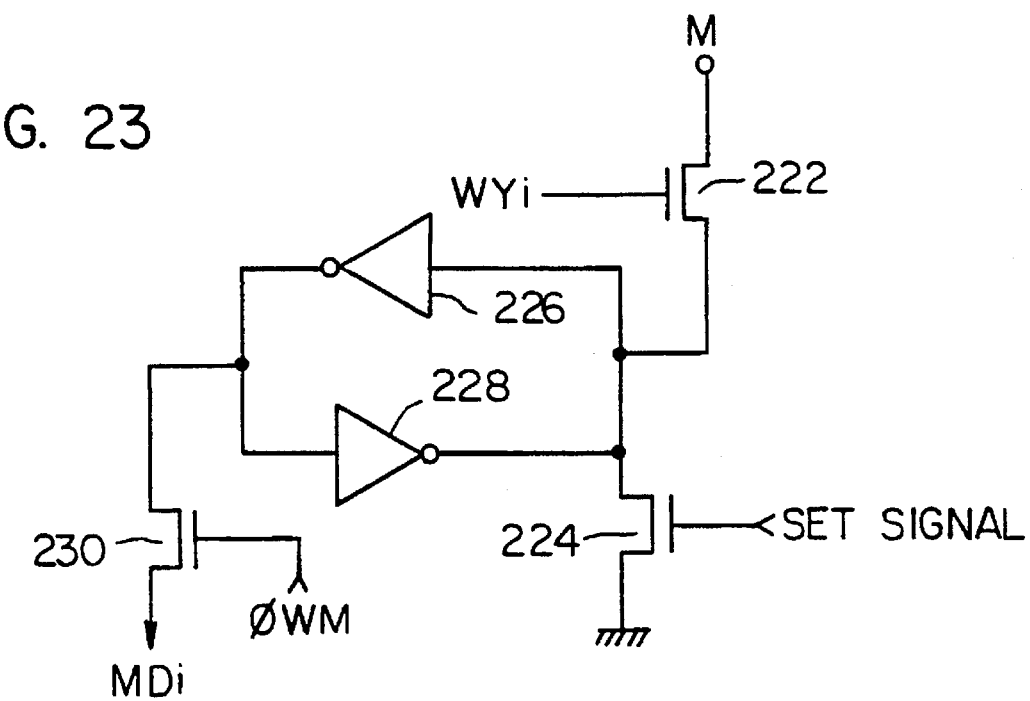
FIG. 23 shows a structure of a unit register in the write mask register shown in FIG. 20.

FIG. 23 shows a structure of a unit register of the write mask register shown in FIG. 20B. Referring to FIG. 23, the unit mask register includes an n channel MOS transistor 222 which passes the mask data M generated from the write mask data generating circuit 160 in response to the wrap address wyi, inverter circuits 226 and 228 constituting an inverter latch circuit for latching the mask data applied through the transistor 222, an n channel MOS transistor 230 responsive to the write mask register activating signal φWM for passing the output of the inverter latch circuit (output of the inverter circuit 226) to generate the mask data MDi, and an n channel MOS transistor 224 responsive to a set signal for setting the input portion of the inverter latch circuit (input of the inverter circuit 226) to the ground potential. The set signal may be generated in response to the row address strobe signal /RAS. The input portion of the inverter latch circuit should be set to the ground potential by the set signal, before the generation of the write mask data M.

In operation, first the potential of the input portion of the inverter circuit 226 is set to the ground potential by the set signal. Consequently, data "1" is initially set in the unit write mask register. Thereafter, in accordance with the wrap address wyi, the transistor 222 is rendered conductive, and the mask data M from the write mask data generating circuit 160 is applied to the input portion of the inverter circuit 226. The transistor 224 has been already off. Consequently, the mask data M is latched by the inverter circuits 226 and 228. When the write mask register activating signal φWM is activated, the transistor 230 is turned on, the output from the inverter circuit 226 is passed and the write mask designating signal MDi is generated.

Figure 24:
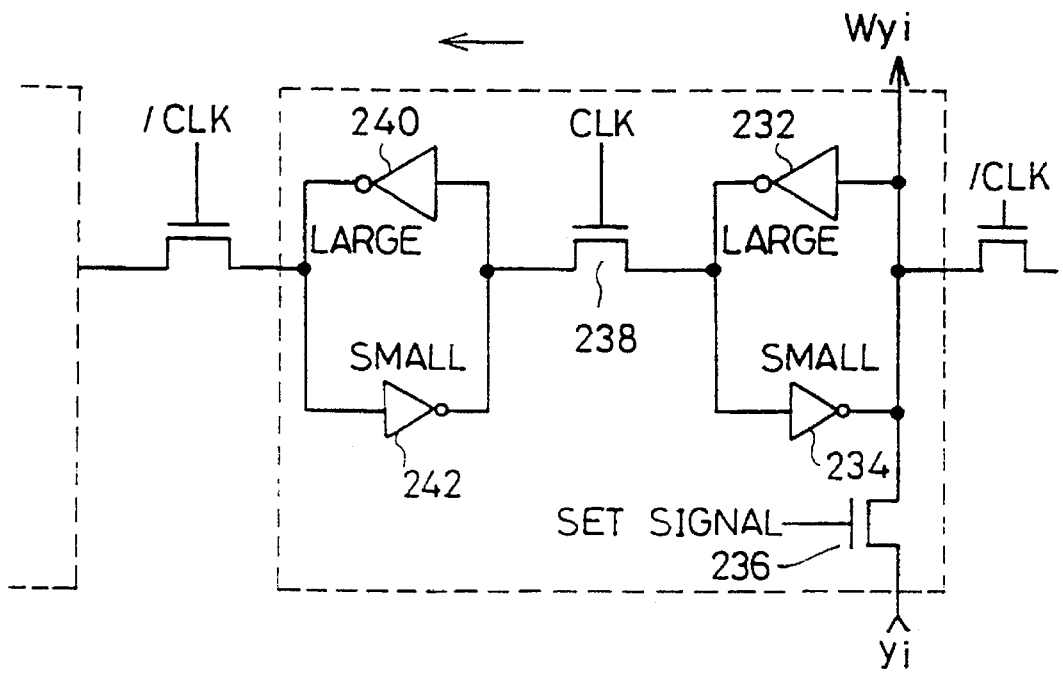
FIG. 24 shows a structure of a unit register of a wrap address register shown in FIG. 20.

FIG. 24 shows a structure of a unit register of the wrap address register 164 shown in FIG. 20. Referring to FIG. 24, the unit wrap address register includes an inverter circuit 232 having relatively large driving capability and an inverter circuit 234 having relatively small driving capability, an n channel MOS transistor 238 responsive to the clock signal CLK for transmitting the output from the inverter circuit 232, an inverter circuit 240 having relatively large driving capability for inverting the signal transmitted through the transistor 238, and an inverter circuit 242 having relatively small driving capability for inverting the output from the inverter circuit 240.

The output from the inverter circuit 232 is applied to the transistor 238 as well as to the input of the inverter circuit 234. The output from the inverter circuit 234 is applied to the input of the inverter circuit 232. The unit wrap address register further includes an n channel MOS transistor 236 responsive to the set signal for taking in the selecting signal yi generated from the wrap address decoder 166. The output from the transistor 236 is applied to the input of the inverter circuit 232 and to the output of the inverter circuit 234. The wrap address wyi is generated from the output of the inverter circuit 234.

A one-shot pulse signal generated for a prescribed time period in response to a control signal for activating the wrap address decoder 166 may be used as the set signal applied to the gate of the transistor 236. Alternatively, a one-shot pulse generated at the rising edge of the clock signal CLK in response to activation of the column address strobe signal /CAS may be used. The operation will be described.

As the set signal is activated, the transistor 236 is turned on and it takes in and latches the output yi from the wrap address decoder 166. The taken in signal yi is output as the wrap address wyi. At the time of generation of the set signal, the clock signal CLK is at "H" and the complementary clock signal /CLK is at "L". The output from the inverter circuit 232 is applied to the inverter circuit 240 through the transistor 238, and is latched by the inverter circuits 240 and 242.

Thereafter, when the clock signal CLK falls to "L" and the complementary clock signal /CLK falls to "H", the output of the inverter circuit is transmitted to the adjacent unit wrap address register, and the adjacent wrap address is rendered active. The inverter circuit 240 has relatively large driving capability, and it updates the state of latching of the inverter latch circuit provided at the input portion of the adjacent unit wrap address register, in accordance with the state of output thereof. Consequently, the wrap addresses are successively activated in response to the clock signal CLK.

In the above described wrap address generating system, neighboring columns are successively selected with the wrap address wy set first used as the initial address, and therefore the wrap addresses are uniquely generated. A structure in which the order of generated wrap addresses is programmed will be described.

Figure 25:
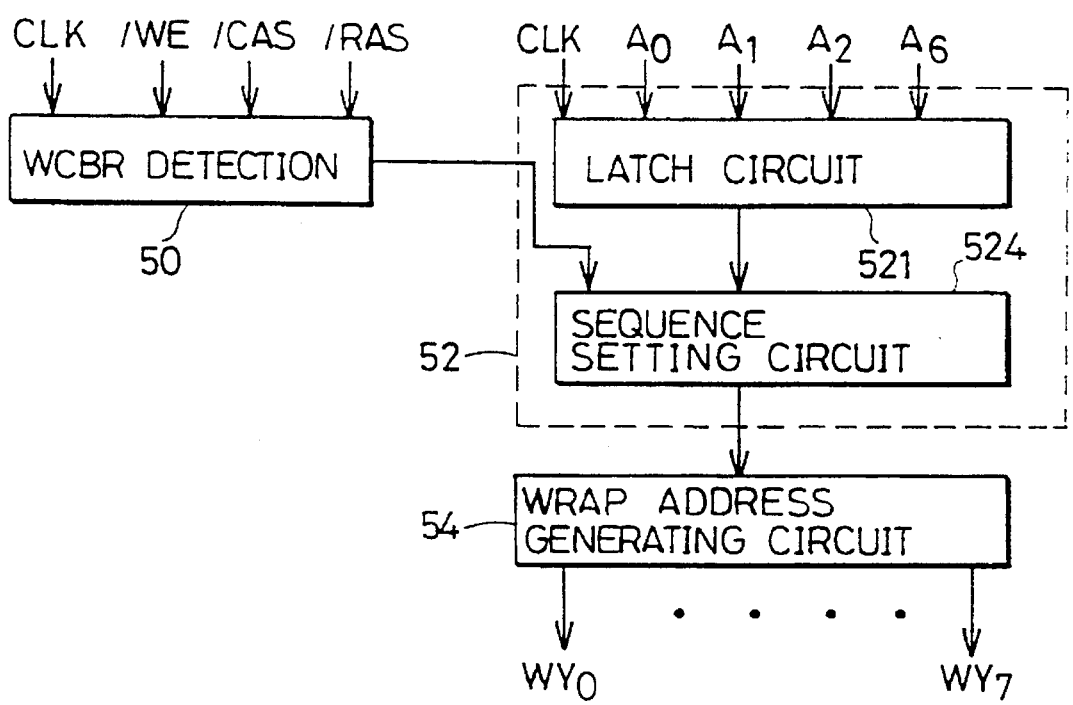
FIG. 25 shows a circuit structure for changing sequence of generated wrap addresses.

FIG. 25 shows a structure of a wrap address program circuit. Referring to FIG. 25, the wrap address program circuit includes a WCBR detecting circuit 50 for detecting a WCBR mode in which the external write permitting signal /WE and the external column address strobe signal /CAS and the external row address strobe signal /RAS are at "L" at a rising edge of the clock signal CLK, a wrap address progress setting circuit 52 for setting the manner of progress of the wrap addresses in response to the WCBR detection signal from the WCBR detecting circuit 50, and a wrap address generating circuit 54 for successively generating the wrap addresses in accordance with the output from the wrap address progress setting circuit 52.

The wrap address progress setting circuit 52 includes a latch circuit 521 for latching external address signals A0 to A2 and A6 at a rising edge of the clock signal CLK, and a sequence setting circuit 524 activated in response to the WCBR detection signal from the WCBR detecting circuit 50 for setting the sequence of wrap address progress in accordance with 4 bits of address signals latched in the latch circuit 521. The sequence setting circuit 524 sets the wrap address either to a sequence of sequential wrap address in which the wrap addresses are changed sequentially, or to an interleave wrap address sequence in which the wrap addresses are changed in the interleave manner from the initial wrap address.

The wrap address generating circuit 54 sets one of the wrap addresses wy0–wy7 to the selected state in accordance with the sequence information from the sequence setting circuit 524.

FIG. 26 shows the setting of the wrap address sequence. In the wrap address sequence of FIG. 26, the wrap length is 8. In this case, the order of generated wrap addresses is determined in accordance with 3 bits of input address A0–A2. The initial wrap address is designated by these 3 bits of address A0–A2, and the order of the wrap addresses thereafter is also determined. Whether the wrap addresses are generated in the interleave manner or sequentially is set by the address bit A6. If the wrap addresses are to be generated in the sequential order, the latch address register having the shift register structure as shown in FIG. 20C may be used. If the wrap addresses are to be generated in the interleave manner, the sequence setting circuit 524 decodes the 3 bits of address signals A0–A2 from the latch circuit 521, and sets the sequence such that the wrap addresses are generated in a desired order.

The wrap address generating circuit 54 generates the wrap addresses wy0–wy7 in accordance with the sequence set by the sequence setting circuit 524.

If the wrap address sequence is set in accordance with the WCBR condition, the wrap addresses from the wrap address decoder shown in FIG. 20 must be neglected in the following clock cycles. In that case, a structure in which one of the output from the wrap address generating circuit 54 and the output from the wrap address register 164 is selected by the output from the WCBR detecting circuit 50 may be utilized. Alternatively, a structure in which the operation of the wrap address decoder shown in FIG. 20C is inhibited when the WCBR detecting circuit 50 detects the WCBR condition, may be used. A structure in which only the sequence is set by the WCBR condition and in the following access cycles, the heading wrap address is designated by the wrap address at that time may be used.

The structure for generating the wrap addresses in the interleave manner can be easily realized by using a random logic and the like.

[Write buffer]

Figure 27:
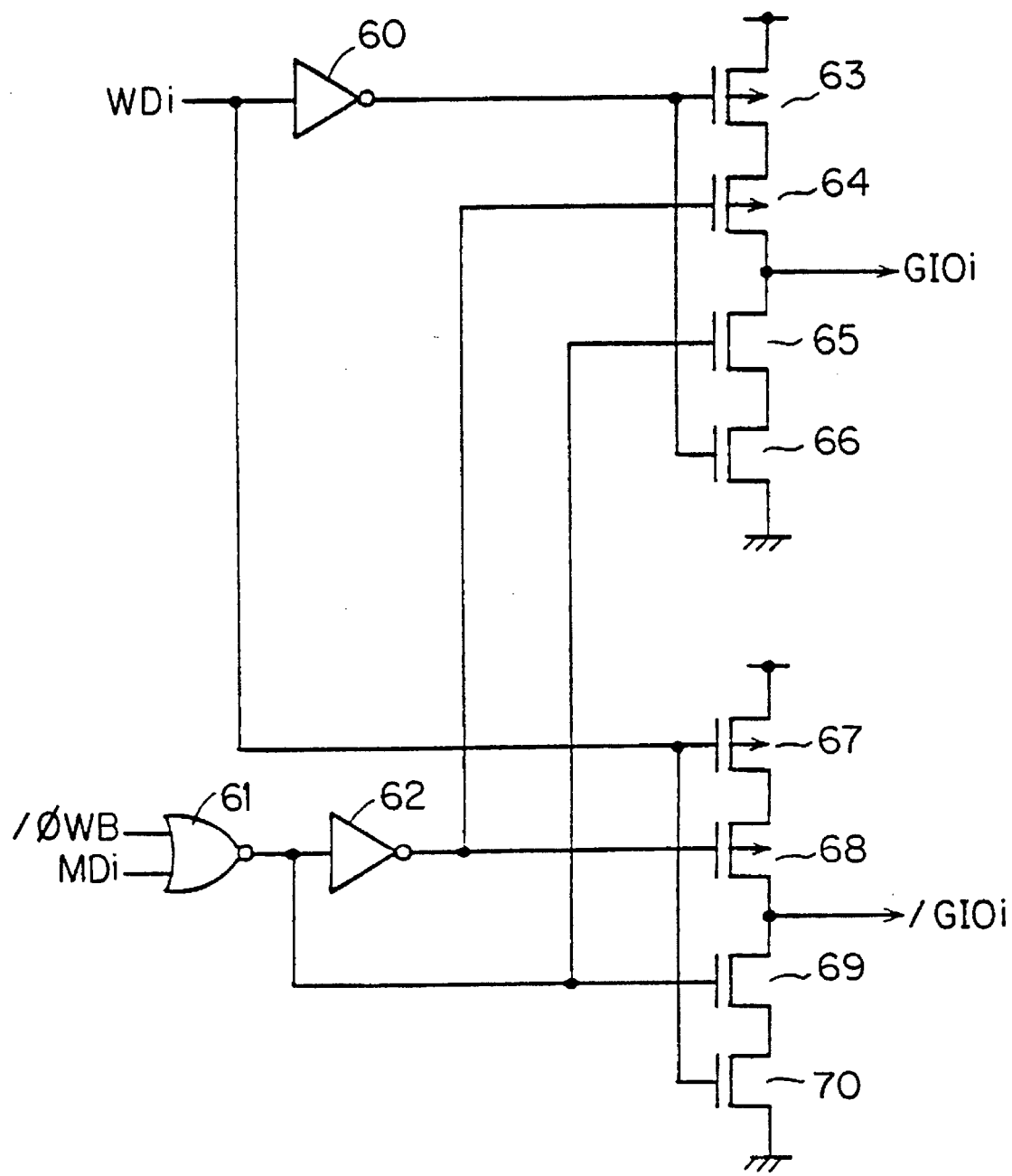
FIG. 27 shows a structure of a write buffer included in a write buffer group shown in FIG. 1.

FIG. 27 shows a structure of a write buffer. The write buffer group 14 shown in FIG. 1 includes 8 write buffers shown in FIG. 27. Referring to FIG. 27, the write buffer includes an inverter circuit receiving a write data WDi from the write register 16, a 2-input NOR circuit 61 receiving the write buffer activating signal /$\phi$WB and the mask data MDi from the write mask register 162, and an inverter circuit 62 receiving the output of the NOR circuit 61. The write buffer control signal /$\phi$WB is activated to be "L" and designates data writing.

The write buffer further includes p channel MOS transistors 63 and 64 and n channel MOS transistors 65 and 66 connected in series between the supply potential Vcc and the ground potential Vss. The gates of the transistors 63 and 66 receive the output from the inverter circuit 60. The gate of the transistor 64 receives the output from the inverter circuit 62. The output from the NOR circuit 61 is applied to the gate of the transistor 65.

The write buffer further includes p channel MOS transistors 67 and 68 and n channel MOS transistors 69 and 70 connected in series between the supply potential Vcc and the ground potential Vss. The write data WDi is applied to the gates of the transistors 67 and 70, an output from the inverter circuit 62 is applied to the gate of the transistor 68, and the output from the NOR circuit 61 is applied to the gate of the transistor 69. The connection node between the transistors 64 and 65 is connected to one global IO line GIOi of the global IO line pair GIO, and the connection node between the transistors 68 and 69 is connected to the other global IO line /GIOi. The operation will be described.

(i) Assume that the mask data MDi is at "1" ("H") indicating masking of the write data. In that case, the output of the NOR circuit 61 attains "L", while the output from the inverter circuit 62 attains "H". Consequently, transistors 64, 65, 68 and 69 are turned off, the global IO lines GIOi and /GIOi are maintained at the potentials at that time, and therefore the write data is not transmitted.

(ii) When the mask data MDi is

In this case, data is written in accordance with the write data WDi. More specifically, the output of the NOR circuit 61 attains "H" in response to the fall of the write buffer activating signal /φWB, and the output from the inverter 62 attains "L". Consequently, transistors 64, 65, 68 and 69 are rendered conductive. If the write data WDi is "1" and therefore at "H", the transistor 63 is turned on and the transistor 66 is turned off. At the same time, the transistor 67 is turned off and the transistor 70 is turned on. Consequently, the global IO line pair GIOi is charged to the level of the supply potential Vcc through the transistors 63 and 64, while the global IO line /GIOi is discharged to the ground potential Vss through the transistors 69 and 70.

If the write data WDi is at the "L" level indicating "0", the output from the inverter circuit 60 attains "H". At this time, the transistor 63 is turned off, the transistor 66 is turned on, the transistor 67 is turned on and the transistor 70 is turned off. Accordingly, the global IO line GIOi is discharged to the "L" level which is at the level of the ground potential Vss through the transistor 65 and 66, while the global IO line /GIOi is charged to "H" through the transistors 67 and 68.

By the above described structure, it becomes possible to mask only the desired data during successive writing.

[High speed successive writing operation]

In the successive writing operation shown in FIG. 19, the write buffer activating signal /φWB is generated to write data to the selected memory cells after 8 bits of data are successively applied to each data input/output terminal. In other words, data is written to the selected memory cell after 8 clock signals CLK has been counted from the fall of the write permitting signal /WE to "L". The write buffer activating signals φWB and /φWB are generated by the second control signal generating circuit 22 shown in FIG. 1. 8 bits of data are not always written successively. The operation may be finished by successive writing of 5 bits. If the wrap length is set to 8 bits and the SDRAM is fixedly set such that the internal signals are driven on the assumption of successive writing of 8 bits, then there would be an unnecessary time of 3 clocks, as there is the period in which remaining three bits of data are supposed to be written when successive writing operation of 5 bits is effected. In other words, the time necessary for writing is the same no matter whether 8 bits or 5 bits are successively written. Therefore, in the successive writing operation, it is preferable to adjust the timing for activating the write buffer, that is, the timing for transmitting write data to the memory cell, depending on the number of bits of successive writing.

Figure 28:
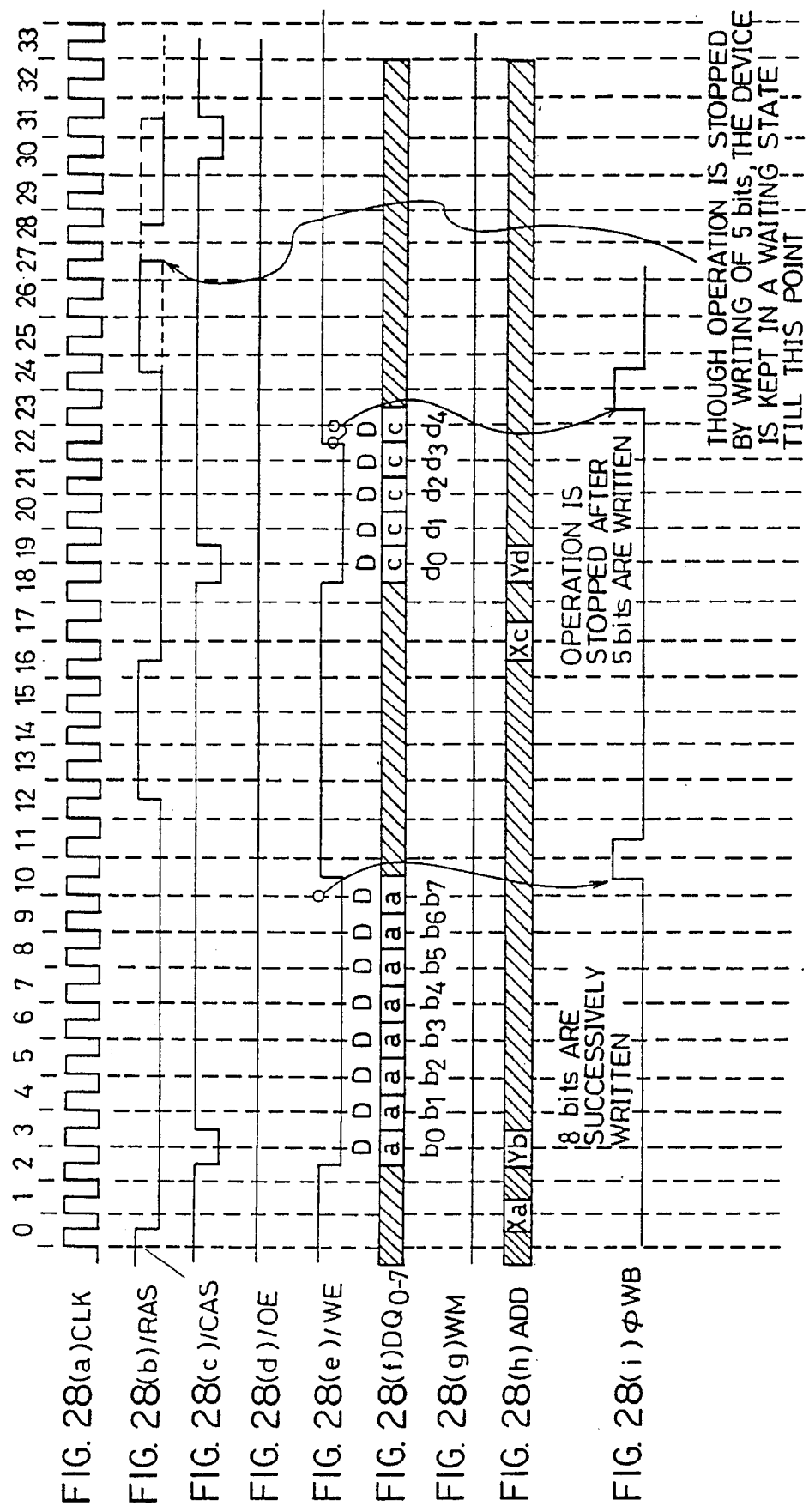
FIGS. 28(a)–(i) show signal timings in successive writing operation.

FIG. 28 is a timing chart showing the operation with the timing for transmitting write data to the selected memory cells changed corresponding to the number of bits in the successive writing operation. In the example of FIG. 28, the wrap length is assumed to be 8 bits. When all of the 8 bits of data (per one data input/output terminal) b0–b7 are no be written, the external write permitting signal (write enable signal) /WE is maintained at "L" from the clock cycle in which the external column address strobe signal /CAS is activated to the clock cycle in which the eighth bit data b7 is input. In this example, the data b7 is taken in into the internal write register in response to the rise of the eighth clock, then the write buffer activating signal φWB is generated, and write data are transferred to the global IO line pairs. The timing for generating the signal φWB at this time is determined by the counted number of clocks from the fall of the signal /WE.

When 5 bits of data are to be successively written, the write permitting signal /WE is maintained at "L" for only four clock cycles from the clock cycle in which the column address strobe signal /CAS is activated, and when the fifth data d4 is applied, the write permitting signal (write enable signal) /WE is raised to "H". At this time, the data d4 is taken in in at the rising edge of the clock signal CLK when the fifth bit data d4 is input, and completion of the successive writing operation is detected as the write enable signal /WE at this time is inactive "H". In response to this inactive state of the write enable signal /WE and to the rising edge of the next clock signal CLK, the write buffer activating signal φWB is generated. Therefore, even in the SDRAM in which the wrap length is set to 8, the write data can be transmitted to the selected memory cell at the time when fifth bit data is written in the 5 bit successive writing, resulting in high speed data writing.

Write registers of 8 bits are provided. In this example, every unit register of the mask register is set to the set state ("1") in response to the active state of the write enable signal /WE. In this case, no mask control signal WM is generated. Therefore, if data is stored in 5 bits of data registers, the mask data are set to the set state or the write inhibited state in the remaining 3 bits of write registers as the write permitting signal /WE rises to "H". Therefore, it is not necessary to wait for the passage of the time of writing three bits of data, and the clock signal at which the fifth bit data d4 is written can be used as a trigger signal to effect writing to the selected memory cells, resulting in high speed data writing.

FIG. 29 shows a structure of a write adjusting circuit for adjusting timings for writing data to the selected memory cell in the successive writing operation. Referring to FIG. 29, the timing adjusting circuit includes a counter 70 which starts its operation in response to the activation of the write permitting signal (write enable signal /WE) for counting a prescribed number of clock signals CLK, and an interruption detecting circuit 71 responsive to the write permitting signal /WE and to the clock signal CLK for detecting interruption of the successive writing when the wrap length is 8, the counter circuit 70 starts its operation when the write permitting signal /WE attains "L" and counts 8 clock signals CLK. In response to the rising edge of the eighth clock signal CLK, the write buffer activating signal φDW1 is generated. Thus the timing for writing in the successive 8 bit writing operation with the normal wrap length of 8 is determined.

The interruption detecting circuit 71 starts its operation in response to the transition of the write permitting signal /WE to the active state and counts the clock signals CLK. When the write permitting signal WE is set to the inactive "H" before it counts a prescribed number (8) of the clock signals CLK, then it generates the write control signal φDW2 in response to the rising edge of the next clock signal. The write control signal φDW2 indicates that the writing operation is interrupted at the data bit number smaller than the wrap length, in the successive writing operation.

The write control signals φDW1 and DW2 are applied to an OR gate 72. The OR gate 72 generates a write buffer activating signal φWB and applies this to a write buffer group 14. Consequently, the timing for writing data in the successive writing operation can be adjusted corresponding to the successive write data number.

FIG. 30 shows a specific structure and operation of the interruption detecting circuit 71 shown in FIG. 29. Referring to FIG. 30A, the interruption detecting circuit 71 includes a counter 711 which is activated in response to the write permitting signal /WE for counting the clock signals CLK and for generating a count up signal CUP when the number of counted clock signals CLK reaches 8, an inverter circuit 712 for inverting the count up signal CUP from the counter 711, a 3-input AND circuit 713 receiving the write permitting signal /WE, the output from the inverter circuit 712 and the clock signal CLK, and a one shot pulse generating circuit 714 responsive to the output from the AND circuit 713 for generating a one shot pulse at a prescribed timing. The operation of the interruption detecting circuit 71 will be described with reference to FIG. 30B.

When the write permitting signal /WE falls to "L", the counter circuit 711 starts its operation. In the activated state, the counter circuit 711 carries out counting operation at the rising edge of the clock signal CLK. When 8 clock signals CLK are counted, the counter 711 generates a count up signal CUP. The count up signal CUP is active when it is "H". Now, if the write permitting signal /WE rises to "H" before the fifth rising edge of the clock signal CLK, the output of the AND circuit 713 rises to "H" in response to the fifth rising of the clock signal CLK. The one shot pulse generating circuit 714 is activated in response to the output of the AND circuit 713, and it generates one shot pulse signal as the write buffer activating signal φDW2 at a prescribed timing. Consequently, when the fifth write data is written, simultaneous data transfer to the selected memory cells can be carried out.

In the structure shown in FIGS. 29 and 30A, a structure in which the counter 70 and the counter 711 are common may be used. A structure in which the output of the OR circuit 72 is applied as a trigger signal to the control signal for generating the write buffer activating signal may be used. As for the one shot pulse generating circuit 714 shown in FIG. 30A, a structure in which the write buffer activating signal φDW2 is generated in response to the fall of the fifth clock signal may be used. This is to surely activate the write buffer after the data is written in the write register.

By using the above described structure, there is no unnecessary time even if data writing is interrupted during the wrap, which enables high speed data writing.

[High speed successive writing operation 2]

The successive accessing operation includes 8 bit successive reading operation in which 8 bits are successively read, and 8 bit successive writing operation in which 8 bits are successively written. In the normal write cycle, it is impossible to determine whether the cycle is a read cycle or the write cycle at the time of fall of the external row address strobe signal /RAS. The write permitting signal /WE is set active at the substantially same timing as the column address strobe signal /CAS. Further, it is impossible to predict whether a read cycle or a write cycle is to be carried out after the write cycle. Therefore, in either of the successive reading operation or the successive writing operation, the timing for starting array activation, that is, the timing for raising the word line potential, is set such that the word line is selected at the same timing in the read cycle and in the write cycle immediately after the row address is designated.

In the 8 bit successive read cycle, the output data Q is output after 6 clocks are counted from the fall of the external row address strobe signal /RAS, as shown in the diagram of waveforms of FIG. 2. In this case, 8 bits of data (8 byte of data) have been already stored in the read registers for storing the read data. As the column address strobe signal /CAS is activated, the column selecting line CSL is immediately set to the selected state, and reading of data into the read registers is carried out. Therefore, as for the internal operation cycle, only 6 clock cycles are necessary from the fall of the internal row address strobe signal /RAS.

In the successive writing operation, it is necessary to transfer data to write to the selected memory cells, after 8 bits of data (8 bytes of data) are all stored in the write register. 8 bits of data require 8 clock cycles from the fall of the external column address strobe signal /CAS. Data writing to the memory cells is carried out thereafter. Therefore, as to the operation cycle, the time necessary until the data writing to the memory array is completed is considerably longer as compared with the reading operation. Therefore, if the structure is adapted such that the timing for array activation is set immediately after the fall of the external row address strobe signal /RAS as in the read cycle, the write cycle becomes longer than the read cycle. This problem will be described with reference to FIG. 31.

FIG. 31 shows timings of the successive writing operation when the internal array activating timings are set similar both in the read cycle and the write cycle. FIG. 31 shows operation waveforms when successive writing operation to different pages (word lines) of the same bank is carried out.

First, when the external row address strobe signal /RAS falls to "L", the row address signal Xa is decoded and a corresponding word line WL is selected. Thereafter the sense amplifiers are activated, and so on.

Then, when the external column address strobe signal /CAS falls to "L", the address signal at that time is taken in and a column address signal Yb is generated. In this state, in the read cycle, column selecting operation is carried out, the column selecting line CSL is raised in accordance with the taken in column address Yb, and the data is externally read out after a prescribed number of clocks are counted from the fall of the external row address strobe signal /RAS.

However, in the write cycle, by the fall of the write permitting signal /WE, the number of clock counts is changed, and the selecting operation of the column selecting line CSL is not carried out until all the internal write data are stored in the write registers. The column selecting line CSL is raised in response to the time when a prescribed number of clocks (for example, 8) are counted from the fall of the write permitting signal /WE or to the time when writing of successive data is completed. At this time, %he write buffer group is activated simultaneously, the write data are transmitted to the global IO line pairs, and the write data are transmitted to the bit lines pair BLP through the local IO line pairs. After the potential of the bit line pair BLP attains to the value corresponding to the write data, the word line WL is set to the non-selected state. Thereafter, precharging operation of the memory array is completed to be ready for the next word line selecting operation.

Therefore, in this case, the cycle time for one writing operation is 16 clocks, as shown in FIG. 31 (normally, 1 clock cycle corresponds to 10 ns). Meanwhile, in the successive read cycle, the read data is output to the data input /output terminal after 6 clocks are counted from the fall of the external row address strobe signal /RAS. Therefore, in the operation in the array, the write cycle becomes significantly longer, which prevents high speed successive writing. Therefore, a structure for making different the timing for starting memory array activation, that is, the timing for raising word lines in the read cycle from in the write cycle in order to carry out the read cycle and the write cycle both at high speed will be described.

FIG. 32 is a timing chart showing the operation when the successive write cycle is carried out. If it is designated to repeat successive write cycles, it is not necessary to hurriedly raise the word lines in the memory array. The word lines have only to be activated by the time when the final write data of the wrap is input. By shifting back the timing for activating the memory array when write cycles are continuously carried out, the pipeline operation in which input data is written to the write register during precharging of the memory array is enabled, which can reduce cycle time.

Designation of the write cycles being to be continuously carried out is effected by an address signal applied to a specific address input terminal under the condition of WCBR. The burst write mode is thus set. General WCBR condition is as follows. The write enable signal /WE and the column address strobe signal /CAS are set to active "L" prior to activation of the internal row address strobe signal /RAS. In the SDRAM, the signals /RAS, /CAS and /WE are all set to "L" at a rising edge of the clock signal CLK in WCBR condition. As shown in FIG. 32, when the burst write mode is set by a specific address signal, in the burst write mode setting cycle, memory arrays are activated in response to the fall of the signal /RAS. However, since the signal /CAS is not activated again, the column address is not taken in, and thus column selecting operation is not carried out. What is done is only the re-writing operation (refreshing operation of the memory cells connected to the selected word line). The timing of rise of the word line WL at this time is the same as that in the read cycle.

When the burst write mode is set, data writing is carried out from the next cycle. In this case, the word line WL is raised after the lapse of, for example, 7 clock cycles from the fall of the signal /RAS. At this time, the final data of the wrap has not yet been written in the write register. When the final data d7 is written, the potential of the bit line pair BLP has been established in the memory array, the column selecting line CSL is set to the selected state, and the write data transmitted to the global IO line pair GIO is written to the selected memory cell. In the precharge cycle in which memory arrays enter the precharge state after data writing is carried out in the internal memory cell array, the write data of the next cycle are successively written to the write registers.

As is apparent from the comparison with the timing chart of FIG. 31 showing the continuous write cycle, the cycle time can be reduced to enable high speed data writing by retarding the timing for activating the internal array in the burst write mode. By carrying out such pipeline operation in which data is written to the write registers during the precharge period of the memory array, the cycle time can be significantly reduced.

Figure 33:
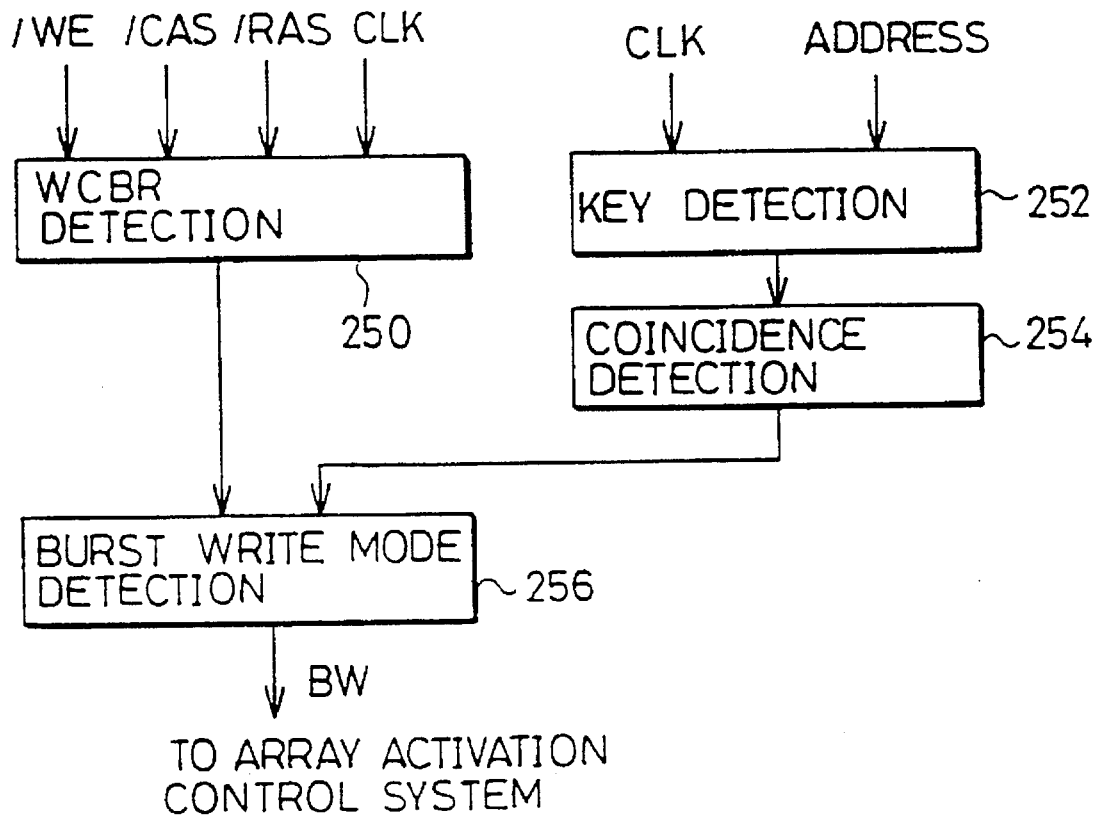
FIG. 33 shows a circuit structure for realizing the operation timing shown in FIG. 32.

FIG. 33 shows a structure for detecting the burst write mode. Referring to FIG. 33, the burst write mode detecting system includes a WCBR detecting circuit 250 responsive to the external control signals /WE, /CAS and /RAS and to the external clock signal CLK for detecting the WCBR mode, a key detecting circuit 252 responsive to the clock signal CLK for taking in a prescribed address bit for detecting an address key, a coincidence detecting circuit 254 for determining whether or not the address key detected by the key detecting circuit 252 matches a predetermined address key, and a burst write mode detecting circuit 256 responsive to the WCBR detecting signal from the WCBR detecting circuit 250 and to the coincidence detecting signal from the coincidence detecting circuit 254 for detecting setting of the burst write mode. The burst write mode detecting signal BW from the burst write mode detecting circuit 256 is applied to an array activation control system. The array activation control system is included in the second control signal generating circuit 22 in the functional structure of FIG. 1.

The second control signal generating circuit 22 (see FIG. 1) counts the clock signals CLK and generates various internal control signals in accordance with the number of counted clocks. In response to the burst write mode detecting signal BW, the number of clock counts for generating the internal control signals is increased. Both in the read cycle and the write cycle, the timing of transition from the inactivation to the activation state of a memory array is determined by the fall of the internal row address strobe signal /RAS. After counting a prescribed number of clocks from the fall of the external row address strobe signal /RAS, precharging of the memory array is released. In the burst write cycle, the timing for starting the operation of circuits related to RAS is delayed, and the timing for activating the write buffer is set similar to that in the normal write cycle. If the wrap length is 8, transmission of the write data to the selected memory cells is carried out after 8 bits of successive data has been written.

Figure 34:
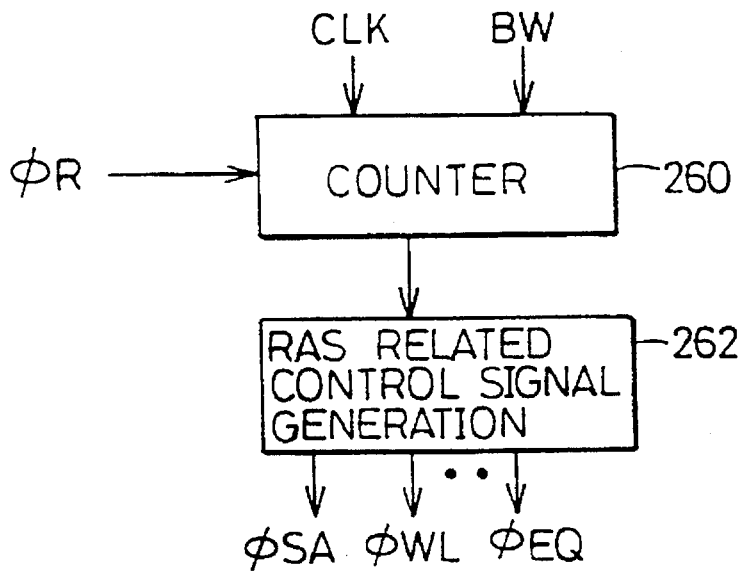
FIG. 34 shows a circuit structure for shifting the timing for starting array activation in the continuous writing operation.

FIG. 34 shows a structure for delaying the timing for starting memory array activation. The array activation start timing adjusting circuit utilizes the internal RAS control signal φR generated from the first control signal generating circuit 20 shown in FIG. 1.

Referring to FIG. 34, the circuit for adjusting timing of starting memory array activation includes a counter 260 activated in response to the internal RAS control signal φR generated from the first control signal generating circuit 20 shown in FIG. 1 for counting a prescribed number of clocks and for generating a count up signal at every prescribed clock number, and a RAS related control signal generating circuit 262 responsive to the prescribed count up signal from the counter 260 for generating RAS control signals such as the sense amplifier activating signal φSA, the word line driving signal φWL and the bit line recharge signal φEQ. A signal for delaying the timing for decoding the X decoder group (2: see FIG. 1) may be generated from the RAS control signal generating circuit 262.

The counter 260 increases the number of clocks to be counted when the burst write detecting signal BW is applied, so as to delay the timing for generating the count up signal for the RAS circuitry. Thus it becomes possible to retard the timing of starting memory array activation in the burst write mode. The same applies to the CAS circuitry, and column selection is delayed.

[Structure of the buffer circuit]

In the SDRAM, external control signals are taken in response to the clock signal CLK and internal signals are generated. The structure of the buffer circuit containing such latch function will be described.

FIG. 35 has the structure of a dynamic latch used in an address buffer and in a /RAS buffer for latching the row address strobe signal. The buffer circuit shown in FIG. 35 shows the structure of a latch circuit. The dynamic latch includes a p channel MOS transistor 301 rendered conductive in response to a latch enable signal φLE for connecting the supply potential Vcc to the output node /OU, a p channel MOS transistor 302 responsive to the potential of the output node OU for connecting the supply potential Vcc to the output node /OU, an n channel MOS transistor 305 responsive to an input signal IN for connecting a complementary output node /OU to a node 310, an n channel MOS transistor 306 responsive to the potential of the output node OU for connecting the complementary output node /OU to the node 310, a p channel MOS transistor 303 responsive to the potential of the complementary output node /OU for transmitting the supply potential Vcc to the output node OU, a p channel MOS transistor 304 responsive to the latch enable signal φLE for connecting the supply potential Vcc to the output node OU, an n channel MOS transistor 308 receiving a reference potential Vref at its gate for connecting the output node OU to the node 310, an n channel MOS transistor 307 responsive to the signal potential of the complementary output node /OU for connecting the output node OU to the node 310, and an n channel MOS transistor 309 responsive to the latch enable signal φLE for connecting the node 310 to the ground potential Vss.

The dynamic latch compares the potential level of the input signal IN with the reference potential Vref and generates an output signal to the output node OU and /OU in response to the result of comparison. The reference potential Vref is a reference potential for the input signal IN and it is set to about 1.6V if TTL (transistor transistor logic) interface is used. The operation of the dynamic latch shown in FIG. 35 will be described with reference to FIG. 36 which is the diagram of signal waveforms.

When the latch enable signal φLE is at "L", the transistors 301 and 304 are conductive and the transistor 309 is off. Thus the output nodes OU and /OU are charged from the supply potential Vcc to attain "H" level. This period corresponds to the output precharge period.

When the latch enable signal φLE attains "H", transistors 301 and 304 are turned off and transistor 309 is turned on. The dynamic latch is activated and the input signal IN is compared with the reference potential Vref. If the level of the input signal IN is lower than the reference potential Vref, more current flows through the transistor 308 than transistor 305, and the output node OU attains "L". Meanwhile, the transistor 302 is turned on and the output node /OU maintains the "H" level.

If the input signal IN is higher than the reference potential Vref, then the potential of the complementary output node /OU attains "L" and the output node OU is charged by the transistor 303 to attain "H". In this state, even if the potential level of the input signal IN changes, the current driving capability of the transistors 305 and 308 is smaller than that of the transistors 302 and 303, so that the state thereof is latched and not changed.

If the latch enable signal φLE is at "H" and the input signal IN rises from "L" to "H", more current flows through the transistor 305 than through the transistor 308. In this case, since the current driving capability of the transistor 305 is small as mentioned above, the latched state is not changed. More specifically, since the output node OU is at "L" and the transistor 302 is on, the complementary output node /OU is kept at the "H" state.

Assume that the input signal IN falls from "H" to "L" after the latch enable signal φLE rises to "H" and the state of latching is determined. In this case, the transistor 305 is turned off, the transistor 306 is turned on, and the transistors 301 and 302 are off. Therefore, the complementary output node /OU is kept at "L". Since the transistor 303 is on and the transistor 307 is off, current is supplied from the supply potential Vcc to the output node OU, and therefore the node OU is maintained at "H".

As described above, the dynamic latch repeats alternately the precharge state and the output signal established state in accordance with the latch enable signal φLE. If the dynamic latch shown in FIG. 35 is used as the buffer of the SDRAM, the clock signal CLK is used as the latch enable signal φLE.

Figure 37:
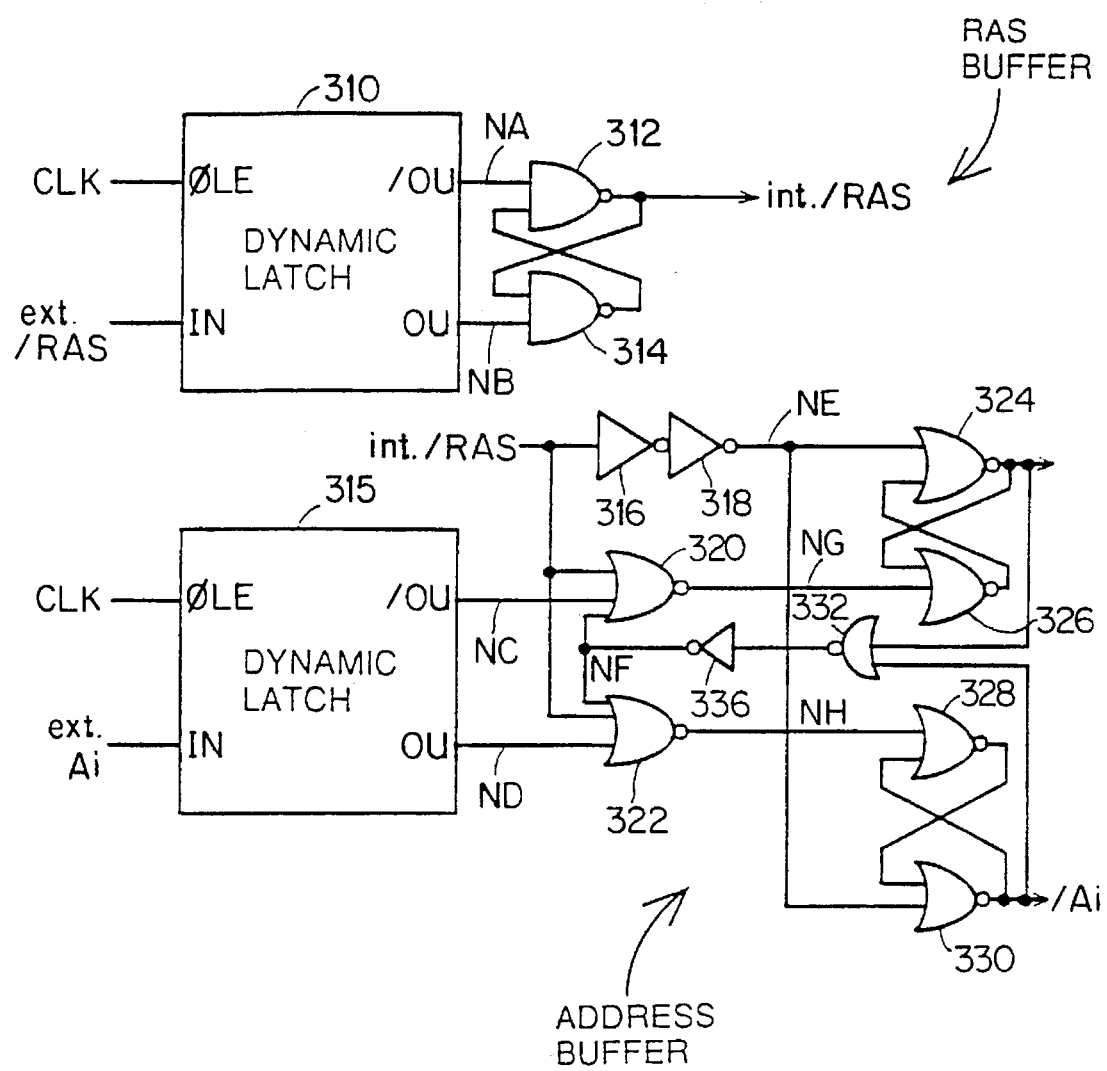
FIG. 37 shows a structure of a buffer for taking in an external row address strobe signal and an external address signal bit.

FIG. 37 shows structures of the /RAS buffer and an address buffer using the dynamic latch.

Referring to FIG. 37, the /RAS buffer includes a dynamic latch 310 receiving the clock signal CLK at a latch enable input φLE and the external row address strobe signal ext./RAS at an input node IN, and an NAND type flipflop coupled to the output nodes OU and /OU of the latch 310. The NAND type flipflop includes an NAND circuit 312 having one input coupled to the output node /OU of the dynamic latch 310, and an NAND circuit 314 having one input connected to the output node OU of the dynamic latch 310 and the other input connected to the output node of the NAND circuit 312. The NAND circuit 312 has the other input connected to the output of the NAND circuit 314. The internal control signal int./RAS is generated from the NAND circuit 312. The internal control signal int./RAS includes internal control signals φxa and φR in the structure shown in FIG. 1.

The address buffer includes a dynamic latch 315 receiving the clock signal CLK at a latch enable input φLE and the external address bit ext. Ai at its input IN, and two stages of cascade connected inverters 316 and 318 receiving the internal control signal int./RAS. Inverter circuits 316 and 318 function as a delay circuit. The address buffer further includes an NOR circuit 320 receiving the internal control signal int./RAS and the output from the output node /OU of the dynamic latch 315, and an NOR circuit 322 receiving the internal control signal int./RAS and the output from the output node OU of the dynamic latch 315. The NOR circuits 320 and 322 also receive the output of the inverter circuit 336, as will be described later.

The address buffer further includes an NOR type flipflop receiving the outputs from the inverter circuit 318 and from the NOR circuit 320. The NOR flipflop includes an NOR circuit 324 receiving at its one input the output from the inverter circuit 318, and an NOR circuit 326 receiving the outputs from the NOR circuits 320 and 324. The output of the NOR circuit 326 is coupled to the input of the NOR circuit 324. An internal address bit Ai is generated from the NOR circuit 324.

The address buffer further includes an NOR circuit 328 receiving an output from the NOR circuit 322, an NOR circuit 330 receiving the output from the inverter circuit 318 and the output from the NOR circuit 328, an NOR circuit 332 receiving the outputs from the NOR circuits 324 and 330, and an inverter circuit 336 receiving the output from the NOR circuit 332. The output from the NOR circuit 328 is coupled to the input of the NOR circuit 330, and the output of the NOR circuit 330 is also coupled to the input of the NOR circuit 328. The internal address bit /Ai is generated from the output of the NOR circuit 330. The operation will be described with reference to FIG. 38 which is a diagram of signal waveforms.

The dynamic latch 310 takes in the external row address strobe signal ext./RAS at the rising edge of the clock signal CLK and makes the output node OU fall to "L". As the dynamic latch 310 is operating dynamically, the output nodes OU and /OU both attain "H" when the clock signal CLK attains "L". When the node NA attains "H" and the node NB attains "L" in response to the fall of the external row address strobe signal ext./RAS, the internal control signal int./RAS which is the output of the NAND circuit 312 falls to "L".

Generally, the NAND circuit generates a signal at "L" only when the inputs thereof are both "H". When the internal control signal int./RAS once falls to "L", the output of the NAND circuit 314 is normally "H", and even if the nodes NB and NA are both precharged to "H", the outputs from the NAND circuits 312 and 314 are normally "L" and "H", respectively. The period in which the internal control signal int./RAS is at "L" corresponds to the clock cycle period in which the external control signal ext./RAS is at "L". The internal control signal int./RAS is applied to the address buffer.

The dynamic latch 315 takes in the external address signal bit ext. Ai in response to the clock signal CLK and outputs a signal corresponding to the state thereof. While the internal control signal int./RAS is at "H", the potential at the node NE is at "H", and therefore the internal address signal bits Ai and /Ai are both set to "L".

When the internal control signal int./RAS falls to "L", the NOR circuits 320 and 322 function as an inverter. At the initial state, the output from the inverter circuit 336 is at "L", and the internal control signal int./RAS is transmitted to the node NE with a delay. Therefore, when the potential at the node NE is at "H", the internal address bits Ai and /Ai are still at the initial state of "L". When the potential of the node NE falls to "L", the potential levels of the internal address signal bits Ai and /Ai attain the values corresponding to the potentials at the nodes NG and NH.

when the potential levels at the internal address signal bits Ai and /Ai are established, one of the address signal bits Ai and /Ai is at "H", the output of the NOR circuit 332 attains "L" and the output from the inverter circuit 336 rises to "H". Consequently, the outputs of the NOR circuits 320 and 322 are fixed at "L", and the address signal bits Ai and /Ai are maintained in the latched state. In this state, even if the dynamic latch 315 carries out dynamic operation, the change in the potential due to dynamic operation does not influence the internal address signal bits Ai and /Ai at all.

As described above, even the address buffer is formed by the dynamic latch receiving the clock signal CLK from the following reason. Namely, since the address setup time is quite short, it may be possible that when the external address signal bit ext. Ai is taken in response to the internal control signal int./RAS, the external address signal bit ext. Ai has already been invalid when the internal control signal int./RAS falls to "L" and is established. As shown in FIG. 37, by taking in the address signal bit ext. Ai by the clock signal CLK and then by latching this by the internal control signal int./RAS, the external address signal bit ext. Ai can be surely taken in to generate the internal address.

In a 16M bit SDRAM, twelve address buffers (row address buffers) are provided (the address bits are 12 bits of A0 to A11). The address buffer related to the column address is driven in accordance with the column address strobe signal ext./CAS after the internal control signal int./RAS is activated. In this case, it is not necessary to drive the column address buffer itself in accordance with the clock signal CLK. However, if such 12 address buffers are driven in every clock cycle by the clock signals CLK, there would be much precharge current flow as the dynamic operation is being carried out, which leads to larger power consumption in the address buffer. Therefore, in such field of application that requires low power consumption, measures to solve this problem is necessary. A structure for further reducing current consumption will be described.

Figure 39A:
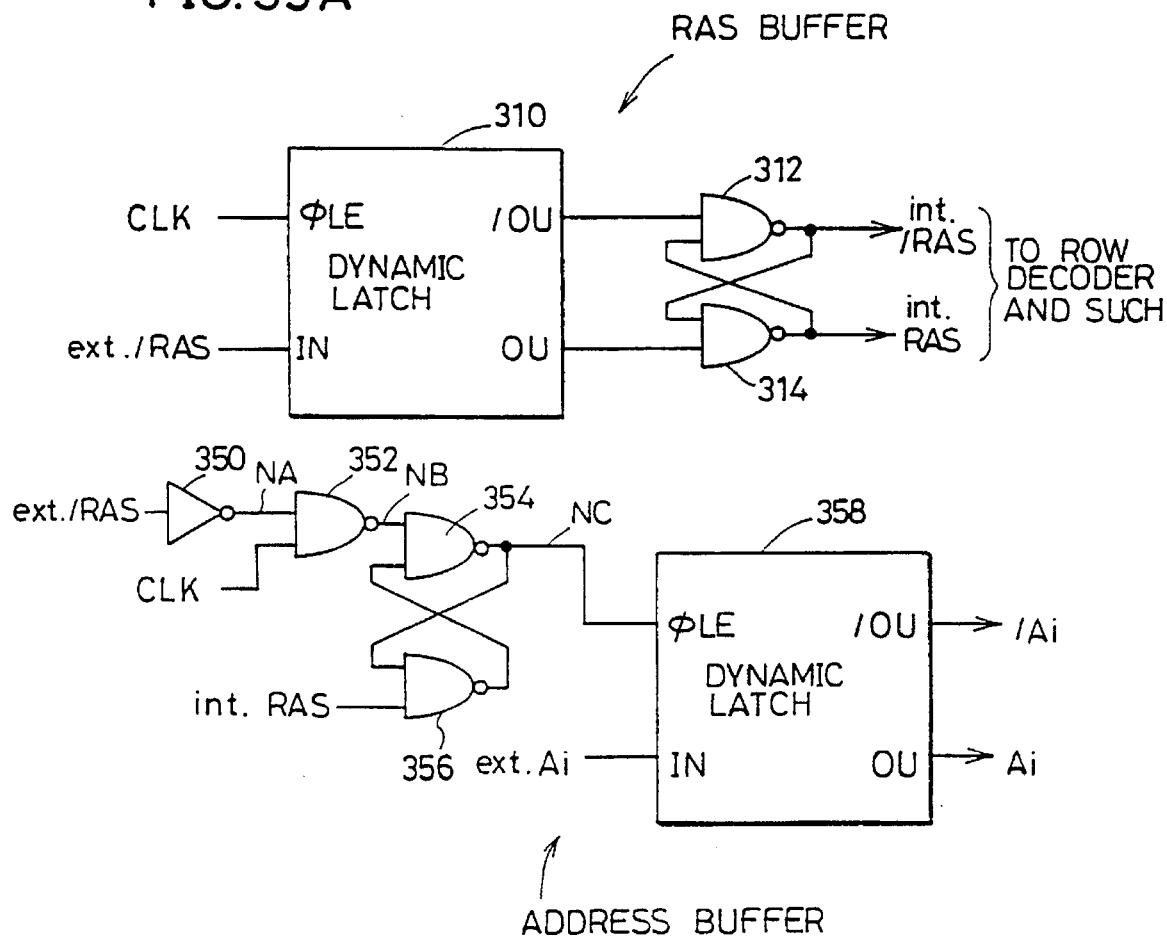
FIGS. 39A–B show another example of the structure of the buffer for taking the row address strobe signal and of the buffer for taking in the address signal.
Figure 39B:
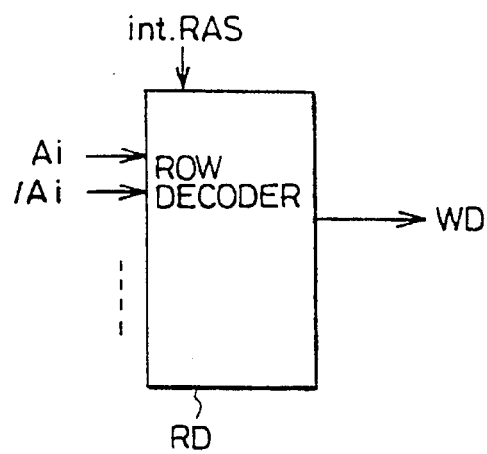

FIG. 39A shows another example of the structures of the RAS buffer and the address buffer. Referring to FIG. 39A, the structure of the /RAS buffer is the same as that shown in FIG. 37, and corresponding portions are denoted by the same reference characters. As shown in FIG. 39B, the output signal int./RAS from the /RAS buffer is applied to the row decoder RD to determine the decoding timing thereof.

The address buffer includes an inverter circuit 350 receiving the external address signal ext./RAS, an NAND circuit 352 receiving the output from the inverter circuit 350 and the clock signal CLK, an NAND circuit 354 receiving at its one input the output from the NAND circuit 352, an NAND circuit 356 receiving the internal control signal int./RAS from the RAS buffer, and a dynamic latch 358 receiving at latch enable input node φLE the output from the NAND circuit 354 and at an input IN the external address signal bit ext. Ai.

The internal address signal bits Ai and /Ai are generated from the dynamic latch 358. The NAND circuits 354 and 356 form a flipflop, the output of the NAND circuit 354 is applied to the other input of the NAND circuit 356, and the output of the NAND circuit 356 is applied to the other input of the NAND circuit 354. The operation of the /RAS buffer and the address buffer shown in FIG. 39 will be described with reference to FIG. 40 which is a diagram of signal waveforms.

The operation of the /RAS buffer is the same as that shown in FIG. 37, and therefore description is not repeated. When the external row address strobe signal ext./RAS falls to "L", the output of the inverter circuit 350 rises to "H" (node NA). In response, the potential at the output node NB of the NAND circuit 352 attains to "H" and "L" repeatedly corresponding to the clock signals CLK. The potential at the node NB is kept at "H" until the clock signal CLK rises to "H". When the potential at the node NB falls to "L", the output of the NAND circuit 354 rises to "H" (node NC). By this potential of the node NC, the dynamic latch 358 takes in the address signal bit ext.Ai applied at that time and generates internal address signal bits Ai and /Ai. After the node NC rises to "H", the internal control signal int.RAS rises to "H".

The internal control signal int. RAS is not generated until the external control signal ext./RAS is taken in at the rising edge of the clock signal CLK in the dynamic latch 310 and the output state thereof is established by the flipflop (formed by the NAND circuits 312 and 314). Therefore, the internal control signal int.RAS rises to "H" only after the potential of the node NC has risen to "H". When the internal control signal int.RAS rises to "H", both inputs of the NAND circuit 356 attains "H" resulting in an output of "L", and the potential of the node NC is fixed at "H". This state is maintained while the internal control signal int.RAS is at "H". Therefore, the clock signal CLK is not transmitted to the dynamic latch 358, but the address signal bits Ai and /Ai taken in at the first rising edge of the node NC are continuously output. When the signal ext./RAS is at "H", the node NC is at "L", and the latch 358 is at the precharged state regardless of the clock signal CLK.

As described above, by raising the potential of the node NC to "H" before the internal control signal int.RAS and by taking in the external control address signal bit ext. Ai based on this signal (at node NC), the dynamic latch 358 does not carry out any dynamic operation even if a clock signal CLK is applied, and in addition, the external address signal bit ext. Ai can be surely taken in at the rising edge of the clock signal CLK. Consequently, an address buffer which can surely generate valid internal address signal bit with low power consumption can be realized.

[Frequency-Latency]

In the SDRAM, the timing of outputting read data is determined by the number of toggles of the clock signal CLK. The relation between the toggle number of clocks and the timing of output of the read data is referred to as latency. If the frequency of the clock signal CLK is 100MHz, for example, valid data is output at the seventh clock cycle counted from the cycle in which the external row address strobe signal /RAS falls.

However, if this SDRAM is used in a system in which the frequency of the clock signal CLK is 50MHz, and if the read data is to be output after 6 clock counts from the fall of the external row address strobe signal /RAS as in the above example, the access time would be 120 nano seconds, and the feature of the SDRAM, which is high speed operation, can not be effectively exhibited. A structure which fully brings out the feature of the SDRAM, that is, high speed operation even if the clock frequency is changed will be described.

FIG. 41 shows the relation between the frequency and the latency in the SDRAM in accordance with the present invention. The latency is determined by the combination of the address bits A4 and A5. The latency set cycle is executed under the condition of WCBR. If the clock frequency is 100MHz, the RAS access time tRAS is set to 6 clock cycles, the CAS access time tCAC is set to 4 clock cycles, the RAS precharge cycle time is set to 4 clock cycles, and the RAS-CAS delay time tRCD is set to 2 clock cycles at least. As the frequency of the clock signal CLK becomes smaller, the number of clock cycles required by these access times and precharge time are made smaller.

FIG. 42 is a diagram for explaining the RAS access time, CAS access time, the RAS precharge time and RAS-CAS delay time tRCD.

The RAS access time tRAC is the time necessary from the fall of the external row address strobe signal /RAS to "L" until valid data is output (in the SDRAM, these are all indicated by the clock cycle number).

The CAS access time is the time necessary from the fall of the column address strobe signal /CAS to "L" until valid data is output. The RAS precharge time is the time necessary for precharging the memory arrays and for necessitatedly maintaining the signal /RAS at "H". The RAS-CAS delay time tRCD is the time required for surely separating and setting to the established state the row address signal and the column address signal which are applied in multiplexed manner. The time tRCD is the time necessary from the fall of the external address strobe signal /RAS until the column address strobe signal /CAS is lowered to "L". A structure for changing the latency corresponding to the clock frequency will be described with reference to FIG. 43.

Figures 43, 44:
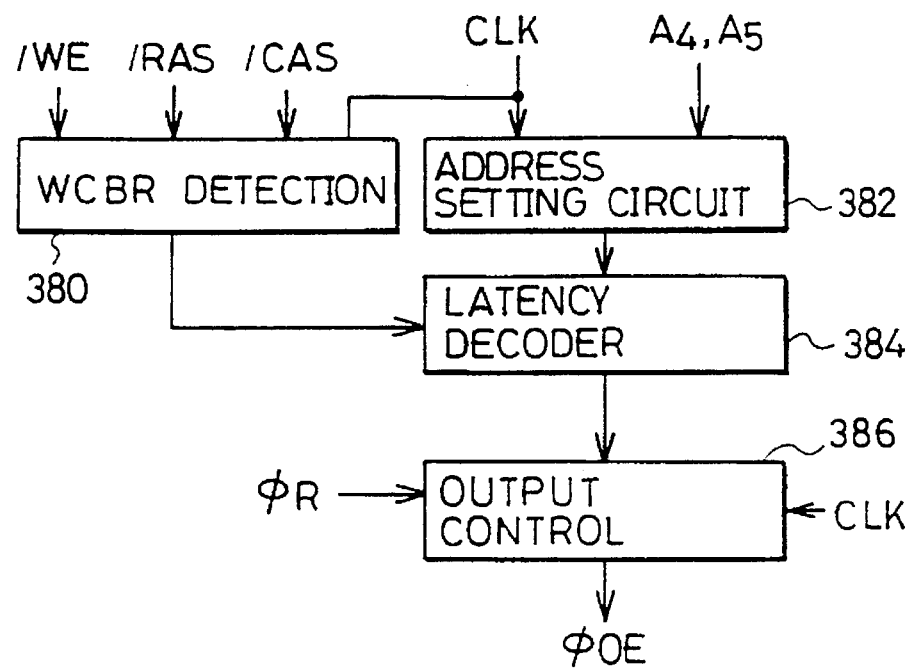
FIG. 43 shows a circuit structure for changing the latency.
FIG. 44 shows correspondence between the wrap length and the data for setting the wrap length, when the wrap length is programmed.

Referring to FIG. 43, the latency changing circuit includes a WCBR detecting circuit 380 for detecting the condition of WCBR, an address set circuit 382 responsive to the clock signal CLK for taking in the address signal bits A4 and A5, a latency decoder 384 activated in response to the output from the WCBR detecting circuit 380 for decoding the address bits latched in the address set circuit 382 to detect the latency, and an output control circuit 386 responsive to a latency setting signal from the latency decoder 384 for adjusting the timing of data output.

The output control circuit 386 is responsive to the internal control signal φR (or int.RAS) from the first control signal generating circuit 20 shown in FIG. 1 to count a prescribed number of clock signals CLK and generates an output buffer control signal φOE. The number of clocks to be counted by the output control circuit 386 is adjusted in accordance with the latency setting signal from the latency decoder 384.

As for the address set circuit 382, a structure in which the internal address bits A4 and A5 from the address buffer are latched in response to the WCBR detecting signal from the WCBR detecting circuit 380 may be used. In this case, when the latency is changed, and the timing of data output is adjusted in accordance with the count number of the clocks, and if the timing of raising the word lines is determined in response to the internal control signal φR, it is not so necessary to apply the output of the latency decoder 384 to the RAS control system and to the CAS control system. If the timing of activating the sense amplifiers and the timing for generating the column selecting signal and so on are set in accordance with the number of clock counts, the timing for activating the sense amplifiers and the timing for generating the column selecting signal are adjusted corresponding to the latency setting signal from the latency decoder 384. In this case also, what is changed is only the number of clocks to be counted.

As described above, by adjusting the timing of data output in accordance with the frequency of the clock signal CLK, the performance of the SDRAM can be fully exhibited regardless of the frequency of the clock signal CLK.

[Change of Wrap Length]

In the above description, the wrap length has been set to 8. However, the number of data to be successively written in one access cycle may be variable. In a standard DRAM, for example, there are various modes such as nibble mode, page mode and static column mode. Except in the nibble mode, the number of data to be successively written or successively read can be easily changed. Therefore, a structure allowing change of the wrap length in the SDRAM is also provided.

FIG. 44 shows, in a table, methods of programming the wrap length. The wrap length is determined by setting an address key under the WCBR condition. 3 bits of address signals A0, A1 and A2 are used as the address key, for example. 4, 8, 16, and 32 bits and an entire page (one row) are available as the unit of the wrap length.

Figure 45:
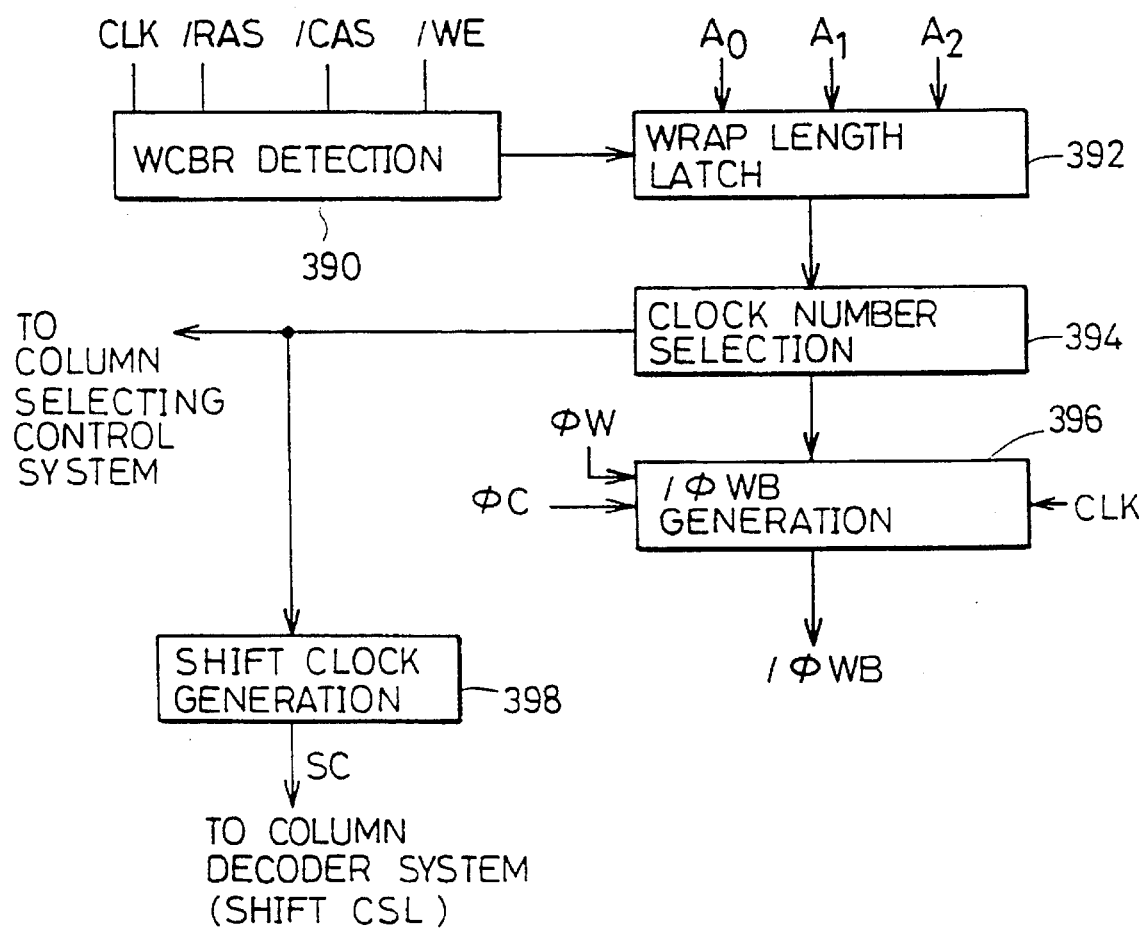
FIG. 45 shows a circuit structure for generating a signal for controlling column selecting system when the wrap length is changed.

FIG. 45 shows structure of the wrap length setting control system. Referring to FIG. 45, the wrap length setting control system includes an WCBR detecting circuit 390 detecting the condition of WCBR, a wrap length latch circuit 392 responsive to the output from the WCBR detecting circuit 390 for latching the internal address bits A0, A1 and A2 generated from the address buffer, a clock number selecting circuit 394 for selecting the number of clocks indicating the wrap length in accordance with the data latched in the wrap length latch circuit 392, and a /φWB generating circuit 396 for counting the clock signals CLK for generating the write buffer activating signal /φWB in accordance with the information of clock number from the clock number selecting circuit 394.

The /φWB generating circuit 396 is activated in response to the internal CAS system control signal φC (generated in synchronization with the signal /CAS), and after a prescribed number of clocks are counted, the circuit 396 generates the write register activating signal /φWB. Although a structure for writing data only is shown in FIG. 45, data reading is carried out in the similar manner, and a circuit for generating the read register activating signal err for reading is controlled by the output from the clock number selecting circuit 394. The /φRB generating circuit 396 generates the write register activating signal /φWB in response to the internal write permitting signal φW and to the internal CAS system control signal φC. A /φRr generating circuit (not shown) generates the read register control signal in response to the internal RAS control signal φR.

The output buffer and the input buffer may be kept at active state during the wrap cycle period.

The wrap length control circuit further includes a shift clock generating circuit 398 for generating shift clocks in response to the clock number information from the clock number selecting circuit 394. The shift clock generating circuit 398 generates shift clocks for shifting one by one the position of the column selecting line CSL to be selected by the column decoder in accordance with the set clock number. Generally, the wrap length is set to 8, and the clock number selecting circuit 394 generates the shift clocks in response to the difference between the wrap length 8 and the programmed wrap length.

If the programmed wrap length is 8, it is the same as in the normal operation, and therefore the shift clock is not generated. If the wrap length is 16, one shift clock is generated. If the wrap length is 32, three shift clocks are generated. In this case, the basic wrap length is 8, and at the time 8 bits of wrap data are stored, data transfer is carried out (in case of data writing). More specifically, if the wrap length is larger than the standard value of, for example, 8, data transfer is carried out when the wrap data of successive 8 bits have been stored in the write register (see the timing chart of FIG. 28). After data transfer, the next successive 8 bits of data are stored in the registers (write register), while the column selecting line from the column decoder is shifted by one in accordance with the shift clock from the shift clock generating circuit 398. This period is sufficiently long (as the next column selecting line have only to be raised before writing of the next successive 8 bits of data), and therefore the data of the desired wrap length can be reliably written in succession. The structure for successively raising the column selecting lines will be described in the following.

Figure 46:
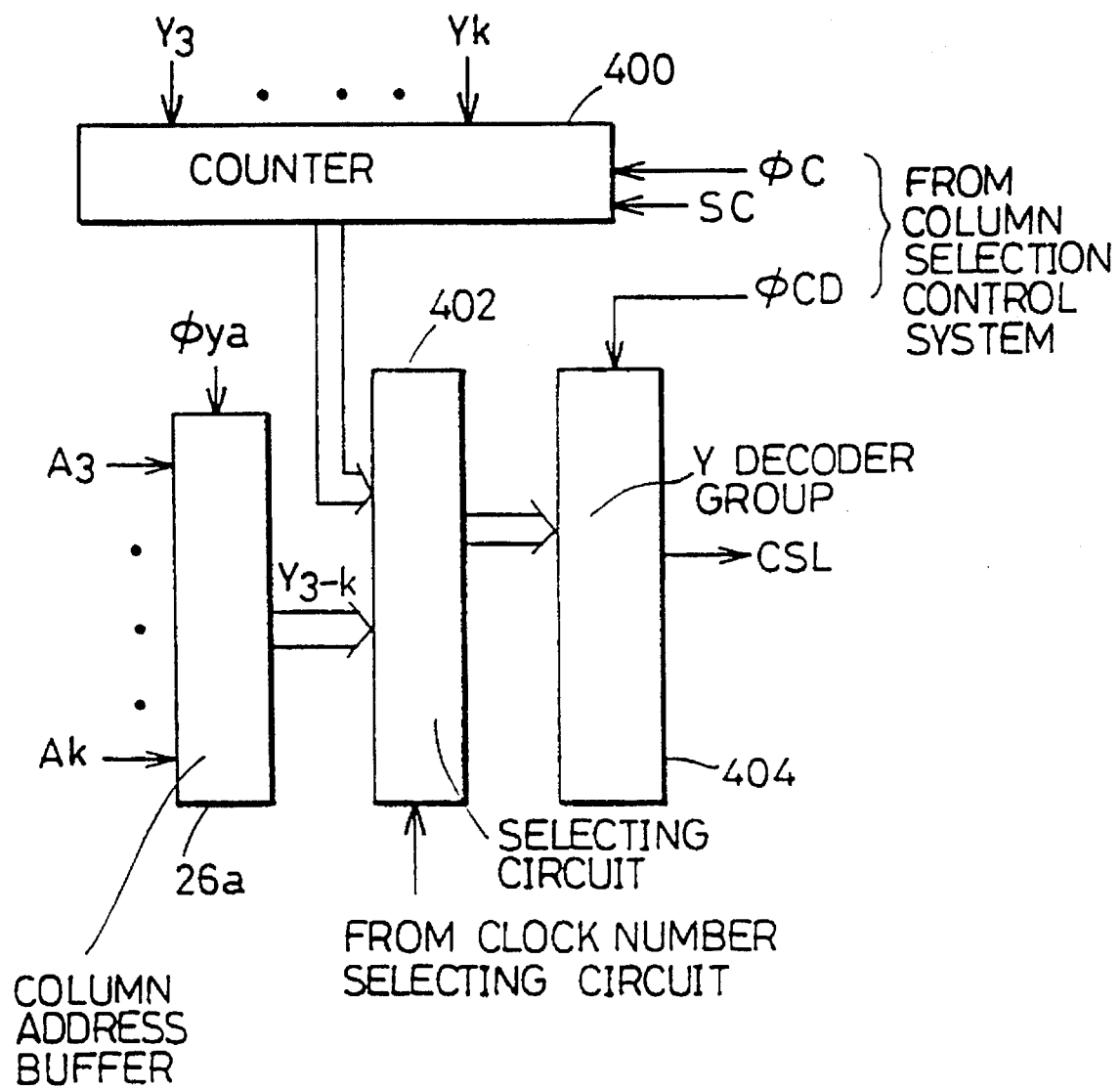
FIG. 46 shows a circuit structure for carrying out column selecting operation when the wrap length is changed.

FIG. 46 shows a structure for generating the column selecting signal when the wrap length is programmed. Referring to FIG. 46, the column selecting signal generating system includes a column address buffer 26a responsive to the internal control signal φya for taking in the external address signals A3 to Ak for generating internal column address signals Y3 to Yk, a counter 400 activated in response to the internal control signal φC generated in synchronization with the external column address strobe signal /CAS for taking in the internal column address signals Y3 to Yk generated from the column address buffer 26 as the initial count value, a selecting circuit 402 responsive to the wrap length information from the clock number selecting circuit 394 (see FIG. 45) for selecting either the output from the counter 400 or the output from the column address buffer 26a, and a Y decoder group 404 for decoding the column address signals from the selecting circuit 402 for activating the column selecting line CSL. The count value of the counter 400 is incremented (or decremented) one by one in response to the shift clock signal SC. The counter 400 increments the count value thereof in response to the shift clock signal SC from the shift clock generating circuit 398.

The selecting circuit 402 selects the output of the counter 400 and applies the same to the Y decoder group 404 when the clock number information from the clock number selecting circuit 394 is 1 or more, that is, the information indicates that the wrap length is 16 or longer.

The Y decoder group 404 decodes the signal applied from the selecting circuit 402 in response to the decoder activating signal φCD and selects the column selecting line. If the wrap length is not longer than 8, the selecting circuit 402 selects the output from the column address buffer 26a.

The decoder activating signal φCD applied to the Y decoder group 404 is once rendered inactive after a lapse of a prescribed clocks from the fall of the external column address strobe signal /CAS (or the write enable signal (write permitting signal)) in accordance with the information from the clock number selecting circuit, and then rendered active again. In the structure shown in FIG. 46, the counter 400 may have a structure in which the count value is incremented by 1 in response to the fall of the Y decoder activating signal φCD instead of the shift clock SC. At this time, the shift clock signal SC is applied to the Y decoder control system, and activation /inactivation of the activating signal φCD is controlled based on the timing of generation of the shift clock SC. An operation when the wrap length of 16 is selected in the SDRAM in which the normal wrap length is set at 8 will be described with reference to FIG. 47, which is a diagram of signal waveforms.

First, when the external row address strobe signal /RAS falls to "L", the address signal ADD is taken in at the rising edge of the next clock signal, and the internal row address signal Xa is generated. In accordance with the internal row address signal Xa, the potential at the word line WL rises, and each data of memory cells of this one row is transmitted to each bit line pair BLP.

Thereafter, when the external column address strobe signal /CAS and the write permitting signal (write enable signal) /WE falls to "L", the data applied at the data input/output terminal DQ at that time is taken in at the rising edge of the clock signal CLK and is latched in the write register. When the data is latched at the write register, the data are stored at the register positions indicated by the wrap address. By that time, the column address signal Yb has already been taken in.

The selecting circuit 402 selects the output of the counter 400 in accordance with the information indicating that the wrap length is 16 from the clock number selecting circuit 394 (see FIG. 45). The counter 400 has been latching the output from the column address buffer 26a as the initial count value in accordance with the external control signal φC. Then, the Y decoder group 404 is activated in response to the decoder activating signal φCD to carry out column decoding operation, and set one column selecting line CS1 to the selected state. 8 bits of wrap data b0 to b7 are successively stored in the write register. The write buffer activating signal φWB is generated at a rising edge of the clock signal at which the 8th wrap data b7 is latched. By that time, the column selecting line CSL has already been selected. Therefore, 8 bits of wrap data b0 to b7 are written to the respective selected memory cells. In parallel with the writing of the wrap data b0 to b7 to the memory cells, the next 8 bits of wrap data b8 to b15 are taken in and latched in the write registers at the rising edges of the clock signals successively.

Data from the write register are written at the rising edge of the clock signal at which the wrap data b7 is taken in, and the next wrap data are taken in accordance with the rising of the next clock signal, and therefore erroneous data writing can be prevented. After data are written to the memory cells by the selection of the column selecting line CSL1, the decoder activating signal φCD is once changed to the inactive state. In response to the inactivation of the column decoder, the count value of the counter 400 is incremented by one. As for the memory arrays, only the column selecting system is once returned to the precharge state.

The word line WL is kept at the selected state. Therefore, the potentials at the bit line pairs BLP are maintained at the state latched by the sense amplifiers, respectively. When a prescribed number of clocks are counted, that is, before the next wrap data b8 to b15 are all written to the write register, the Y decoder group 404 is activated. The selecting circuit 402 has applied the output of the counter 400 to the Y decoder group 404. The count value of the counter 400 is incremented by one. Therefore, the Y decoder group 404 selects neighboring column selecting line.

For the selected column selecting line CSL2, 8 bits of wrap data b8 to b15 which have been latched in the write register are transferred in response to the write register activating signal φWB and data are written to the selected memory cells through the global IO line pairs GIO.

By repeating the above described operation, successive access to all the memory cells connected to one row or a word line becomes possible. As for the data transfer timing from the write register, when the data are to be transferred in the middle of the wrap length, the activating signal for the write register is generated in response to the rise of the clock signal at which 8 bits of wrap data are written, to carry out data writing, as in the structure in which data writing is stopped during the wrap data storage described above. When the last wrap data is written, data are transferred at the rising edge of the clock signal after the writing of the final write data, same as the timing of the normal data writing. In this case, data writing may be carried out at the rising edge of the clock signal at which the final wrap data is written.

In the structure of FIG. 46, the selecting circuit 402 normally selects the output of the counter 400 in accordance with the wrap length data of the clock number selecting circuit. A structure in which the output from the column address buffer 26a is selected in the first cycle and the output of the counter 400 is selected in the next cycle may be employed.

Figure 47:
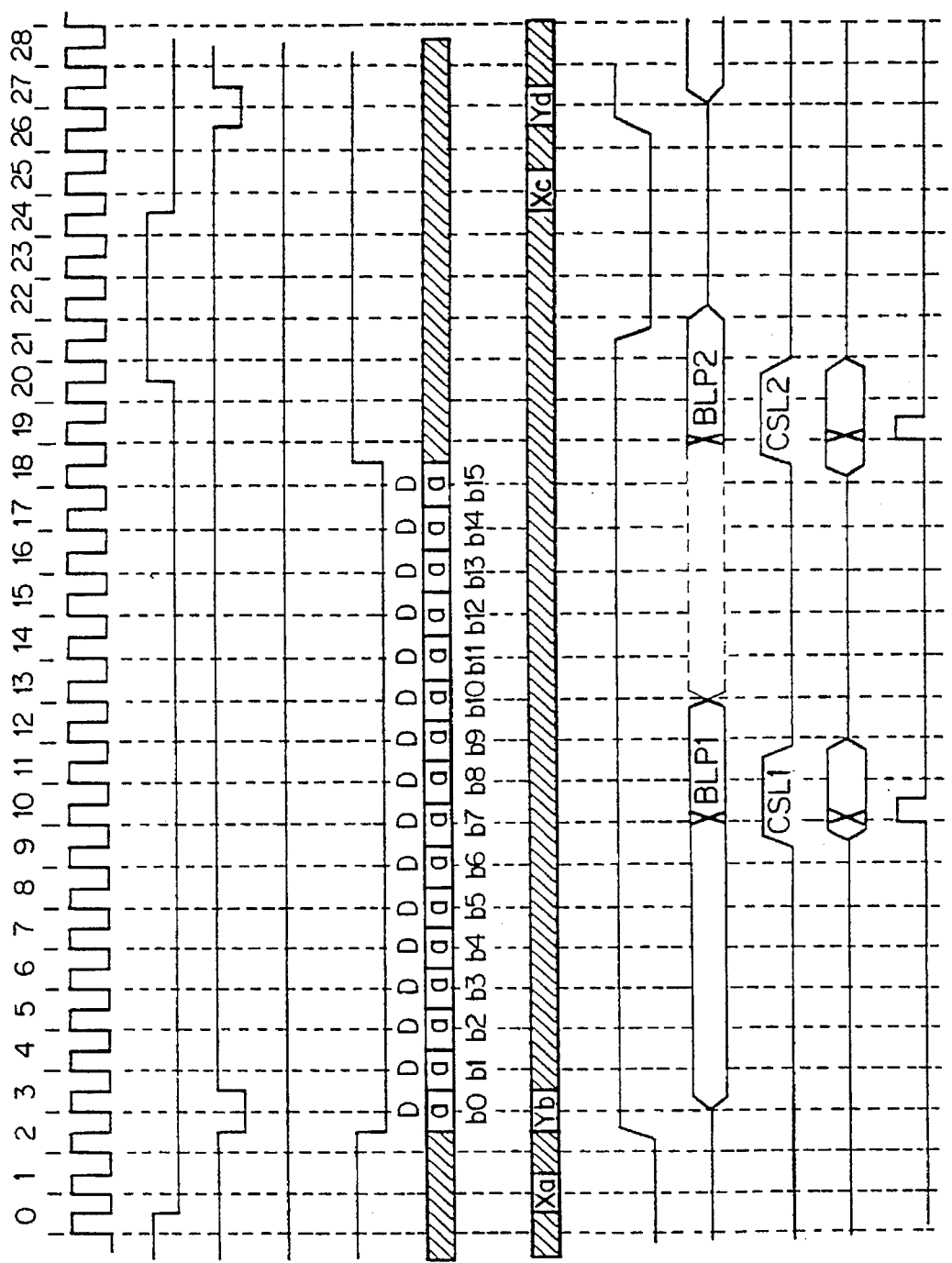
FIGS. 47(a)–(l) are a diagram of signal waveforms showing the operation when the wrap length exceeds 16.

In the structure shown in FIGS. 45 to 47, only the structure for extending the wrap length for the data writing is shown. However, by using read registers in place of the write registers, the wrap length for data reading can be expanded in the similar manner. More specifically, in the successive read cycle, the operation of the memory array is the same as that in the successive data writing. The only difference is that the read register activating signal is used instead of the write register activating signal. In the successive read cycle, at the time when 8th bit wrap data is read through the output buffer, the next 8 bits of wrap data are stored in the read registers. In parallel with the data reading from the read register, column selecting operation for the next wrap data is carried out in the memory arrays.

In the SDRAM in which the standard wrap length of 8 is set, when the wrap length of 4 is to be set, a structure in which the number of banks is increased may be used. Alternatively, writing of 4 bits of wrap data only may be carried out by using mask data, while keeping the bank number at 2. In data reading, the head address for 4 bits of wrap data is designated by the wrap address. Therefore it is not necessary to specifically use mask data, and data reading is completed when 4th bit data is read.

[Pin configuration]

Figure 48:
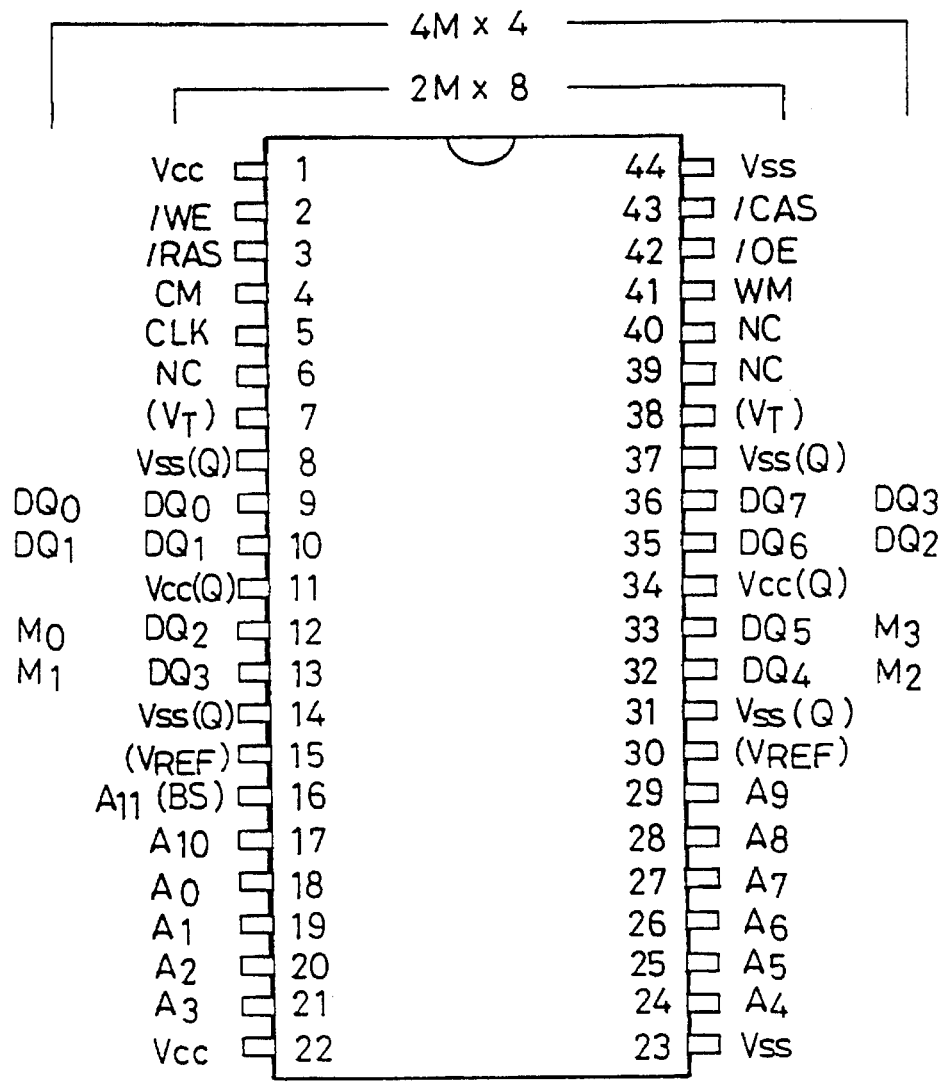
FIG. 48 shows an appearance of a package accommodating the synchronous semiconductor memory device in accordance with the present invention.

FIG. 48 shows an appearance of a package accommodating the SDRAM in accordance with one embodiment of the present invention. The 16M SDRAM in accordance with one embodiment of the present invention is accommodated in a 44 pin, lead pitch 0.8 mm, 400 mil, TSOP Type II. Though this package has the same size as an SOJ (Single Outline J leaded Package) accommodating a standard 16M DRAM, the lead pitch is smaller, and therefore larger number of pins can be provided.

Referring to FIG. 48, the SDRAM housed in this package can have x 4 structure and x 8 structure by switching bonding wires.

The supply potential Vcc is applied to the pins and 22. Data input/output terminals are arranged at the central portion of the package, and pin terminals of the numbers 9, 10, 12, 13, 32, 33, 35 and 36 are used as the data input/output terminals DQ0–DQ7 (if it has x 8 structure).

Pin terminals (numbers 1 and 34) for receiving the supply potential Vcc (Q) used for the input/output buffer and pin terminals of the numbers 8 and 37 for receiving the ground potential Vss (Q) are arranged sandwiching the data input/output terminals DQ0, DQ1, DQ7 and DQ6. By using the supply potential Vcc (Q) and Vss (Q) used only for the data input/output portion, the noise associated with charging/discharging of the data input/output terminals when data is input/output at high speed can be effectively reduced, ensuring stabilized internal operation.

The supply potential Vcc is applied to the pin terminals of the numbers 1 and 22 on both ends of the package, and the ground potential Vss is applied to the pin terminals of the numbers 23 and 44. The write permitting signal /WE is applied to pin 2, and the external row address strobe signal is applied to the pin number 3. A command designating signal CM is applied to the terminal of the pin number 4.

Although not specifically described in the above embodiment, the command designating signal CM is used for setting particular operation modes in the SDRAM. Clock signal CLK is applied to the pin terminal of number 5. Address signal bits A0–A11 are applied to the terminals of the numbers 18 to 21, 24 to 29 and 17 and 16, respectively. The address signal bit A11 applied to the pin terminal 16 is used as the bank selecting signal BS. In other words, 2 bank structure is used. As for the address signals applied to the address pin terminals 16 to 29, the row address signals and the column address signals are applied time divisionally. In the x 8 structure, A0–A8 or A0–A9 are used as column address signals. Refresh unit in the internal refresh cycle determines which arrangement is to be used.

The write mask designating signal WM is applied to the pin terminal of the pin number 41, the output permitting signal (output enable signal) /OE is applied to pin number 42, and the column address strobe signal /CAS is applied to the pin terminal of pin number 43. The voltage VT applied to the pin terminals of the numbers 7 and 38 and the voltage Vref applied to the pin terminals of the numbers 15 and 30 are reference potentials necessary when the SDRAM is used in a GTL interface. The GTL level has been proposed in a microprocessor operating at high speed recently, in which the comparison reference potential for determining "H" and "L" is 0.8V and logical amplitude of the signal is 0.8V.

The pin terminals of the numbers 6, 39 and 40 are not used and specifications thereof are not defined.

For x 4 structure, the pin terminals 12, 13, 32 and 33 (data input/output terminals) are used as the mask data input/output terminal. The mask data M0–M3 mask writing of data through specific data input/output terminal. The structure for realizing such write per bit operation can be easily implemented, and a structure in which mask data is applied simultaneously to the data input/output terminal to inactivate the associated input buffer may be used. Alternatively, a structure may be used in which mask data is taken in under a specific condition, for example, WCBR and latched in an internal register circuit, and the data applied through a specific data input/output terminal is made invalid or the input buffer is inactivated in accordance with the mask data held in that register during successive accessing.

As for the correspondence between the mask data M0–M3 and the data input/output terminals DQ0–DQ3, when the mask data M0 is set to "H", for example, the data input/output terminal DQ0 is set to the write inhibited state. The masking function is useful in the following points.

Figure 49:
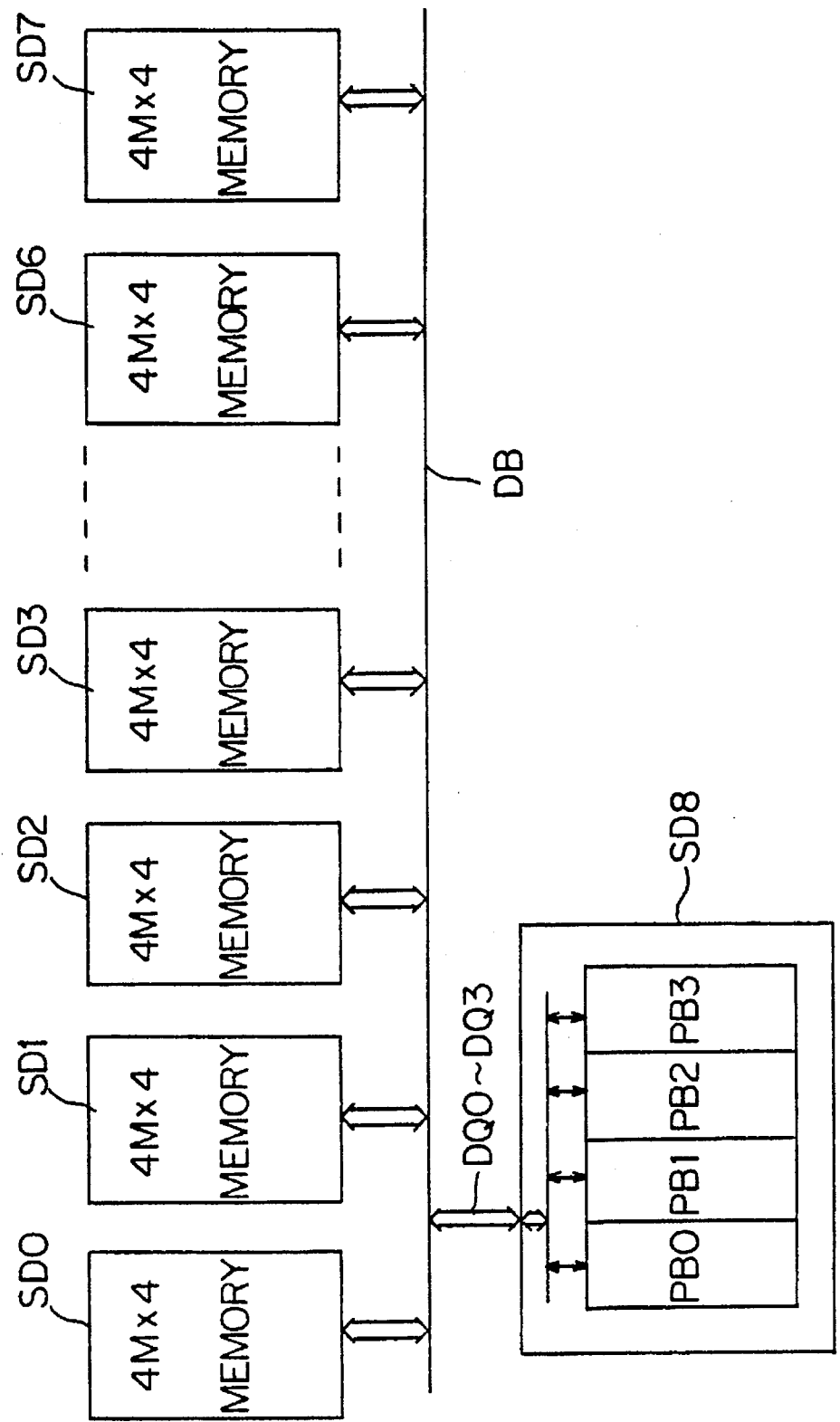
FIG. 49 shows, as an example, a state in which masking of data is effective.

Assume a memory unit in which 8 memory devices SD0–SD7 each having the structure of 4M words x 4 bits form one module, as shown in FIG. 49. Generally, in data processing, 1 bit of parity bit for error checking is added to every 8 bits. In this example, an SDRAM, SD8 having the structure of 4M words x 4 is used for the parity bits. The memory device SD8 includes memory units PB0–PB3 each having 4M words x 1 bit. The memory units PB0–PB3 correspond to the data input/output terminals DQ0–DQ3, respectively. One memory unit PB corresponds to two of the memory devices ST0–ST7 constituting the memory module.

In this example, 4×8+4=36 bits of data in total are transmitted through the data bus DB. Parity checking is done, and if it is not necessary to rewrite the parity bit, the mask data M is set to "H". In that case, rewriting of the parity bit is inhibited, and thus this rewriting is not effected. If the memory unit PB0 in the memory unit SD8 is used as a unit for storing the parity bit for the memory devices SD0 and SD1, rewriting/write inhibition of the parity bit corresponding to the write data of the memory units SD0 and SD1 is carried out. In that case, in the memory module, writing/writing inhibition of the parity bit can be carried out by unit data bit independently, and therefore storing of the parity bit can be flexibly done. Generally, there frequently exists data words of 8 bit unit and 32 bit data word. Therefore, it is possible to flexibly set that the parity bit in accordance with the structure of the data word.

[Embodiment 2]

In the synchronous semiconductor memory device described above, the control signals, address signals and input data are taken in the device in synchronization with externally applied clock signals. The synchronous semiconductor memory device includes a plurality of banks. By alternately accessing the banks, the interleave method can be realized in the SDRAM. The memory cycle is determined by the active period (the period of "L") of the control signal /RAS. In order to switch the banks, it is necessary to raise the control signal /RAS once to the inactive state of "H". This is done to set the bank address. There are two methods for alternately accessing the banks #1 and #2 successively.

The first method is to provide the control signal RAS independently for the banks #1 and #2, respectively. The second method is to make all the external control signals into one shot pulse signals. Designation of the operation mode is made by the combination of the external control signals. Only when it is necessary to designate the operation mode, the control signals are set to a prescribed combination. In the SDRAM, necessary operations are carried out in accordance with the set operation mode. As the control signals are pulsenized, it becomes possible to precharge one bank while accessing the other bank even when the address signal is taken in in accordance with the control signal /RAS.

This method of having all control signals pulsive has another advantage that the control signals have similar signal shapes as the address signal, which facilitates generation of control signals. The necessary signals have only to be generated as signals having similar shapes, and therefore it is not necessary to put extra load on the external processing device. A structure for making the control signals pulsive will be described in the following.

[Definition of signals]

Signals are pulsenized, and the operation to be carried out is determined by the combination of the control signals. The correspondence between the states of various control signals and the operation mode carried out at that time will be described.

Figure 50:
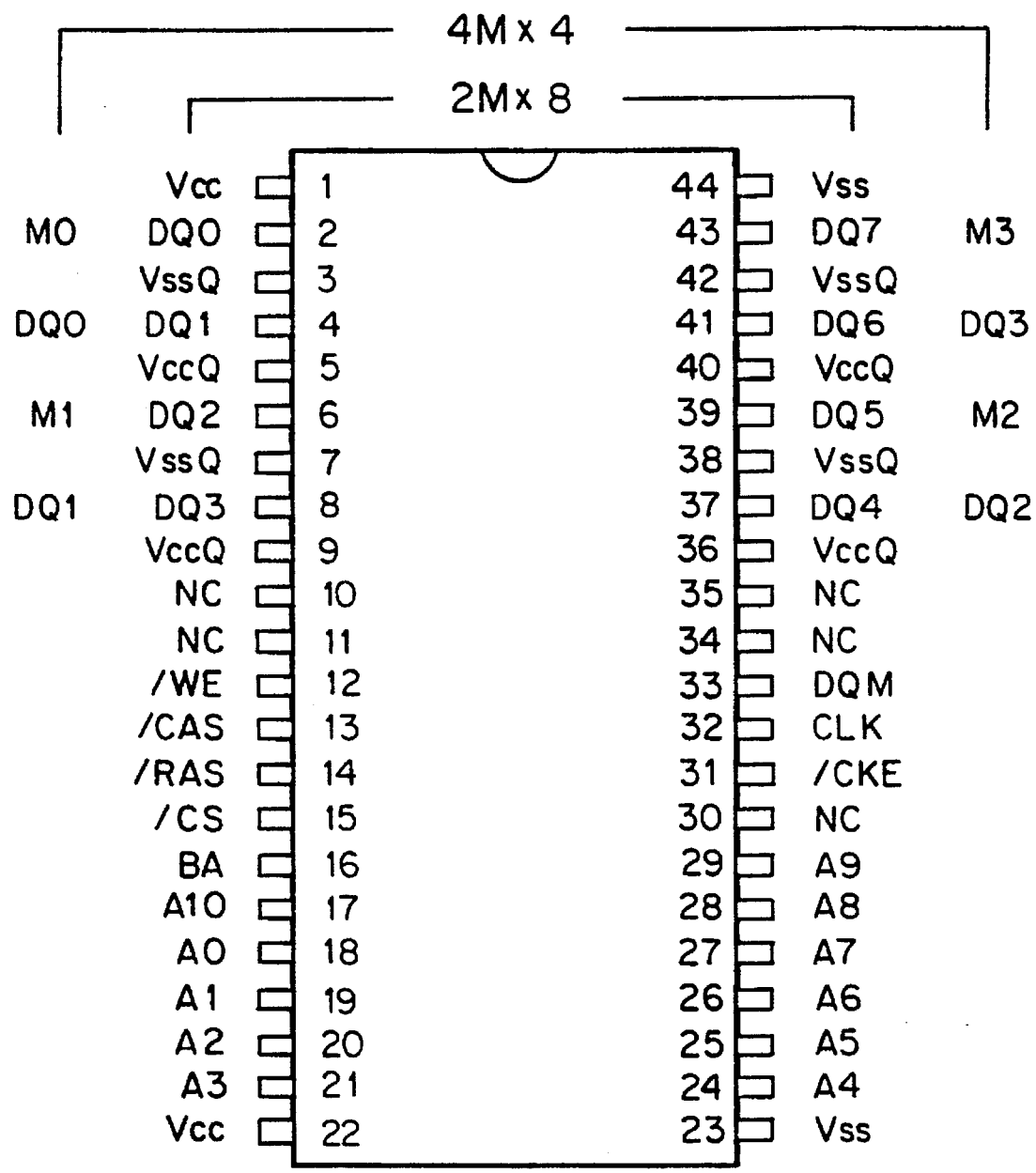
FIG. 50 shows pin configuration of a pulse type synchronous semiconductor memory device in accordance with a second embodiment of the present invention.

FIG. 50 shows a pin configuration of the pulse type synchronous semiconductor memory device in accordance with a second embodiment of the present invention. The synchronous semiconductor memory device shown in FIG. 50 has a structure in which one word includes 4 bits, or a structure in which one word includes 8 bits, as in the synchronous semiconductor device in accordance with the first embodiment shown in FIG. 48. The setting of the word structure is made by pad bonding.

The operation supply voltage Vcc is applied to the pin terminals of the numbers 1, 5, 9, 22, 36 and 40. The operation supply voltage Vcc (denoted by VccQ in FIG. 50) applied to the pin terminals 5, 9, 36 and 40 are used for the input/output circuit (especially by the input/output buffer). The ground potential Vss is applied to the pin terminals of the numbers 3, 7, 23, 38 and 42. The ground potential Vss (denoted by VssQ in FIG. 50) applied to the pins 3, 7, 38 and 42 are used for the input/output circuit. The operation supply voltage is separated to one for the input/output circuit and one for remaining other circuits in order to prevent generation of noise at the supply line and the ground line. Especially, four pin terminals are provided for each of the operation supply voltage VccQ and the ground potential VssQ for the input/output circuit in order to surely prevent generation of noises caused by ground bounce or the like. By dispersing the supply line and the ground line, parasitic inductance components of the interconnections can be reduced, generation of ringing is prevented, and even if spike noise is generated, the influence of the spike noise can be restricted to small portions.

The pin terminals of the numbers 2, 4, 6, 8, 37, 39, 41 and 43 are used for data input/output (when the structure in which one word includes 8 bits is used). If one word includes 4 bits, the pin terminals of the numbers 2, 6, 39 and 43 are used for inputting mask data M0–M3.

The pin terminals of the numbers 17 to 21 and 24 to 29 are used as address signal input terminals. A bank address BA for designating the bank is applied to the pin terminal of the pin number 16. The write enable signal WE is applied to the pin terminal of the number 12. The column address strobe signal /CAS is applied to the pin terminal of 13. The row address strobe signal /RAS is applied to the pin terminal of the number 14. The data input/output/mask signal DQM is applied to the pin terminal of the pin number 33. The signal DQM corresponds to a combination of the output enable signal /OE and the write mask signal WM in the first embodiment. The clock signal CLK is applied to the pin terminal of the number 32. A clock buffer enable signal /CKE for controlling activation/inactivation of the clock buffer which takes in the clock signal CLK and generates an internal clock signal is applied to the pin terminal of the number 31. The chip select signal /CS indicating that the semiconductor memory device is at the selected state is applied to the pin terminal of the pin number 15.

These control signals are applied only in a cycle in which operation mode is designated in the form of pulses. All control signals, address signals and data are taken in in at the rising edge of the clock signal CLK. In accordance with the combination of the states of the control signals /WE, /CAS, /RAS, /CS and DQM at the rising edge of the clock signal CLK, the designated operation mode is determined in the device. The correspondence between the control signals and the operations mode will be described in the following.

FIG. 51 shows correspondence between the states of the control signals and the operation modes designated at that time. The relation between the control signals and the operation mode will be described with reference to FIG. 51.

(a) /CS=/RAS="L" and/CAS=/WE="H"

In this state, taking of the row address is designated and activation of memory arrays is designated. More specifically, the row address is taken in, the bank address is also taken in and in the selected bank, operation related to row selection is carried out.

(b) /CS=/CAS="L" and/RAS=/WE="H"

In this state, taking of a column address is designated and data reading operation mode is designated. In this operation mode, the read data register is selected, and data transfer operation to the read data register from the selected memory cell is carried out.

(c) /CS=/CAS=/WE="L" and/RAS="H"

In this state, taking of the column address and data writing operation are designated. In this operation mode, the write register is activated, and the applied data is written to the write register and to the selected memory cell.

(d) /CS=/RAS=/WE="L" and/CAS="H"

The array is set to the precharge state, and completion of self refresh is designated.

(e) /CS=/FLAS=/CAS="L" and/WE="H"

In this state, refresh is designated and self refresh operation is started. In this operation mode, refresh address is generated internally, and refreshing of the memory cells of the selected row is carried out by using an address counter and a timer internally provided.

(f) /CAS=/RAS=/CAS=/WE=

In this operation mode, data is set in the mode register. Although not specifically described, a mode register is provided for designating a particular operation mode in the synchronous semiconductor memory device, and a desired operation is carried out in accordance with the data set in the mode register. Application of such mode register includes setting of wrap length in the first embodiment, setting of wrap length sequence, and so on.

(g) DQM="L"

In this operation mode, data writing or reading is carried out in the operation mode determined previously by the signals /CAS and /WE. More specifically, externally applied write data is stored in the write register or the data stored in the read data register are read out.

(h) DQM="H"

In this operation mode, reading of data is inactivated, and the write mask operation (masking operation in the successive bit data (wrap data)) is designated. Masking of the write data is done for the data applied at a rising edge of the next clock signal CLK after this signal DQM attains to "H". By masking the write data with a delay of 1 clock, timing setting of the control signals is facilitated (see FIGS. 20 to 27).

(i) /CS="L" and/RAS=/CAS=/WE="H"

In this state, the operation is not changed. No operation mode is designated. What is indicated is that the semiconductor memory device is at the selected state.

(j) /CS="H"

In this state, the SDRAM is at the non-selected state, and the signals /RAS, /CAS and /WE are neglected.

In FIG. 51, the signal state indicated by "–" denotes "don't care" state, and "X" shows "arbitrary" state. Specific operations will be described in the following.

Figure 52:
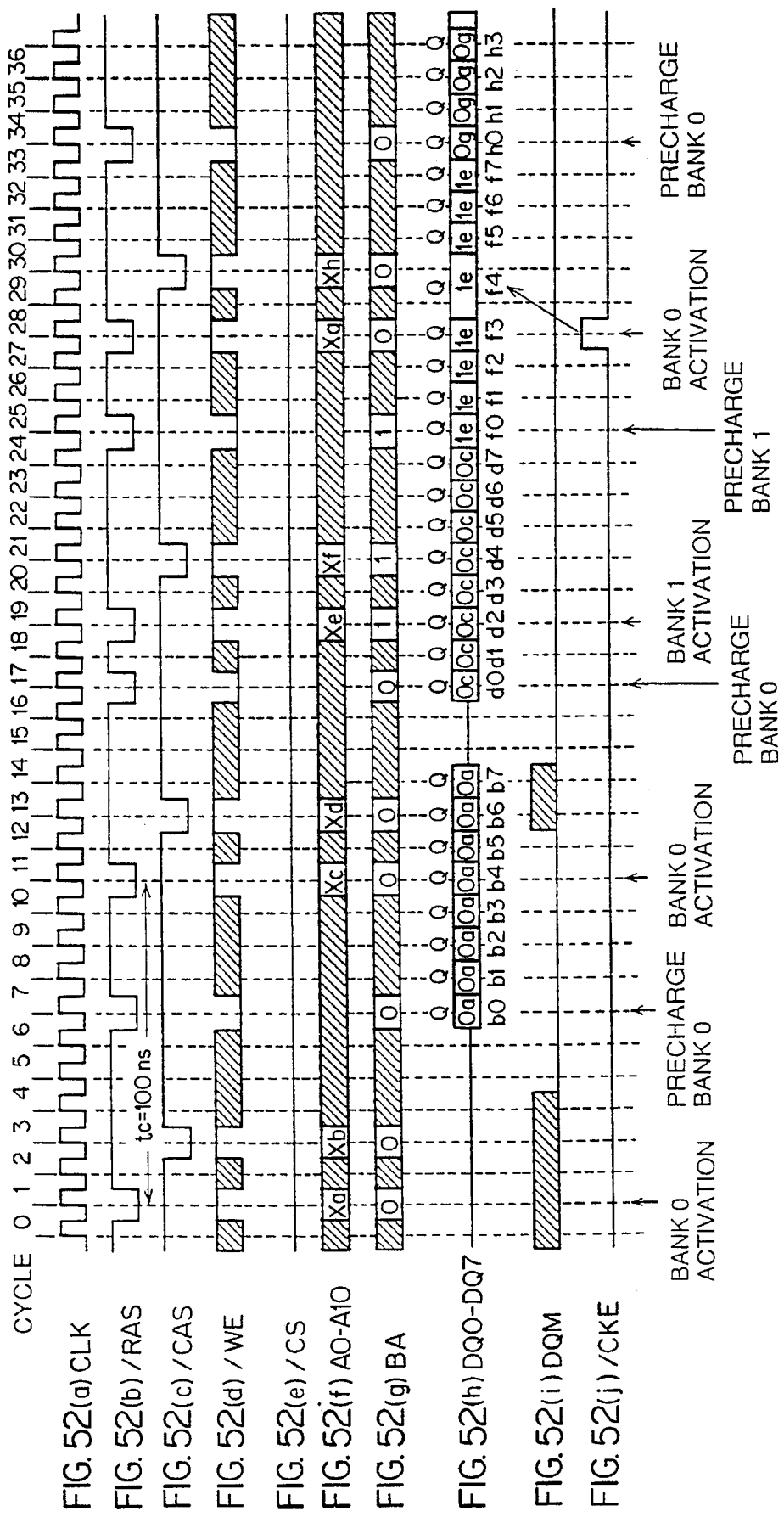
FIGS. 52(a)–(j) are a timing chart showing data reading operation of the synchronous semiconductor memory device in accordance with the second embodiment of the present invention.

FIG. 52 is a timing chart showing states of external signals for data reading operation of the SDRAM in accordance with the second embodiment. The data reading operation will be described with reference to FIG. 52.

In cycle 1, at a rising edge of the clock signal CLK, the signal /RAS is set to "L" and signals /CAS and /WE are both set to "H". At this time, the row address signal bits A0–A10 are taken in as the row address Xa and an internal address is generated. At the same time, the bank address signal BA is taken in. The bank address signal BA is "0". In this case, a bank corresponding to the bank address BA=0 is selected. Assume that the SDRAM includes banks 0 and 1. In correspondence with the bank address, in the bank 0, row decoding operation and array activation are carried out.

After one clock, in cycle 3, at the rising edge of the clock signal CLK, the signals /RAS and /WE are set to "H" and the signal /CAS is set to "L". This state indicates data reading, and at the rising edge of the clock signal CLK in this cycle 3, the address signal bits A0–A10 are taken in as the column address signal Yb. Consequently, row and column selecting operations are carried out inside in accordance with the row address signal Xa and the column address signal Yb, and the data of the selected memory cells are stored in the read data register. After 6 clock cycles, in cycle 7, data are read out. In this case, the signal DQM is set at "L" in advance. This allows data reading.

In cycle 7, 8 pieces of data stored in the read register are read out in synchronization with the rising edges of the clock signals CLK successively. The successive 8 bits of data are denoted as b0–b7.

In parallel with data reading, in cycle 7, the signals /RAS and /WE are set to "L" and the signal /CAS is set to "H" at the rising edge of the clock signal CLK. At this time, the bank address BA is also set to "0". Thus precharging of the bank 0 is designated, and the arrays of the bank 0 are precharged.

Now, the signal DQM controls activation/inactivation of the read register with a delay of 2 clock cycles in data reading. This is to facilitate setting of timings of control signals for data reading. A structure in which the shifting of the read register and the output buffer are activated after the lapse of 2 clocks from the fall of the signal DQM to "L" may be used. This structure can be easily implemented by utilizing a delay circuit which provides a delay of 2 clock periods to the signal DQM.

The bank 0 which enters the precharge state can be activated again after the lapse of a prescribed RAS precharge period (2 or 3 clock cycles).

In cycle 11, the signal /RAS attains to "L" and the signals /CAS and /WE both attain to "H" at the rising edge of the clock signal CLK. The bank address signal BA attains "0". The bank 0 is activated again. At the same time, the row address signal Xc is taken in.

In cycle 13, the signal /CAS is set to "L" and the signals /RAS and /WE are both set to "H" at a rising edge of the clock signal CLK. The column address signal Yd is taken in and data reading operation is designated. In the bank 0, selecting operation is carried out in accordance with the row address Xc and the column address Yd, and the data of the selected memory cells are again transferred to the read data register. The output of data is carried out after 6 clocks are counted from the start of the memory cycle in which /RAS enters "L". In this state, the signal DQM is at "L", indicating the output enable state. In cycle 17, 8 data d0–d7 selected by the addresses Xc and Yd at the risings edge of the clock signals CLK are successively read in response to the rising of the clock signals CLK. In cycle 17, the signals /RAS and /WE are set to "L" and the bank address signal BA is set to "L" simultaneously. Consequently, the bank 0 again enters the precharge state.

In cycle 19, the signal /RAS is set to "L", the signals /CAS and /WE are set to "H" and the bank address BA is set to "1". In this state, the bank 1 is selected, and the address signal bits A0–A10 applied at that time are taken in as the row address Xe. Consequently, the row selecting operation in accordance with the row address Xe is carried out in the bank 1.

At the rising edge of the clock signal CLK in cycle 21, the signals /RAS and /WE are set to "H" and the signal CAS is set to "L". Consequently, data reading operation for the bank 1 is designated. At the same time, the column address Yf is taken in. The signal DQM is at "L", indicating the output enable state. After the data d7 is read from the bank 0, the data f0 from the bank 1 is read at the rising edge of the clock signal CLK of the next clock cycle 25. At this time, the signal /RAS is set to "L", the signal /WE is set to "L" and the signal /CAS is set to "H", and the bank address signal BA is at "1". Thus precharging of the bank 1 is designated. Data of the bank 1 is continuously read from the data register. In the bank 1, precharging is carried out.

In cycle 28, the signal /RAS is set to "L", the signals /CAS and /WE are set to "H" and the bank address signal BA is set to "0" again, the bank 0 is again activated.

At the rise of the clock signal CLK in the cycle 28, the clock buffer enable signal /CKE is set to "H". The signal /CKE is a signal for enabling/disabling the clock buffer. When the signal /CKE attains "H", generation of the shift clock of the registers in the read register is inhibited in the next clock cycle. In other words, the data f4 read in cycle 29 is continuously output in the next cycle 30. Therefore, if the speed of data processing in a device processing the data outside the SDRAM cannot follow the data reading or when every necessary data cannot be obtained, the same data can be continuously output for a prescribed time period by setting the clock buffer enable signal /CKE at "H". This operation is referred to as "suspended output".

In cycle 30, the column address Yh in the bank 0 is taken in, and in cycle 34, precharging of the bank 0 is carried out.

As described above, by applying the signal /RAS in the form of pulses, the operation mode can be designated by combining the control signals /RAS, /CAS and /WE into prescribed states only in the initial period of the operation cycle, switching of banks can be easily done, and precharging of the bank 1 can be done while the bank 0 is active. Therefore, it is not necessary to take the RAS precharge period into account, and data can be read successively from the banks 0 and 1 alternately, enabling high speed data reading.

In addition, by providing "suspended output" operation mode, data can be easily taken in in accordance with the speed of operation of the processing device even during successive data reading, which facilitates timing design of the system. When viewed from the outside, it seems as if the second clock signal counted from the signal /CKE attaining "H" is erased. Internally, the shifting operation in the registers is carried out at the rising edge of the next clock signal, and therefore the clock of the cycle next to the setting of the signal /CKE to "H" is erased inside.

Figure 53:
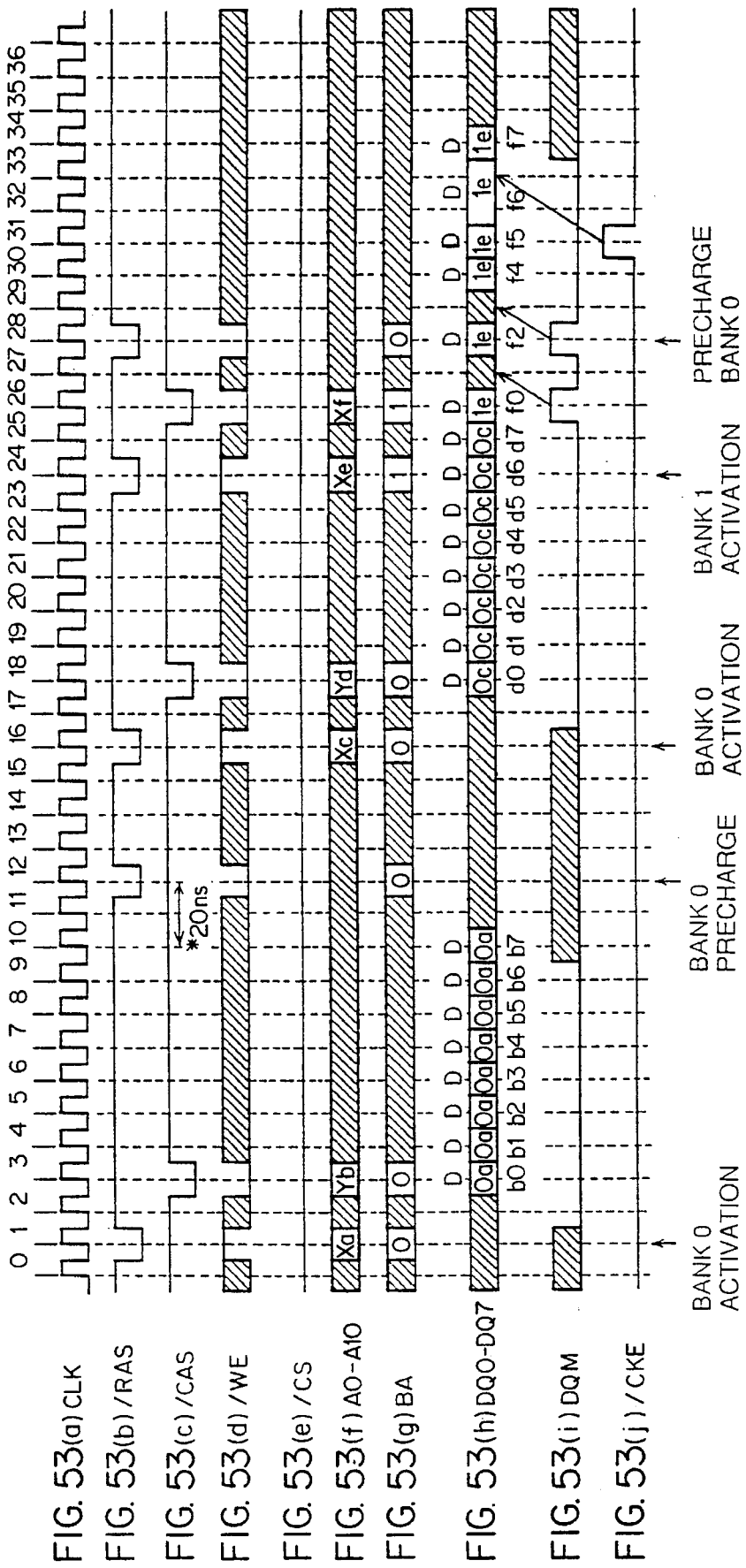
FIGS. 53(a)–(j) are a timing chart showing data writing operation of the synchronous semiconductor memory device in accordance with the second embodiment of the present invention.

FIG. 53 shows data writing operation of the SDRAM in accordance with the second embodiment of the present invention. The writing operation is designated by setting the signal /WE to "L" simultaneously with the fall of the signal /CAS. In FIG. 53, data writing operation to the bank 0 is first designated. In this state, data writing to the data registers, that is, taking in of external data is carried out simultaneously with the setting of the signals /CAS and /WE to "L". In the writing operation, externally, the signal DQM enables/disables taking in of data with a delay of 1 clock.

The reason for this is that what must be done in data writing is to take in data in the input buffer simultaneously with the designation of writing. The write register may not be completely reset at this time. The reset state of the register have only to be established till the next clock cycle to allow writing of data b0. Therefore, different from the operation in data reading, the signal DQM controls enabling/disabling of data writing with a delay of 1 clock from external data writing. In data reading, reading operation is carried out after 6 clock signals CLK are counted after the start of the memory cycle. It is necessary to set the output buffer to the operation enable state by this time and the data applied from the registers must be taken in to the output buffer for reading. Therefore, the signal DQM is enabled earlier than in the writing mode.

When the signal DQM is set to "H", the write data applied in the next clock cycle is masked. The data delayed by 1 clock cycle is masked, in order to facilitate setting of timings. As for the structure of masking data with a delay of 1 clock, a structure of FIG. 20 in which the write mask data WM is applied to the write mask data generating circuit with a delay of 1 clock may be used. By adopting this structure for masking the data delayed by 1 clock, the timing design for the wrap address from the wrap address decoder can be facilitated.

In this data writing mode also, when the signal /CKE is set to "H", the data f6 applied in the next clock cycle is continuously input in the second next clock cycle. The shifting operation of registers in the write register is inhibited. Therefore, in data writing, it becomes possible to write data when all necessary data are provided. This operation is referred to as "suspended input".

As described above, respective instructions and address signals are taken in at the rising edge of the external clock signal CLK. It is impossible to predict when the instructions and address signals are applied. Therefore, it is necessary to make stable the states by taking in these external control signals at the rising edge of the external clock signal CLK and generating internal control signals. The structure of the input portion for this purpose will be described.

Figure 54:
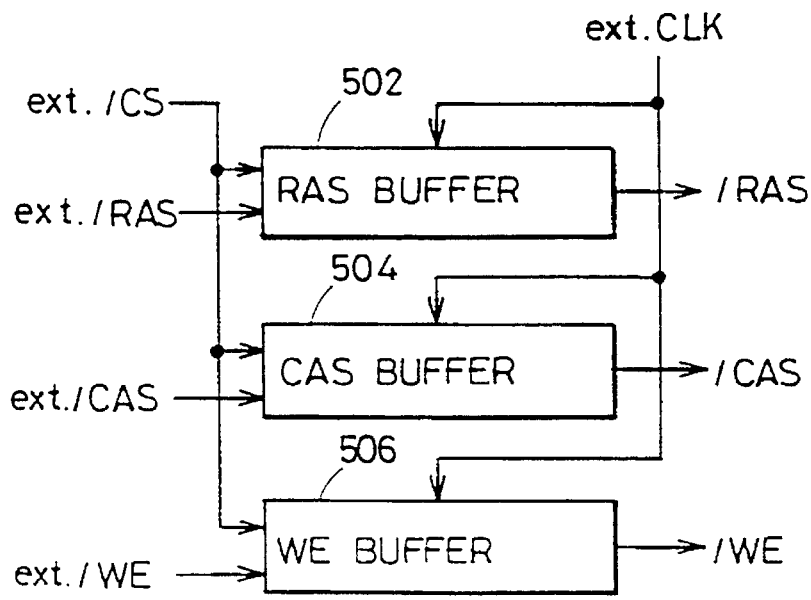
FIG. 54 is a diagram for explaining the problems of a buffer circuit which takes in external control signals and generates internal control signals.

FIG. 54 shows a structure of a buffer circuit for taking in the signals /RAS, /CAS and /WE in synchronization with the external clock signal CLK. In FIG. 54, for distinguishing the external signals from internal signals, the external signals are denoted by the reference character "ext.".

Referring to FIG. 54, the RAS buffer is activated when the external control signal ext. /CS is at "L", takes in the external control signal ext. /RAS in synchronization with the external clock signal ext. CLK and generates the internal control signal /RAS. The CAS buffer 50 is activated in response to the external control signal ext. /CS attaining "L", takes in the external control signal ext. /CS at the rising edge of the external clock signal ext. CLK and generates the internal control signal /CAS. The WE buffer 506 is activated in response to the external control signal ext. /CS being "L", takes in the signal ext. /WE at the rising edge of the external clock signal ext. CLK and generates the internal signal WE. The buffers 502, 504 and 506 are formed by such dynamic latches as shown in FIG. 35. An AND circuit receiving an external clock signal ext. CLK at its true input and the external control signal /CS at its false input may be used as the latch enable signal φLE generating system, for the structure for enabling/disabling the dynamic latch by the external control signal ext. /CS.

Figure 55:
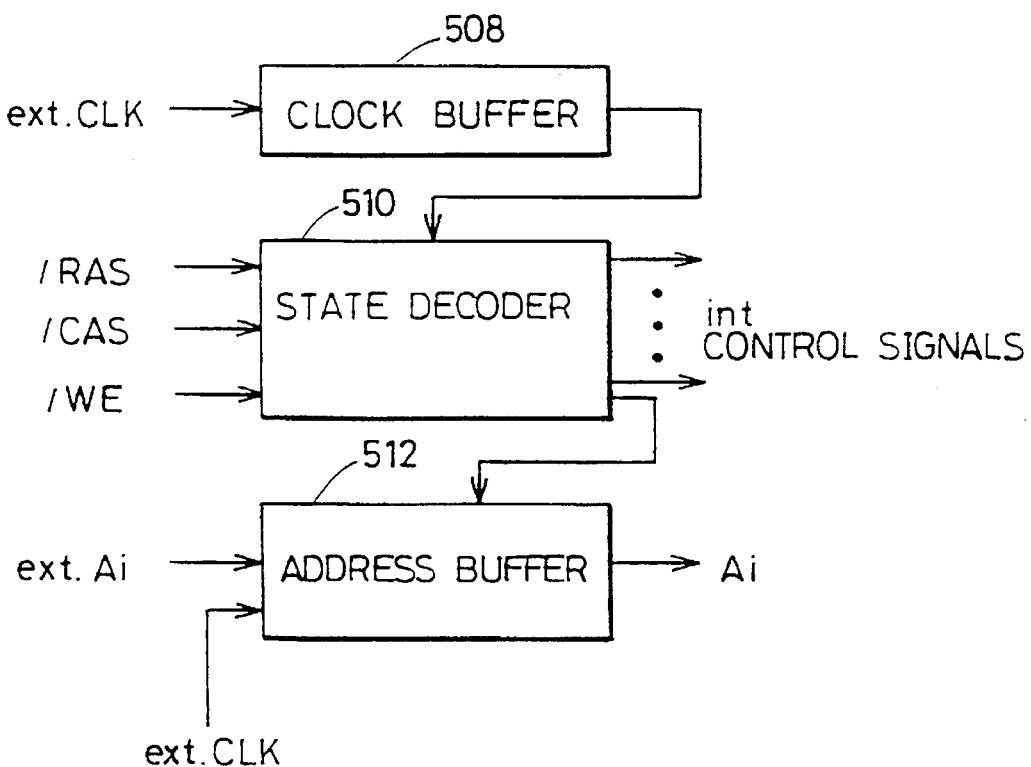
FIG. 55 is a diagram for explaining the problems of a structure which takes in external address signals in accordance with the states of control signals.

FIG. 55 shows a circuit structure for generating the internal address signals. Referring to FIG. 55, the clock buffer 508 buffers the external clock signal ext. CLK and generates an internal clock signal CLK. A state decoder 510 takes in the internal control signals /RAS, /CS and /WE at the rising edge of the internal clock signal CLK from this clock buffer 508, determines the states of the signals, and generates necessary internal control signals. When the signals /RAS, /CAS and /WE designates taking of an address signal, the state decoder 510 activates the address buffer 512. The address buffer 512 takes in the external address ext. Ai at the rising edge of the external clock signal ext. CLK and generates an internal address Ai in accordance with the signal indicating the result of decoding from the state decoder 510.

As described above, it is necessary to operate the buffers 502, 504 and 506 at every rising edge of the external clock signal ext. CLK. Especially, an address buffer must be provided for each of the row and column address signal bits and therefore the number thereof is large (a total of 20, for the row address signal bits A0–A10 and for the column address signal bits A0–A10). Therefore, if the address buffer is operated at every rising edge of the clock signal ext. CLK, power consumption would be significantly large.

In order to reduce power consumption in the address buffer, it is activated only when the control signals /RAS, /CAS and /WE designates the taking of the address signal as shown in FIG. 55. In this case, there arises a problem that the hold time required for the address signal becomes longer. More specifically, the address buffer 512 takes in the external address signal ext. Ai after the result of determination by the state decoder 510 has been established. The hold time of the address signal viewed from the outside is defined from the rising edge of the same clock signal as the clock signal CLK at which the control signals such as /RAS are taken in. Therefore, the hold time of the address signal becomes longer by the time take inn by the state decoder 510 for determining the instructions. For example, the hold time required for the control signal /RAS or the like is 3 ns while the hold time necessary for the address signal may be 6 ns. The advantage provided by the application of the control signals in the form of pulses similar to the address signals is lost by such a long hold time. This is because the conditions required for each signal are different. It is preferred that the set up time and the hold time of the address signal is made as short as possible for the device to operate at high speed.

The clock buffer 508 such as shown in FIG. 55 must be operated constantly, in order to take in external control signals, the time of activation of which cannot be predicted. This results in increased standby current.

[Structure of the buffer circuit]

Therefore, a structure for the external signal input buffer circuit for removing the disadvantages of the structure shown in FIGS. 54 and 55 will be described.

FIG. 56 is a block diagram schematically showing the structure of an internal control signal generating system of the SDRAM in accordance with the second embodiment of the present invention. Referring to FIG. 56, the memory array includes two banks, that is, the first bank (bank 0) 600a and the second bank (bank 1) 600b. The banks 600a and 600b include the circuit portion 200 shown in FIG. 1. To make the drawings simple, FIG. 56 shows internal control signals as generated common to the banks 600a and 600b. Only one of the banks is activated in accordance with the bank address signal BA, and the control signals are applied only to the activated bank. The internal structure of the banks 600a and 600b is the same as that in the former embodiment.

Referring to FIG. 56, the internal control system includes a CS buffer 614 processing the external control signal ext. /CS for generating an internal control signal /CS, a CKE buffer 612 responsive to the externally applied clock buffer enable signal ext. /CKE for generating control signals CLKBE and /CKE, and a clock buffer 610 activated in response to the control signals CLKBE and /CKE for buffering the external clock signal ext. CLK and for generating the internal clock signals CLK1 and CLK2.

When the external control signal ext. /CKE is at the inactive state (at "H" level), the CKE buffer 612 stops generation of the clock signals CLK1 and CLK2 from the clock buffer 610. The CKE buffer 612 takes in the external control signal ext. /CKE in synchronization with the first internal clock signal CLK1 from the clock buffer 610 and generates the internal control signal /CKE. The control signal /CKE is also applied to the clock buffer 610. The clock buffer 612 generates the second internal clock signal CLK2 in synchronization with the external clock signal ext. CLK in response to the internal control signal /CKE. When a special mode is set, the details of which will be described later, the CKE buffer 612 takes in the external control signal ext. /CKE in non-synchronization with the clock signal CLK1 (that is, the external clock signal ext. CLK), generates the control signal CLKBE and prohibits generation of the clock signals CLK1 and CLK2.

More specifically, the clock buffer 610 receives in parallel the control signals CLKBE and /CKE from the CKE buffer 612 and activation/inactivation thereof is controlled. If one of the control signals CLKBE and /CKE is active, the clock buffer 610 generates the internal clock signal. Only when the special mode is designated, generation of the internal clock signal from the clock buffer 610 is stopped. Now, two clock signals, that is, the first internal clock signal CLK (CLK1) and the second clock signal CLK2 are generated from the clock buffer 612, in order to inhibit operation of the buffer circuit which is not necessary during self refresh and during standby operation. The first internal clock signal CLK1 is used for taking in control signals such as the external control signals ext. /RAS, ext. /CAS and ext. /WE. The second internal clock signal CLK2 is used for controlling data input/output. By applying the second clock signal CLK2 only to the data input/output control system, the previously described suspended input operation and suspended output operation can be realized.

The SDRAM further includes a first control signal generating circuit 616 activated in response to the internal control signal /CS from the CS buffer 614, taking in the external control signals ext. /RAS, ext. /CAS, ext. /WE and ext. DQM for generating internal control signals, a second control signal generating circuit 618 responsive to a control signal from the first control signal generating circuit 616 for driving a selected array, and a refresh circuit 620 responsive to a refresh designation from the first control signal generating circuit 616 for carrying out refreshing operation.

The first control signal generating circuit 616 takes in the external control signals ext. /RAS, ext. /CAS and ext. /WE in response to the first internal clock signal CLK1, and determines the operation mode designated by the combination of the signal states at that time. Based on the result of determination, the first control signal generating circuit 616 generates the write control signal φW, the read control signal φO, the row selecting control signal φR and the column selecting control signal φC, the row address buffer activating signal RADE and the column address buffer activating signal CADE. The first control signal generating circuit 616 also takes in the external control signal ext. DQM at a rising edge of the first internal clock signal CLK1 so as to set the input/output buffer to the enabled state.

The second control signal generator 618 receives the first internal clock signal CLK1 and the bank address signal BA, and in accordance with the control signals from the first control signal generating circuit 616, generates the sense amplifier activating signal φSA, the preamplifier activating signal φPA, the write register activating signal φWB, the input buffer activating signal φDB and the output buffer enable signal φOE. The generation of control signals φWB, φDB and φOE from the second control signal generating circuit 618 is determined by the first internal clock signal CLK1. More specifically, these control signals φWB, φDB and φOE are generated in accordance with a prescribed count number of the internal clock signal CLK1.

The refresh circuit 620 generates the refresh address SRA in accordance with the refresh designation from the first control signal generating circuit 616, and instead of the internal row address Xa applied from the address buffer, applies the refresh address SRA to the banks 600a and 600b (when the banks 600a and 600b are to be refreshed simultaneously). The refresh circuit 620 includes an address counter for generating the refresh address, and a multiplexer for switching between the refresh address and the normal internal row address. A timer defining the interval of refreshing is included in the first control signal generating circuit 616. Alternatively, the refresh address SRA from the refresh circuit 620 may be applied to the address buffer 624, which will be described later, and a multiplexer for switching between the refresh address SRA and the normal external address ext. A may be provided in the preceding stage of the address buffer 624. In that case, when the refresh designation is applied, the first control signal generating circuit 616 generates the row address buffer activating signal RADE and the row selecting control signal φR.

The SDRAM further includes an address buffer 624 which is activated in response to the row address buffer activating signal RADE and the column address buffer activating signal CADE from the first control signal generating circuit 616 and takes in the external address signal ext. A as the row address signal and the column address signal for generating the internal row address signal Xa, the internal column address signal Ya and the bank address signal BA, and a register control circuit 622 which operates in response to the second internal clock signal CLK2 and receives a prescribed number of bits of an internal column address signal Ym from the address buffer 624 for generating signals controlling the read registers and the write registers shown in FIG. 1, that is, the wrap address WY, the read register driving signal err and the write register driving signal φRW. By operating the register control circuit 622 in synchronization with the second internal clock signal CLK2, the above described suspended input and suspended output operations can be realized when the generation of the second internal clock signal CLK2 is stopped. The control signal err or φRw is not generated if the second internal clock signal CLK2 is not applied, and therefore shifting operation in the register is not carried out.

As shown in FIG. 56, the control signal ext. /CKE controlling activation/inactivation of the clock buffer is provided as the input to the first control signal generating circuit 616, and buffering operation of the clock buffer is controlled by this control signal. The internal clock signals CLK1 and CLK2 in synchronization with the external clock signal ext. CLK are generated from the clock buffer 610. The first control signal generating circuit 616 which takes in the external control signal ext. /RAS takes in the external control signal in synchronization with the first internal clock signal CLK1 (that is, in synchronization with the external clock signal ext. CLK). The CS buffer 614 takes in the external control signal ext. /CS at a rising edge of the first internal clock signal CLK1. The first control signal generating circuit 616 takes in the external control signal only when the internal control signal /CS is active. When the internal clock signal CLK1 is not generated, the external control signals are not taken in the first control signal generating circuit 616 and in the CS buffer 614. Consequently, it becomes unnecessary to constantly operate the buffer circuit for taking in the external control signals, which results in reduced power consumption. Even when the clock signal CLK is being generated, the external control signals ext. /RAS and so on are not taken in when the internal control signal /CS is inactive. Therefore, power consumption can be further reduced.

The address buffer 624 takes in the external address signal ext. A only when the internal control signals RADE and CADE are generated. Therefore, address buffer 624 takes in and latches the address only when address designation is done. Namely, it does not operate in every cycle of the external clock signal ext. CLK, which leads to reduced power consumption.

As for the clock buffer 610, it is activated only when necessary, in accordance with the control signals CLKBE and /CKE from the CKE buffer 612. Consequently, the clock buffer 610 can inhibit taking of the external clock signal ext.

CLK at a standby state, for example, in which the SDRAM is not accessed. Namely, the internal clock signals CLK1 and CLK2 are generated only when necessary, which makes it unnecessary to constantly take in the external clock signal ext. CLK, which also leads to reduced power consumption. Specific structures of the various circuits will be described.

Figure 57:
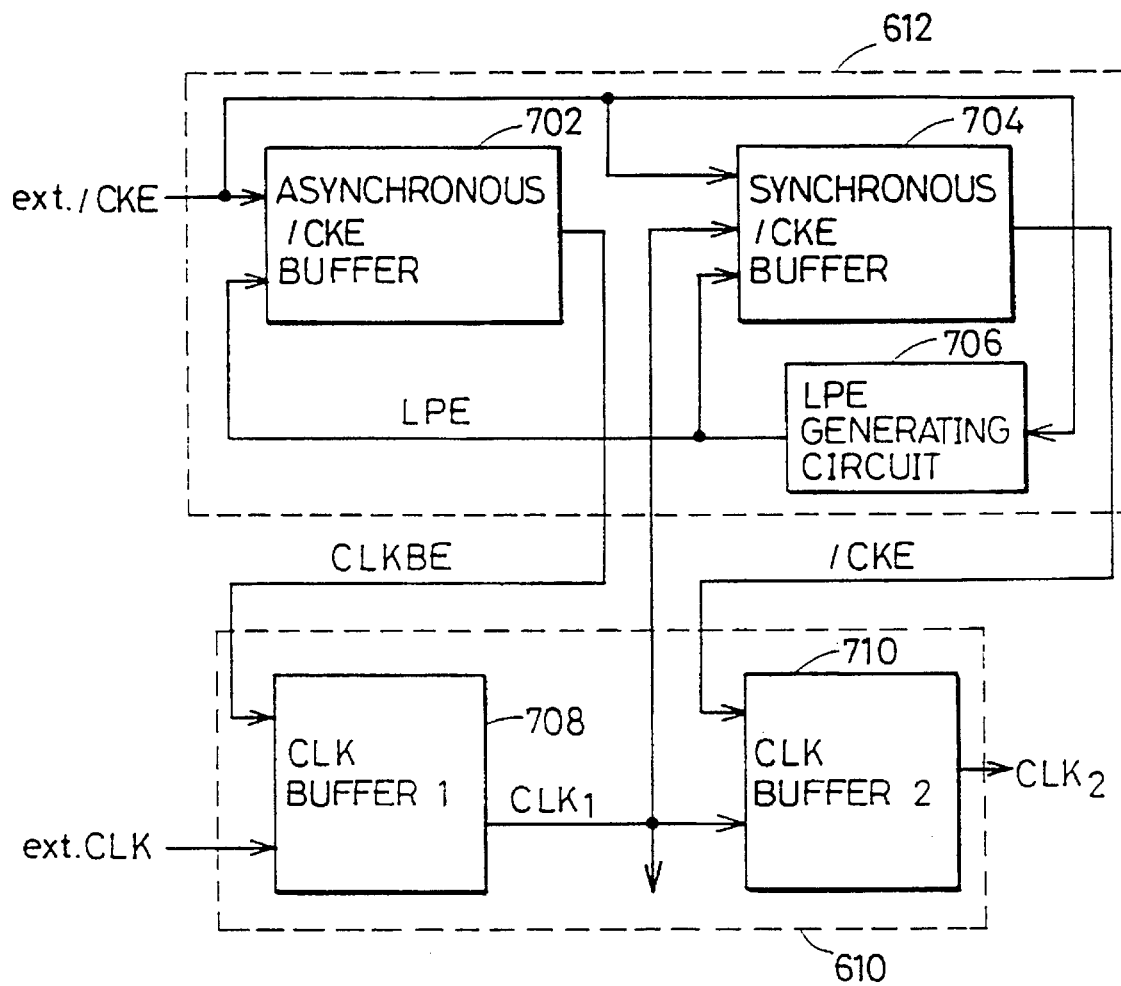
FIG. 57 shows a specific structure of the clock buffer and the CKE buffer shown in FIG. 56.

FIG. 57 is a block diagram showing specific structures of the CKE buffer and the clock buffer shown in FIG. 56. Referring to FIG. 57, the CKE buffer 612 includes an asynchronous /CKE buffer 702 which takes in the external control signal ext. /CKE in asynchronization with the external clock signal ext. CLK for generating a first clock buffer activating signal CLKBE, a synchronous /CKE buffer 704 which takes in the external control signal ext. /CKE in synchronization with the external clock signal ext. CLK (that is, the first internal clock signal CLK1) for generating the second clock buffer activating signal CKE, and an LPE generating circuit 706 which detects designation of a special mode when the external control signal ext. CKE is toggled for prescribed times for generating a special mode designating signal LPE.

The asynchronous /CKE buffer 702 activates the signal CLKBE when the signal LPE from the LPE generating circuit 706 is inactive, regardless of the state of the external control signal ext. /CKE. When the signal LPE is activated to indicate the special operation mode, the asynchronous /CKE buffer 702 generates the first clock buffer activating signal CLKBE in accordance with the external control signal ext. /CKE.

The synchronous /CKE buffer 704 takes in the external control signal ext. /CKE in synchronization with the first internal clock signal CLK1 and generates the second clock buffer activating signal /CKE. The first internal clock signal CLK1 is in synchronization with the external clock signal ext. CLK. Therefore, the synchronous /CKE buffer 704 takes in the internal control signal ext. /CKE in synchronization with the external clock signal ext. CLK and generates the internal control signal (the second clock buffer activating signal /CKE). When the signal LPE is activated and the special operation mode is designated, the operation of the synchronous /CKE buffer 704 is inhibited, and the second clock buffer activating signal /CKE is inactivated.

The LPE generating circuit 706 detects the special operation mode. Designation of the special operation mode is carried out by, for example, successive 8 togglings of the external control signal ext. /CKE. The designation of the special operation mode by 8 togglings of the external control signal ext. /CKE is only an example. A structure in which the special operation mode is designated by a combination of the state of the external control signal ext. /CKE and the states of other external control signals may be used.

The clock buffer 610 includes a first CLK buffer 708 which is activated in response to the first clock buffer activating signal CLKBE for taking in the external clock signal ext. CLK and generating the first internal clock signal CLK1, and a second CLK buffer 710 which is activated in response to the second clock buffer activating signal /CKE and takes in the first internal clock signal CLK1 for generating the second internal clock signal CLK2. The first CLK buffer 708 takes in the external clock signal ext. CLK only when the signal CLKBE is active and generates the first internal clock signal CLK1. The second clock buffer 710 takes in the first internal clock signal CLK1 only when the signal /CKE is active, and generates the second internal clock signal CLK2. Second clock buffer 710 may be adapted to receive the signal /CKE and the external clock signal ext.CLK, to take in the clock signal ext.CLK in response to the signal /CKE. The specific structure of the circuit shown in FIG. 57 will be described.

Figure 58:
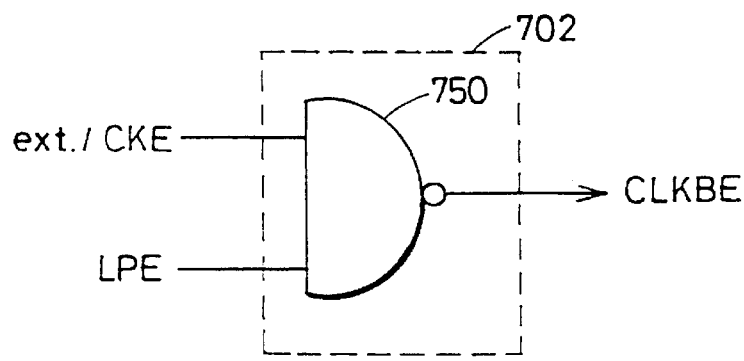
FIG. 58 shows an example of a structure of the asynchronous /CKE buffer shown in FIG. 57.

FIG. 58 shows a specific structure of the asynchronous /CKE buffer shown in FIG. 57. The asynchronous /CKE buffer 702 includes an NAND circuit 750 which receives the special operation mode designating signal LPE and the external control signal ext. /CKE. When the signal LPE is at "L", the signal CLKBE is at "H" regardless of the state of the external control signal ext. /CKE. When the signal LPE is at "H" designating the special operation mode, the NAND circuit 750 functions as an inverter circuit. Therefore, the first clock buffer 708 has the generation of the internal clock signal CLK1 controlled in accordance with the external control signal ext. /CKE when the special operation mode is designated. Generally, when the signal LPE is set to "H" indicating the special operation mode, it is generally a state in which the operation of the clock buffer is to be prohibited, and the external control signal ext. /CKE is set to "H".

Figure 59:
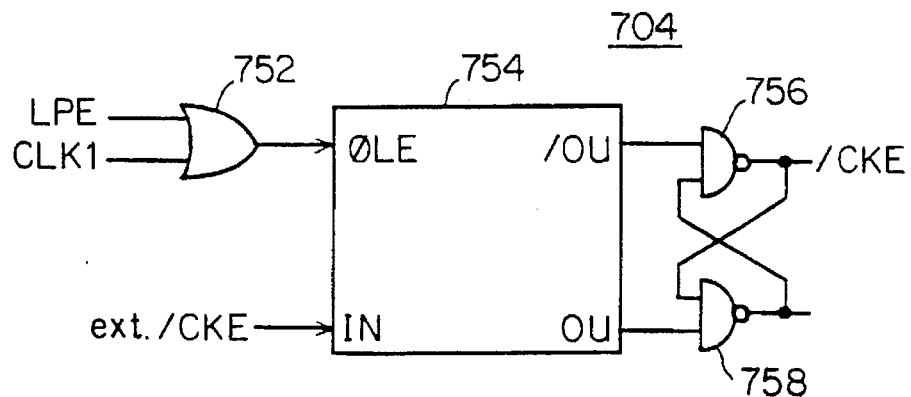
FIG. 59 shows an example of a specific structure of the synchronous /CKE buffer shown in FIG. 57.

FIG. 59 shows a specific structure of the synchronous /CKE buffer shown in FIG. 57. Referring to FIG. 59, the synchronous /CKE buffer 704 includes an OR circuit 752 receiving the special operation mode designating signal LPE and the first internal clock signal CLK1, a latch circuit 754 which takes in the external control signal ext. /CKE at a rising edge of the signal from the OR circuit 752, and NAND circuits 756 and 758 forming a flipflop for latching the output of the latch circuit 754. The dynamic type latch circuit such as shown in FIG. 35 is used as the latch circuit 754. In a dynamic latch, the output thereof is precharged to "H" at a falling edge of the signal applied to the clock input φLE. In order to prevent changes in the output signal in this precharge state, the NAND circuits 756 and 758 are provided.

When the signal LPE is at "L", the output of the OR circuit 752 changes in accordance with the internal clock signal CLK1. The latch circuit 754 takes in the external control signal ext. /CKE at a rising edge of the first clock signal CLK1 from the OR circuit 752. The internal signal /CKE changes in accordance with the state of the take inn external control signal ext. /CKE. By the NAND circuits 756 and 758, the signal /CKE is kept latched during the precharging period of the latch circuit 754.

When the signal LPE attains "H", the output of the OR circuit 752 attains "H". Therefore, the latch circuit 754 is set to a state latching the signal which has been applied at the rise of the output from the OR circuit 752. When the signal LPE is set to "H", the external control signal ext. /CKE is set to "H", and the internal control signal /CKE is also set to "H". Consequently, the operation of the second clock buffer 710 is prohibited.

Figure 60:
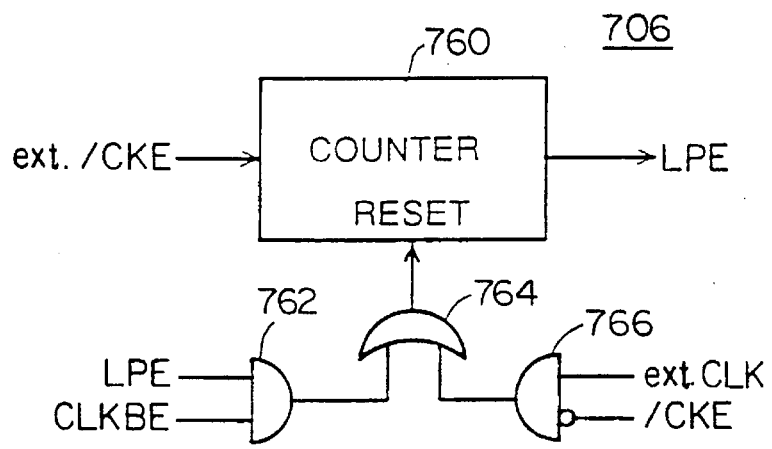
FIG. 60 shows an example of a specific structure of an LPE generating circuit shown in FIG. 57.

FIG. 60 shows a structure of the LPE generating circuit shown in FIG. 57. Referring to FIG. 60, the LPE generating circuit 706 includes a counter 760 which counts a prescribed number (for example 8) of the external control signal ext. /CKE and generates the special mode designating signal LPE when the counted value reaches the prescribed value. The signal LPE which is generated when the prescribed count value is reached is kept continuously output from the counter 760, until a reset signal is applied to the reset input of the counter.

The LPE generating circuit 706 further includes an AND circuit 762 receiving the special mode designating signal LPE and the first clock buffer activating signal CLKBE, a gate circuit 766 receiving the external clock signal ext. /CLK at its true input and the internal control signal/CKE at its false input, and an OR circuit 764 receiving the outputs from the AND circuit 762 and from the gate circuit 766. A reset signal is applied from the OR circuit 764 to the counter 760. When the output from the OR circuit 764 rises to "H", the count value of the counter 760 is reset to the initial value, and the signal LPE is set to "L". The AND circuit 762 is used for switching from the special operation mode to the normal mode in which the clock buffer is operated. The signal CLKBE which has been "L" in the special mode in which the signal LPE is at "H" is raised to "H". Consequently, the counter 760 is reset, the signal LPE falls to "L" and the special operation mode is completed.

The gate 766 is used for entering the special operation mode. When the special operation mode is started, the external control signal ext. /CKE is at "H" at the rising edge of the external clock signal ext. CLK. Therefore, when the special operation mode is set, the signal /CKE is kept at "H". Consequently, the output from the gate circuit 766 is "L", inhibiting resetting of the counter 760 when the special operation mode is to be set. In the normal operation mode, the signal /CKE is at "L". The output from the gate circuit 766 changes in accordance with the external clock signal ext. CLK. Therefore, the counter 760 is reset in accordance with the external clock signal ext. CLK.

Figure 61:
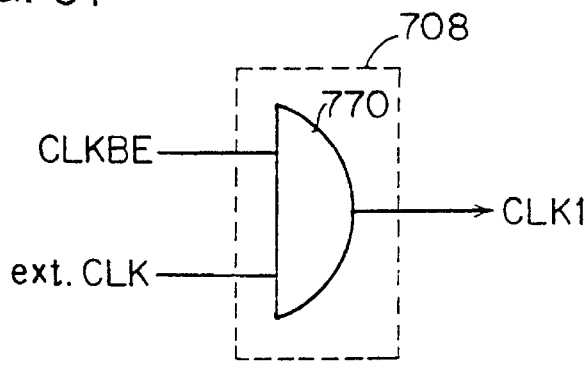
FIG. 61 shows an example of a specific structure of a first clock buffer shown in FIG. 57.

FIG. 61 shows a specific structure of the first clock buffer shown in FIG. 57. Referring to FIG. 61, the first clock buffer 708 includes an AND circuit 770 receiving the first clock buffer activating signal CLKBE and the external clock signal ext. CLK. The first internal clock signal CLK is generated when the first clock buffer activating signal CLKBE is at "H" in accordance with the external clock signal ext. CLK. When the first clock buffer activating signal CLKBE is at "L", generation of the first internal clock signal CLK1 is inhibited.

Figure 62A:
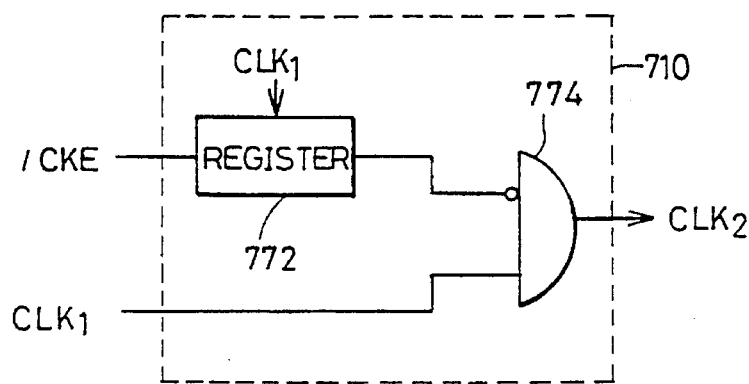
FIGS. 62A and 62B show an example of a specific structure of a second clock buffer shown in FIG. 57.

FIG. 62A shows a specific structure of the second clock buffer 710 shown in FIG. 57. Referring to FIG. 62A, the second clock buffer 710 includes a register 772 for providing a delay of 1 clock of the first internal clock signal CLK1 to the control signal /CKE, and a gate circuit 774 receiving the internal clock signal CLK1 at its true input and the output from the register 772 at its false input. The register 772 is formed by one stage of shift register, takes in the signal applied at a rising edge of the internal clock signal CLK1, and outputs this taken-in signal in accordance with the rising edge of the clock of the next cycle. By the provision of the register 772, the suspended input and suspended output operations are realized. Since the second internal clock signal CLK2 is not applied to the register control circuit controlling the operations of the write registers and of the read registers, shifting operation of the registers is stopped.

Figure 62B:
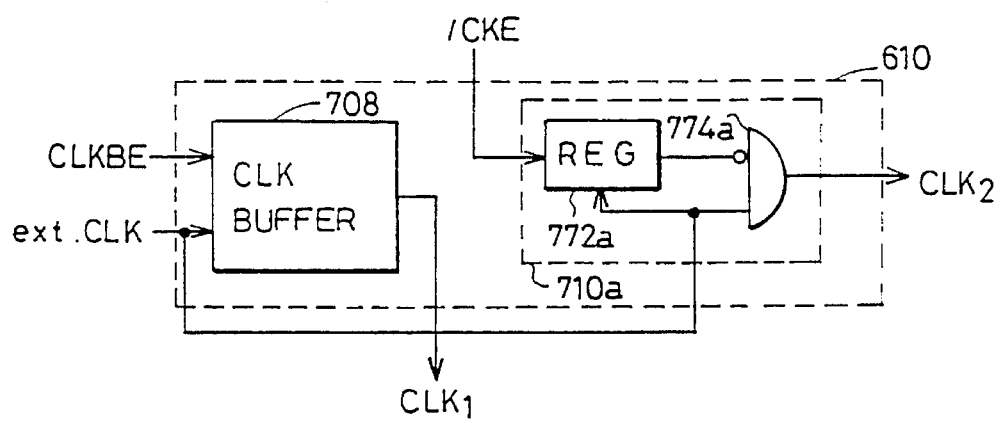

FIG. 62B shows another structure of the clock buffer 610. In the shown clock buffer 610, a second clock buffer 710a receives the external clock signal ext.CLK in place of the first internal clock signal CLK1. A register 772a latches and shifts the signal /CKE in synchronization with the external clock signal ext. CLK with a delay of one cycle of ext. CLK. A gate 774a receives an output of the register 772a at a false input, and the external clock signal ext. CLK at a true input. Gate 774a passes the external clock signal ext. CLK to generate the second clock signal CLK2 only when the output of the register 772a is inactive at "L". The second clock buffer 710 and 710a operates in the same fashion.

Figure 63:
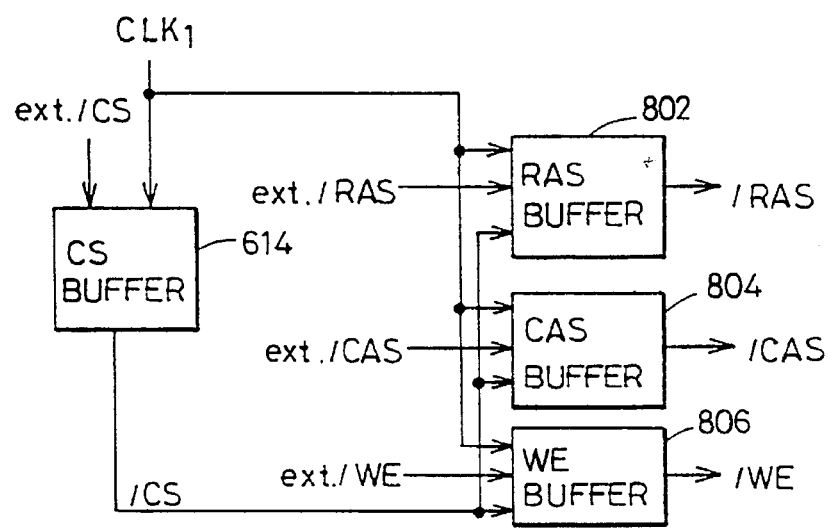
FIG. 63 shows a structure of a buffer circuit which takes in external control signals and generates internal control signals in the synchronous semiconductor memory device in accordance with the second embodiment of the present invention.

FIG. 63 shows a structure of a control signal buffer circuit for taking in external control signals and generating internal control signals. Referring to FIG. 63, an RAS buffer 802 is activated in response to the internal control signal /CS from the CS buffer 614, takes in the external control signal ext. /RAS at a rising edge of the first internal clock signal CLK1 and generates an internal control signal /RAS.

A CAS buffer 804 is activated in response to the signal /CS, takes in the external control signal ext. /CAS at a rising edge of the first internal clock signal CLK1 and generates the internal control signal /CAS. A WE buffer 806 is activated in response to the signal /CS, takes in the external control signal ext. /WE at a rising edge of the internal clock signal CLK1 and generates the internal control signal /WE. The RAS buffer 802, the CAS buffer 804 and the WE buffer 806 are included in the first control signal generating circuit 616 shown in FIG. 56. The operation mode is designated based on the combination of the states of the internal control signals /RAS, /CS and /WE.

Figure 64:
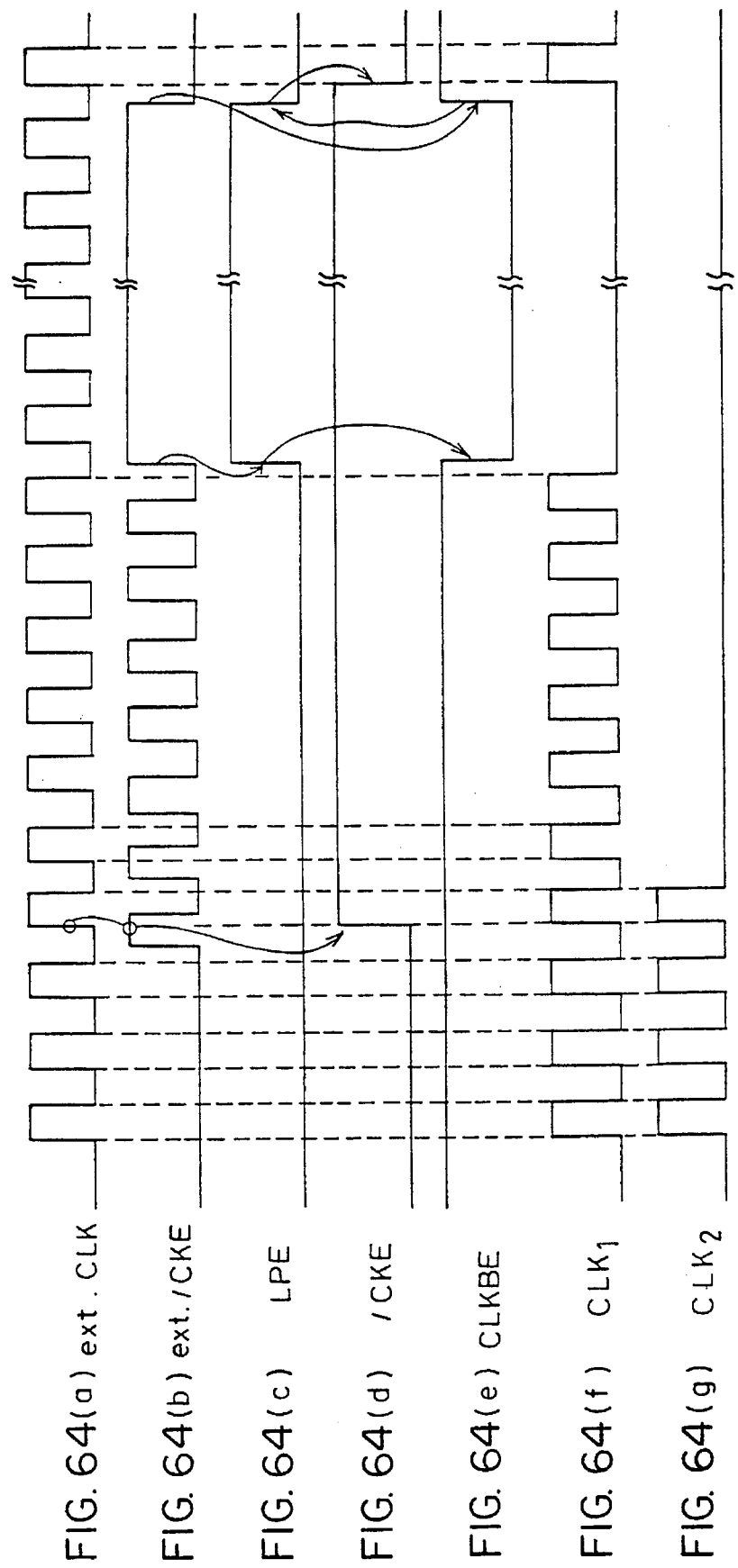
FIGS. 64(a)–(g) are a diagram of signal waveforms showing operations of the clock buffer and the CKE buffer shown in FIG. 57.

FIG. 64 is a diagram of signal waveforms showing the operation of the clock control system shogun in FIGS. 57–62. The operation of generating internal clocks will be described with reference to FIGS. 57–64.

In normal operation, when the external control signal ext. /CKE and the signal LPE are at "L", the first clock buffer activating signal CLKBE generated from the asynchronous /CKE buffer 702 is at "H", and the first clock buffer 708 takes in the external clock signal ext. CLK to generate the first internal clock signal CLK1. In the synchronous /CKE buffer 704, the external control signal ext. CKE is taken in synchronization with the first internal clock signal CLK1, that is, the external clock signal ext. CLK, and the internal control signal /CKE is generated. The control signal /CKE is at "L", and the second clock buffer 710 generates the second internal clock signal CLK2 in accordance with the first internal clock signal CLK1. Therefore, in this state, internal clock signals CLK1 and CLK2 which are in synchronization with the external clock signal ext. CLK are generated. In accordance with the first internal clock signal CLK1, the external control signals ext. /RAS, ext. /CAS and ext. /WE are taken in the buffers 802, 804 and 806, and internal control signals /RAS, /CS and/WE are generated (when the signal /CS is at active The external control signal ext. /CKE is set to "H". In response, the synchronous /CKE buffer 704 takes in the external control signal ext. /CKE at the rising edge of the first internal clock signal CLK1 and generates a signal /CKE which is at "H" When this signal /CKE attains to "H", the gate circuit 774 shown in FIG. 62 is inactivated in the next clock cycle of the internal clock signal CLK1, and generation of the internal clock signal CLK2 is stopped.

The external control signal ext. /CKE is successively toggled for a prescribed number of times (8 times in FIG. 64). In this toggling period, the signal /CKE is kept at "H" continuously, as the synchronous /CKE buffer 704 takes in that signal which is applied at the rising edge of the clock signal CLK1. Consequently, the gate circuit 766 show in FIG. 60 is inactivated, and resetting of the counter 760 is inhibited. At the eighth rising edge of the external control signal ext. /CKE, the signal LPE rises to "H" Consequently, a signal at "H" is continuously applied to the clock input of the synchronous /CKE buffer 704, and therefore it is kept at a latched state. The external control signal ext. /CKE rises to "H" prior to the internal control signal LPE. Therefore, the signal /CKE which is at "H" is continuously generated from the synchronous /CKE buffer 704.

As for the asynchronous /CKE buffer 702, as the signal LPE attains "H" and the external control signal ext. /CKE attains "H", the signal CLKBE is made to fall from "H" to "L". Consequently, operation of the first clock buffer 708 is inhibited, and generation of the internal clock signal CLK1 is stopped. In the second clock buffer 710, generation of the second internal clock signal CLK2 is stopped when the signal /CKE attains "H". Therefore, continuously from the special mode setting period, the generation of the second internal clock signal CLK2 is stopped. Now, it is impossible to generate the second internal clock signal CLK2 while the special operation mode is set. This is implemented by a structure in which the signal LPE is applied to the register 772, and the control signal /CKE is transmitted through the register 772 when the signal LPE is at "L" but the transmission is inhibited and the output of the gate circuit 774 is forcedly fixed at "L" when the signal LPE attains "H".

While the special operation mode is designated, that is, while the signal LPE is at "H", the signal CLKBE is at "L", the operation of the first clock buffer 708 is kept inhibited, and the first internal clock signal CLK1 is not generated. Therefore, the second internal clock signal CLK2 is not generated, either. As the clock signal CLK1 is not generated, the operations of the CS buffer 614, RS buffer 802, CAS buffer 804 and WE buffer 806 shown in FIG. 63 are inhibited. Consequently, less current and less power are consumed by the buffer circuits in this period.

To return from the special operation mode to the normal operation mode in which the clock signals are generated internally, the external control signal ext. /CKE is set from "H" to "L". In response, the clock buffer activating signal CLKBE generated from the asynchronous /CKE buffer 702 attains "H". Now, since the signal LPE is at "H", the output of the AND circuit 762 shown in FIG. 60 rises to "H", the counter 760 is reset and the signal LPE falls to "L". As the signal LPE falls to "L", the output of the OR circuit 752 shown in FIG. 59 changes in accordance with the first internal clock signal CLK1. The first clock buffer 708 takes in the external clock signal ext. CLK in response to the activation of the signal CLKBE and generates the internal clock signal CLK1. Therefore, as the signal LPE falls to "L", the synchronous /CKE buffer 704 takes in the external control signal ext. /CKE at the rising edge of the clock signal CLK1, causing the fall of the internal control signal /CKE to "0". Thereafter, the synchronous /CKE buffer 704 takes in the external control signal ext. /CKE at the rising edge of the clock signal CLK1 and generates the internal control signal /CKE.

By the above described operation, the operation of the circuit taking in the external control signal in response to the external clock signal can be stopped in the special operation mode, resulting in reduced power consumption. This special operation mode is effective when set in the standby state or in the self refresh state. In a standard DRAM of low power consumption, the current during operation is about 100 mA, while the standby current is not higher than 50 μA, and the current in self refreshing is several 100 μA. The current consumption in the first clock buffer 708 is about 3 mA. Only by this first clock buffer 708, the standby current is about 100 times that of a standard DRAM of low power consumption. Therefore, if the special operation mode is utilized, an SDRAM having low current consumption characteristic which is substantially the same as that of the normal standard DRAM of low power consumption can be realized.

[Improvement of address hold time]

By the above described structure, an input/output circuit structure suitable for reducing power consumption is provided. In the foregoing, circuit portion for taking in external control signals have been described. The most necessary circuit portion in number is the address buffers for taking in address signals. The structure of the address buffer will be described.

Figure 65:
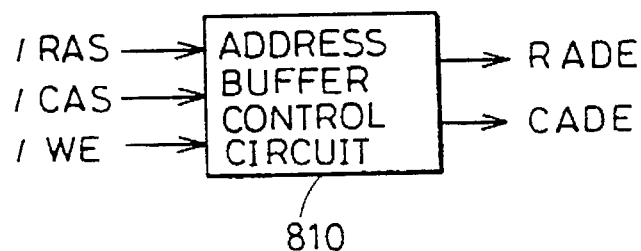
FIG. 65 shows a structure of an address buffer control circuit.

FIG. 65 shows a circuit portion for generating the control signals RADE and CADE controlling the address buffer. The address buffer control circuit 810 is included in the first control signal generating circuit 616 shown in FIG. 56. The address buffer control circuit 810 generates the row address buffer activating signal RADE and the column address buffer activating signal CADE in accordance with the combination of states of the internal control signals /RAS, /CAS and /WE.

Figure 66:
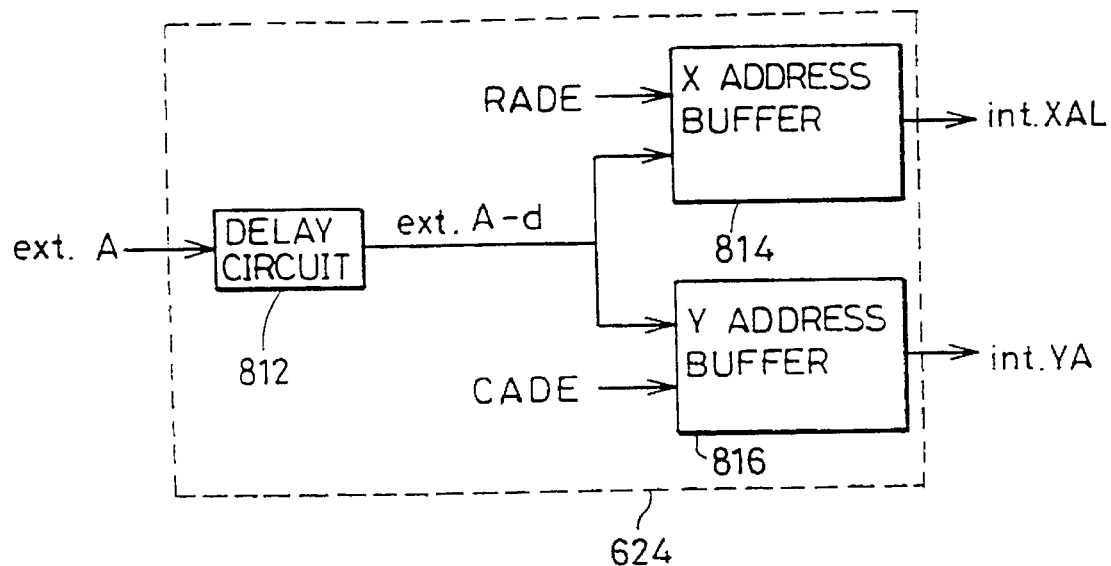
FIG. 66 shows an example of a specific structure of an address buffer in the synchronous semiconductor memory device in accordance with the second embodiment of the present invention.

FIG. 66 shows a structure of the address buffer shown in FIG. 56. Referring to FIG. 66, the address buffer 624 includes a delay circuit 812 providing a delay of a prescribed time period to the external address signal ext. A, an X address buffer 814 responsive to the activating signal RADE for taking in the external address signal ext. A from the delay circuit 812 and for latching the same to generate an internal row address int. XA, and a Y address buffer 816 activated in response to the column address buffer activating signal CADE for taking in and latching the external address signal ext. A - d from the delay circuit 812 for generating the internal column address signal int. YA. The delay circuit 812 may be formed by cascade connected inverter circuits or an RC delay circuit formed of a polysilicon resistance and a capacitor. The reason why the delay circuit 812 is provided will be described.

The timing for activating the X address buffer 814 is determined by the signal RADE, while the timing for activating the Y address buffer 816 is determined by the signal CADE. The signals RADE and CADE are generated from the address buffer control circuit 810. The address buffer control circuit 810 determines the states of the control signals /RAS, CAS and /WE, and when the states of these signals designates address latch, it generates the signals RADE and CADE. Therefore, the timing for activating the Y address buffer 814 and the Y address buffer 816 is after the establishment of the output signal from the address buffer control circuit 810. Until this time, the external address signal ext. A must be maintained. This state will be described with reference to FIG. 67.

FIG. 67 also shows the timing for taking in the row address signal and the column address signal when the delay circuit is not provided. In one clock cycle, only one of the row address signal and the column address signal is taken in. The address holding operation will be described with reference to FIGS. 65 to 67.

At time t0, the external clock signal ext. CLK rises to "H". The CS buffer operates and takes in the external control signal ext. /CS at time t0. The external control signal ext. /CS rises to "H" at time t1. The internal control signal /CS generated from the CS buffer falls to "L" at time t1. In response to the fall of the signal /CS, the RAS buffer 802, the CAS buffer 804 and the WE buffer 806 are activated, the internal control signal /RAS or /CAS falls to "L" and the signal /WE falls to "L". At time t2, the signals /RAS, /CAS and /WE are latched internally. Thereafter, the external control signals ext. /RAS, ext. /CS and ext. /WE may change. More specifically, the hold time required for the control signals ext. /RAS, ext. /CAS and ext. /WE is t2–t0.

Then, the address buffer control circuit 810 determines the states of the internal control signals ext. /RAS, /CAS and /WE. When an address designation is done, the address buffer activating signal RADE (or CADE) rises to "H" at time t3. In response to the address buffer activating signal RADE (or CADE), the external address signal ext. A is taken in. The address signal is latched inside, and therefore the external address signal ext. A may change. Therefore, the hold time required for the address signal is t3–t0.

The address hold time required for the address signal becomes longer than the hold time required for the control signals by the time t3–t2 of determination in this address buffer control circuit 810. One of the features of the SDRAM is that the external signals are all shape of pulse signals. At this time, if the hold time which is one of the characteristics required for each signal is different from a signal to a signal, the timing design becomes complicated, and the usability of the SDRAM is lost. For this reason, the delay circuit 812 provided as shown in FIG. 66.

FIG. 68 is a diagram of signal waveforms showing the operation when the row address is designated, with the delay circuit provided in the address buffer. The row address taking operation will be described with reference to FIG. 68.

At time t0, the external clock signal ext. CLK rises to "H", and the CS buffer takes in the external control signal ext. /CS. The internal control signal /CS generated from the CS buffer falls at time t1. In response to the fall of the internal control signal /CS at time t1, the RAS buffer, the CAS buffer and the WE buffer are activated and they take in the external control signals ext./RAM, ex=./CAS and ext./We. When taking of the row address is designated, the signal ext./RAS is at "L" and the signals ext./CAS and ext./WE are at "H". At time t2, the internal control signal /RAM falls to "L". The hold time required for the control signals is t2–t0 which is the same as that shown in FIG. 67.

Then, the states of the internal control signals /RAS, /CAS and /WE are determined, and it is determined that the row address strobe is designated, so that the signal RASE rises at time t3.

The external address signal ext. A is delayed by a prescribed time by the delay circuit 812. If the delay time of the delay circuit 812 is t3–t2, the external address ext, A reaches the x address buffer 814 delayed by the time of determination in the address buffer control circuit 810. When the signal RADE rises to "H" at time t3, the X address buffer 814 is activated, and strobes in and latches the delayed external address signal ext. A-d. Therefore, the external address signal ext. A have only to be kept at the established state before the time t2. Namely, the address hold time is t2–t0, which is the same as the hold tame required for the control signals. Thus the hold time necessary for the control signals becomes the same as the hold time necessary for the address signals and the address hold time can be shortened. This results in higher speed of operation and improved usability of the SDRAM.

When the external address signal ext. A is delayed to be applied to the address buffer, the address set up time becomes a positive value (it precedes in time the falling edge of the external clock signal ext. CLK). In the structure shown in FIG. 67, the address set up time of the external address signal ext. A is a negative time, and therefore the restriction thereon is mitigated than the set up time necessary for the control signals (since the time for determination in the address buffer control circuit 810 has been accounted for). Even if the restriction of the set up time of the external address signal ext. A becomes a little hard, there is no problem, since it is the same as the set up time necessary for the control signals.

FIG. 69 is a diagram of signal waveforms showing an operation when the column address is taken in. For designating the taking of the column address, the signal ext./RAS is set to "H" and the signal ext./CAS is set to "L". The signal ext. /WE is set to "H" or "L", in accordance with data reading or data writing. The timings for generating the control signals are the same as those shown in FIG. 68, and a signal CADE for activating the column address buffer is generated at time t3. Consequently, the Y address buffer 816 is activated, and it takes in the delayed address signal ext. A-d from the delay circuit 812. Therefore, the hold time of the column address also becomes t2–t0 which is the same as that for the control signals. Namely, the conditions for the column address signal is the same as those for the row address signal described above.

The delay circuit 812 has a function of displacing in parallel the address set up/hold time, which has been behind in time the set up/hold time of the control signals, to be earlier in time. The set up/hold time necessary for the address signals can be made substantially equal to the set up/hold time necessary for the control signals. Thus the advantages of the structure in which control signals are in the form of pulses can be fully exhibited, and an SDRAM of low power consumption operating at high speed can be implemented.

The address buffer control circuit 810 can be formed by a 3-input gate circuit provided for each of the signals RADE and CADE. In this case, the time necessary for determination is equivalent to the delay time in the 3-input gate circuit.

The main characteristic features of the SDRAM in accordance with the present invention are, in summary, as follows.

(1) Since the memory array is divided into a plurality of banks operating independent from each other and registers for storing read data and registers for storing write data are provided corresponding to each bank, internal data confliction does not occur when the banks are switched and when the data writing/data reading operation is switched, and a synchronous semiconductor memory device in which data writing and reading can be surely done at high speed can be provided.

(2) Since the number of banks can be changed in accordance with the number of data input/output terminals, a plurality of different types of synchronous semiconductor memory devices can be provided by the same chip layout. Since the number of banks is changed in accordance with the number of input/output terminals, the memory arrays are not activated when unnecessary, which results in reduced power consumption.

(3) Since the number of banks is set in accordance with the wrap length indicating the number of data which can be successively accessed, the most suitable bank structure can be easily set in accordance with the application purpose.

(4) In successive data writing, a desired bit data can be masked, which realizes flexible data processing.

(5) Data writing to the memory cells is done at the time when the data train shorter than the wrap length is written in successive data writing. Therefore, there is no unnecessarily wasted time of data writing, allowing data writing at high speed.

(6) When the data writing cycle is successively repeated, the timing for activating the memory array is delayed, and therefore the timing merging for data writing can be made sufficiently large, without an adverse effect on successive writing of data at high speed.

(7) When the timing of data writing is delayed, the write data are stored in the data registers during precharging of the corresponding memory array, and therefore data writing operation, activation of the memory array and the data writing operation can be done in the pipeline manner, and thus a synchronous semiconductor memory device operating at high speed can be provided.

(8) The row address latch generating an internal row address signal is driven by a second internal RAS signal which is generated earlier than the internal RAS signal generated from the RAS buffer, and therefore the valid address signal can be latched accurately, and in addition, since the clock signal is invalidated except the time of address latching, current consumption in the synchronous semiconductor memory device can be considerably reduced.

(9) If bit line pairs corresponding to respective data input/output terminals are selected by one column selecting line, the change of the wrap length can be easily coped with.

(10) If one column selecting line corresponds to one data input/output terminal, the operation of masking a specific data input/output terminal such as the write per bit operation can be easily realized.

(11) Since internal data is transmitted through one signal line, the number of signal lines of the internal data transmitting lines such as IO lines can be reduced, the area for interconnections can be reduced, and the chip area can be reduced.

(12) Generation of the internal clock is stopped only when the special operation mode is designated, and power consumption of the buffer circuit operating in response to the internal clock and the power consumption of the buffer generating internal clock signal can be reduced, thus providing a synchronous semiconductor memory device of low power consumption.

(13) A clock buffer is formed by a first clock buffer generating a first internal clock signal in synchronization with the external clock signal and a second clock buffer generating a second internal clock in response to the first internal clock signal. The operation of the first clock buffer is controlled by the output of a buffer taking in the clock buffer activating signal in asynchronization with the external clock signal, the operation of the second clock buffer is controlled by the output of a buffer taking in the clock buffer activating signal in synchronization with the first clock signal, and in the special operation mode, the asynchronous buffer is set to the operating state while the synchronous buffer is set to the inactive state. Therefore, in the special mode, generation of the first and second internal clock signals can be easily stopped, returning from the special operation mode to the normal operation mode can be easily done, power consumption in the circuits operating in response to the clock signals can be easily reduced, and thus a synchronous semiconductor memory device of low power consumption can be provided.

(14) The second internal clock signal is used for controlling portions related to data input/output. Therefore, the operation of writing or reading the same data continuously for a prescribed time period can be easily realized, and a synchronous semiconductor memory device which easily absorbs the difference of the speed of operation in the processing devices of the system can be provided.

(15) The operation of the second clock buffer is controlled by delaying the clock buffer activating signal by 1 clock cycle. Consequently, generation of the second internal clock can be stopped while the first internal clock is being generated. Thus multifunctional synchronous semiconductor memory device in which input/output data are maintained for a prescribed time period can be provided.

(16) Since the external address signal is applied to the address buffer with a delay of a prescribed time period, the address hold time becomes shorter, the hold times necessary for the control signals and necessary for the external address signals are made all the same, and therefore the synchronous semiconductor memory device operating at high speed can be provided. Since the hold time necessary for the control signals is made equal to the hold time necessary for the address signals, a synchronous semiconductor memory device can be provided with which design of system timing is easy.

Although the present invention has been described and illustrated in detail, it is clearly understood that the same is by way of illustration and example only and is not to be take inn by way of limitation, the spirit and scope of the present invention being limited only by the terms of the appended claims.

What is claimed is:

1. A synchronous semiconductor memory device, comprising:

a plurality of data input/output terminals for inputting or outputting data in parallel with each other;

a memory cell array having a plurality of memory cells arranged in a matrix of rows and columns;

a plurality of word lines each connecting one row of memory cells of said memory cell array;

a plurality of pairs of bit lines each connecting one column of memory cells of said memory cell array;

a data bus arranged over said memory cell array in parallel to said bit line pair;

column decode means for decoding a column selecting signal to select a column of said memory cell array;

column selecting lines arranged in parallel to said bit line pairs, for receiving and transmitting the column selecting signal from said column decode means; and column selecting switch means provided for each of said bit line pair, responsive to a signal on said column selecting line for connecting the corresponding bit line pair to said data bus;

one column selecting line being coupled to said column selecting switch means such that the same number of bit line pairs as said data input/output terminals are simultaneously selected and the simultaneously selected bit line pairs are connected to said data bus through said column selecting switch means so as to correspond to different data input/output terminals from each other.

2. The synchronous semiconductor memory device according to claim 1, wherein each said word line has a word line shunt region where a word line is connected to a low resistance conductive line, and said data bus is placed in said word line shunt region.

3. A synchronous semiconductor memory device, comprising:

a plurality of data input/output terminals for inputting or outputting data in parallel with each other;

a memory cell array having a plurality of memory cells arranged in a matrix of rows and columns;

a plurality of word lines each connecting one row of memory cells of said memory cell array;

a plurality of pairs of bit lines each connecting a column of memory cells of said memory cell array;

a data bus for communicating data with said data input/output terminals;

column decode means for decoding a column address signal for generating a column selecting signal to select a column of said memory cell array;

column selecting lines for transmitting the column selecting signal from said column decode means;

column selecting switch means provided for each of said bit line paris for connecting a corresponding bit line pair to said data bus in response to signals on said column selecting lines, said column decode means simultaneously selecting a plurality of column selecting lines, and the selected column lines corresponding to different data input/output terminal from each other; and means for maintaining a column selecting line corresponding to a data input/output terminal specified by a mask data at an inactive state said mask data designating data at the specified data input/output terminal to be masked upon writing of data and to be inhibited from being written into any memory cell of said memory cell array.

4. A semiconductor memory device, comprising:

a memory cell array including a plurality of memory cells arranged in rows and columns;

a plurality of word lines each connecting one row of memory cells of said memory cell array;

a plurality of pairs of bit lines each connecting one column of memory cells of said memory cell array;

a plurality of sense amplifiers provided for each pair of bit lines, for differentially amplifying signal potential on associated pairs of bit lines;

column decode means for generating a column selecting signal for selecting a column of said memory cell array in accordance with an address signal;

one data line for transmitting write data or read data to or from a selected memory cell of said memory cell array; and column selecting means provided for each bit line pair; responsive to said column selecting signal for connecting only one bit line of the corresponding bit line pair to said one data line, while isolating the other bit line of the corresponding bit line pair from any data line.

5. The semiconductor memory device according to claim 4, further comprising an amplifier having a first node and a second node for differentially amplifying signal potential on said first and second nodes, a precharge means responsive to a precharge signal for precharging said first and second nodes to a predetermined potential, and a switching element for connecting said one data line to said first node after activation of said sense amplifiers.

* * * * *

UNITED STATES PATENT AND TRADEMARK OFFICE
CERTIFICATE OF CORRECTION

PATENT NO. : 5,594,704
DATED : January 14, 1997
INVENTOR(S) : Yasuhiro KONISHI et al.

It is certified that error appears in the above-indentified patent and that said Letters Patent is hereby corrected as shown below:

Title page, item [62]: Related U.S. Application Data, please change Apr. 4, 1993 to read --April 14, 1993--.

Signed and Sealed this

Tenth Day of June, 1997

Attest:

BRUCE LEHMAN

Attesting Officer

Commissioner of Patents and Trademarks